(12) United States Patent
Furuta et al.

(10) Patent No.: US 7,973,376 B2
(45) Date of Patent: Jul. 5, 2011

(54) SEMICONDUCTOR DEVICE AND METHOD OF MANUFACTURING THE SAME

(75) Inventors: Haruo Furuta, Tokyo (JP); Ryoji Matsuda, Tokyo (JP); Shuichi Ueno, Tokyo (JP); Takeharu Kuroiwa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/549,695

(22) Filed: Aug. 28, 2009

(65) Prior Publication Data

US 2009/0315128 A1 Dec. 24, 2009

Related U.S. Application Data

(62) Division of application No. 11/593,548, filed on Nov. 7, 2006, now Pat. No. 7,605,420.

(30) Foreign Application Priority Data

Nov. 14, 2005 (JP) ................................. 2005-328845
Oct. 10, 2006 (JP) ................................. 2006-276259

(51) Int. Cl.
*H01L 43/00* (2006.01)
(52) U.S. Cl. .................... 257/421; 257/422; 257/295
(58) Field of Classification Search .................. 257/295, 257/421, 422
See application file for complete search history.

(56) References Cited

U.S. PATENT DOCUMENTS

| | | | |
|---|---|---|---|
| 6,556,473 B2 | 4/2003 | Saito et al. | |
| 6,731,535 B1 | 5/2004 | Ooishi et al. | |
| 6,900,490 B2 | 5/2005 | Asao et al. | |
| 6,998,665 B2 | 2/2006 | Motoyoshi | |
| 7,001,779 B2* | 2/2006 | Drewes | 438/3 |
| 7,122,386 B1* | 10/2006 | Torng et al. | 438/3 |
| 7,405,085 B2* | 7/2008 | Kools et al. | 438/3 |
| 2004/0150016 A1* | 8/2004 | Ooishi | 257/295 |
| 2004/0188732 A1 | 9/2004 | Fukuzumi | |
| 2004/0246777 A1 | 12/2004 | Maejima et al. | |
| 2006/0054947 A1 | 3/2006 | Asao et al. | |
| 2006/0261425 A1 | 11/2006 | Suemitsu et al. | |

FOREIGN PATENT DOCUMENTS

| | | |
|---|---|---|
| JP | 2002-110938 | 4/2002 |
| JP | 2003-086773 | 3/2003 |
| JP | 2003-174215 | 6/2003 |
| JP | 2003-218431 | 7/2003 |
| JP | 2003-243630 | 8/2003 |

(Continued)

*Primary Examiner* — Wai-Sing Louie
*Assistant Examiner* — Bilkis Jahan
(74) *Attorney, Agent, or Firm* — Antonelli, Terry, Stout & Kraus, LLP.

(57) ABSTRACT

The semiconductor device which has a memory cell including the TMR film with which memory accuracy does not deteriorate, and its manufacturing method are obtained. A TMR element (a TMR film, a TMR upper electrode) is selectively formed in the region which corresponds in plan view on a TMR lower electrode in a part of formation area of a digit line. A TMR upper electrode is formed by 30-100 nm thickness of Ta, and functions also as a hard mask at the time of a manufacturing process. The interlayer insulation film formed from LT-SiN on the whole surface of a TMR element and the upper surface of a TMR lower electrode is formed, and the interlayer insulation film which covers the whole surface comprising the side surface of a TMR lower electrode, and includes LT-SiN is formed. The interlayer insulation film which covers the whole surface and includes $SiO_2$ is formed.

9 Claims, 47 Drawing Sheets

FOREIGN PATENT DOCUMENTS

| | | |
|---|---|---|
| JP | 2004-055918 | 2/2004 |
| JP | 2004-193282 | 7/2004 |
| JP | 2004-296859 | 10/2004 |
| JP | 2004-296869 | 10/2004 |
| JP | 2004-349671 | 12/2004 |

* cited by examiner

FIG. 3(a)  FIG. 3(b)  FIG. 3(c)
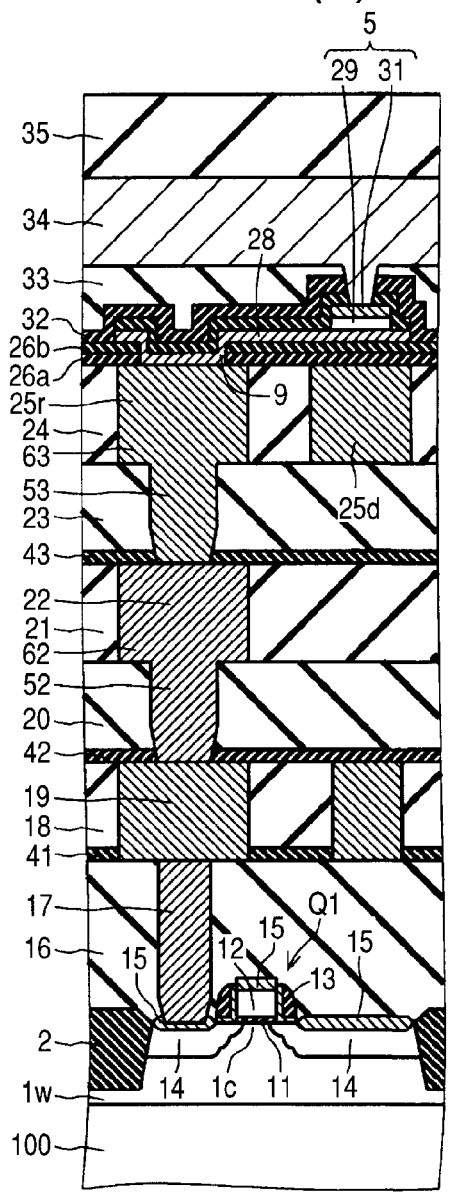
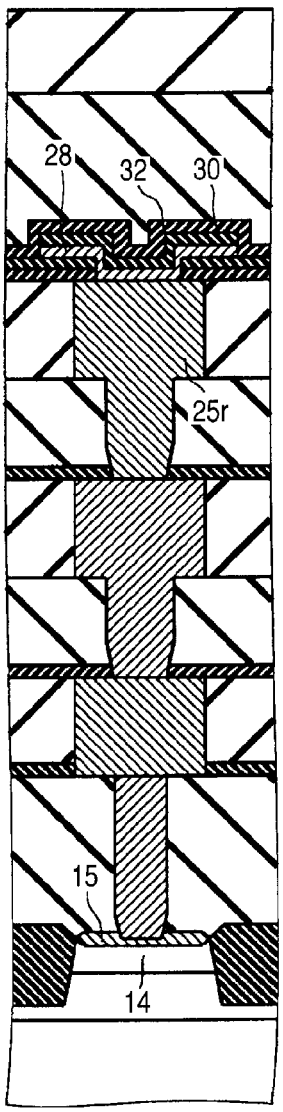
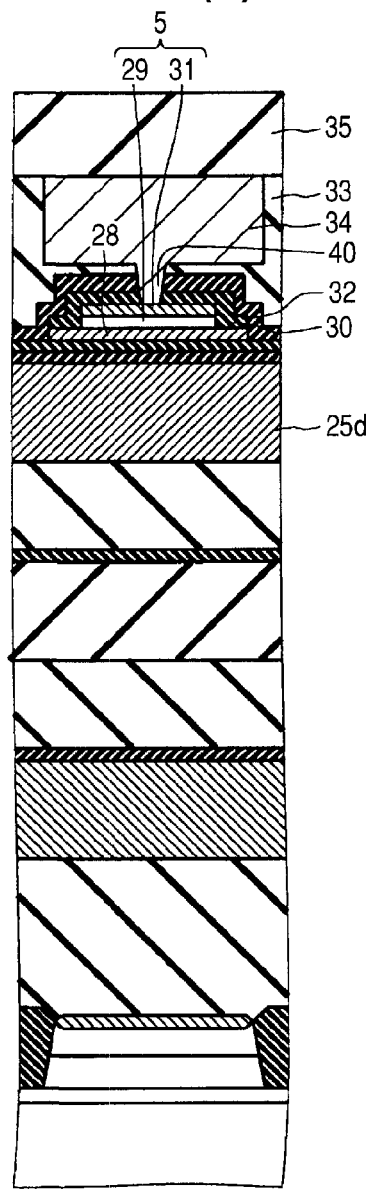
FIG. 4(a)  FIG. 4(b)  FIG. 4(c)
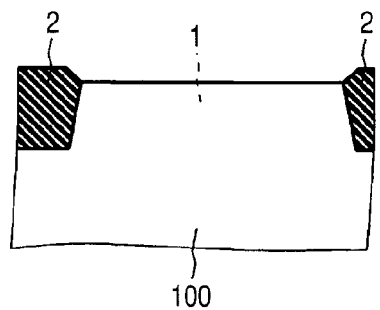
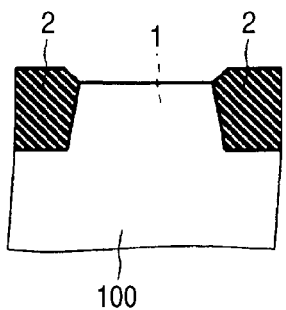
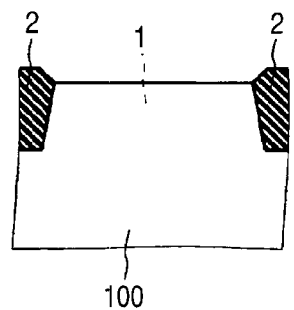

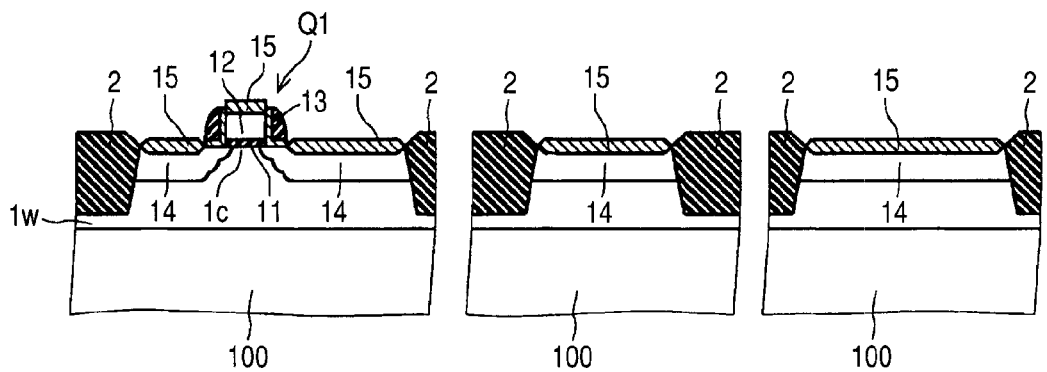
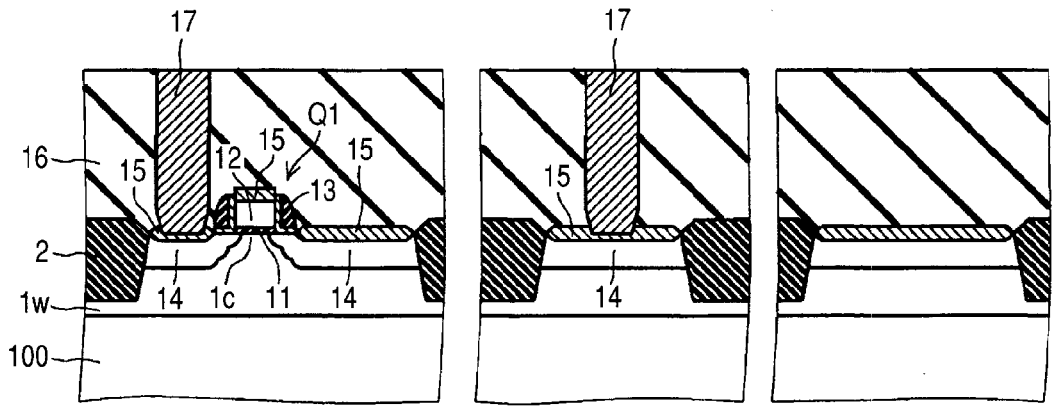
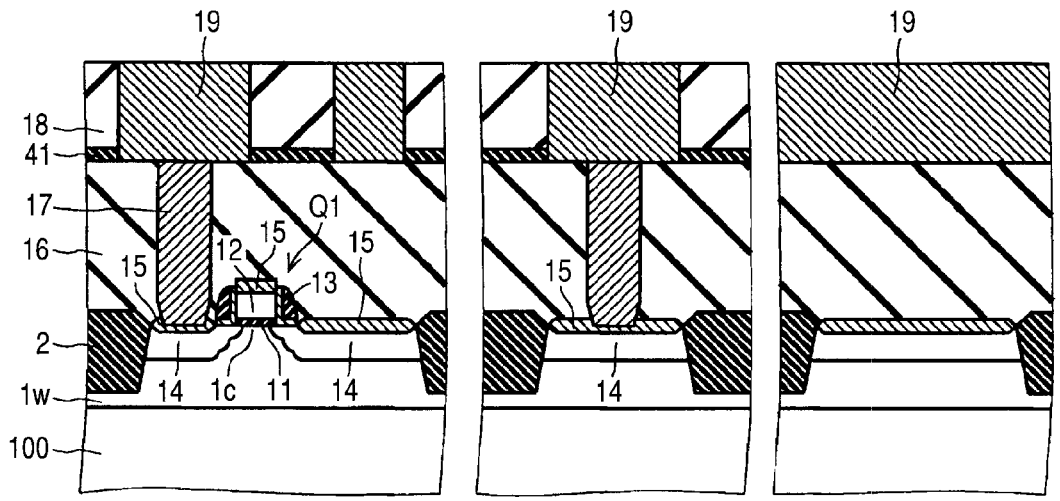

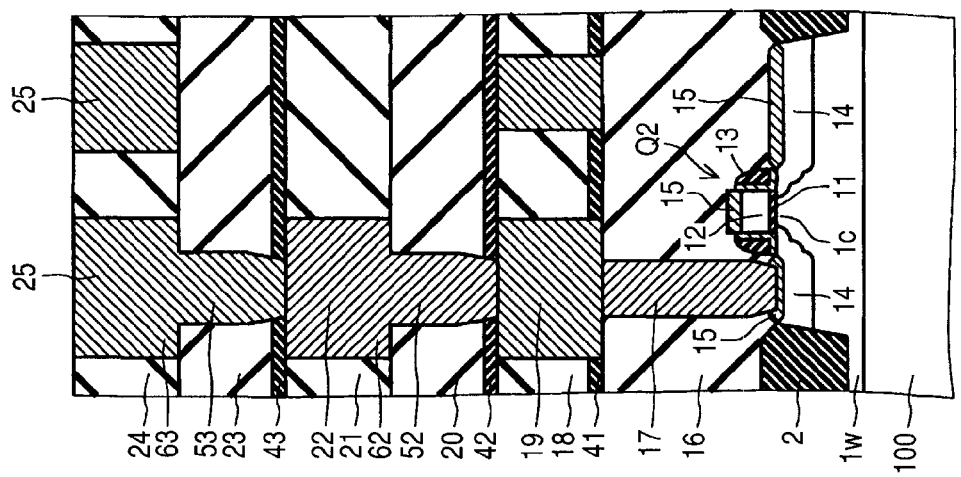
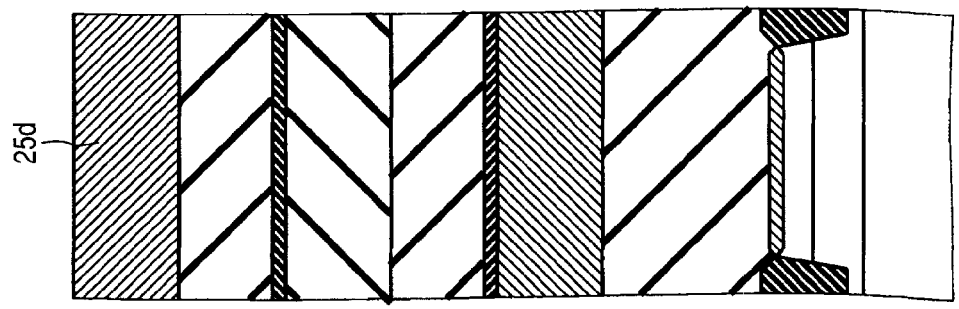
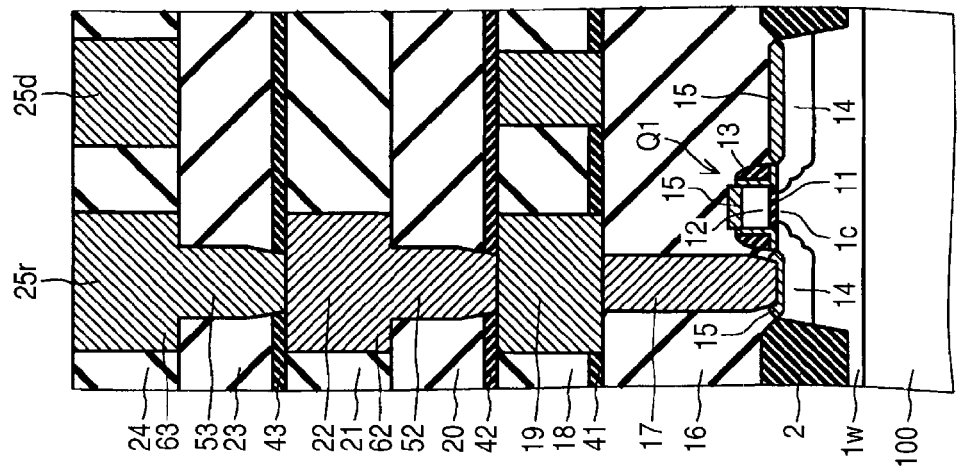
FIG. 12(a)  FIG. 12(b)  FIG. 12(c)  FIG. 12(d)

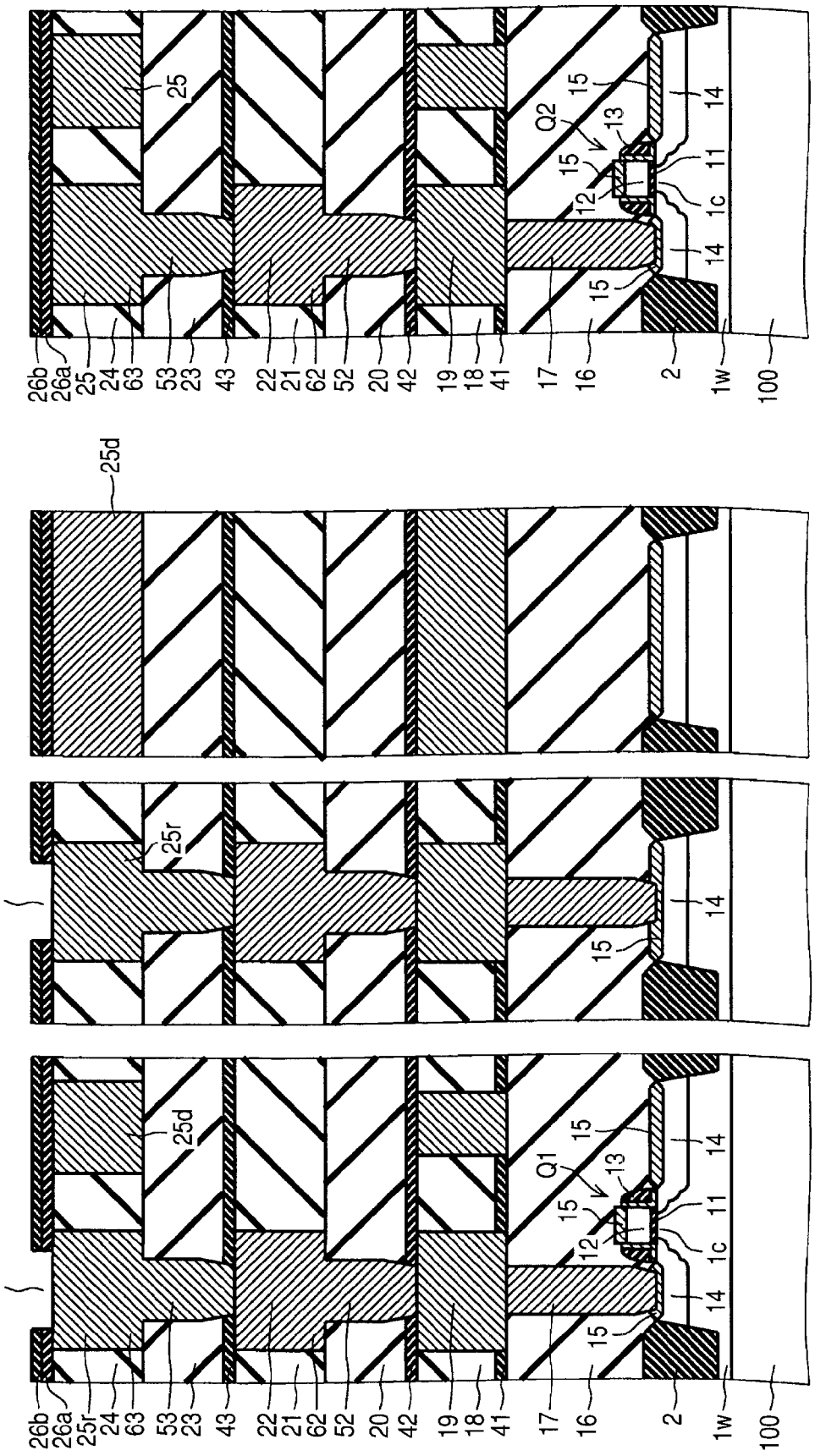

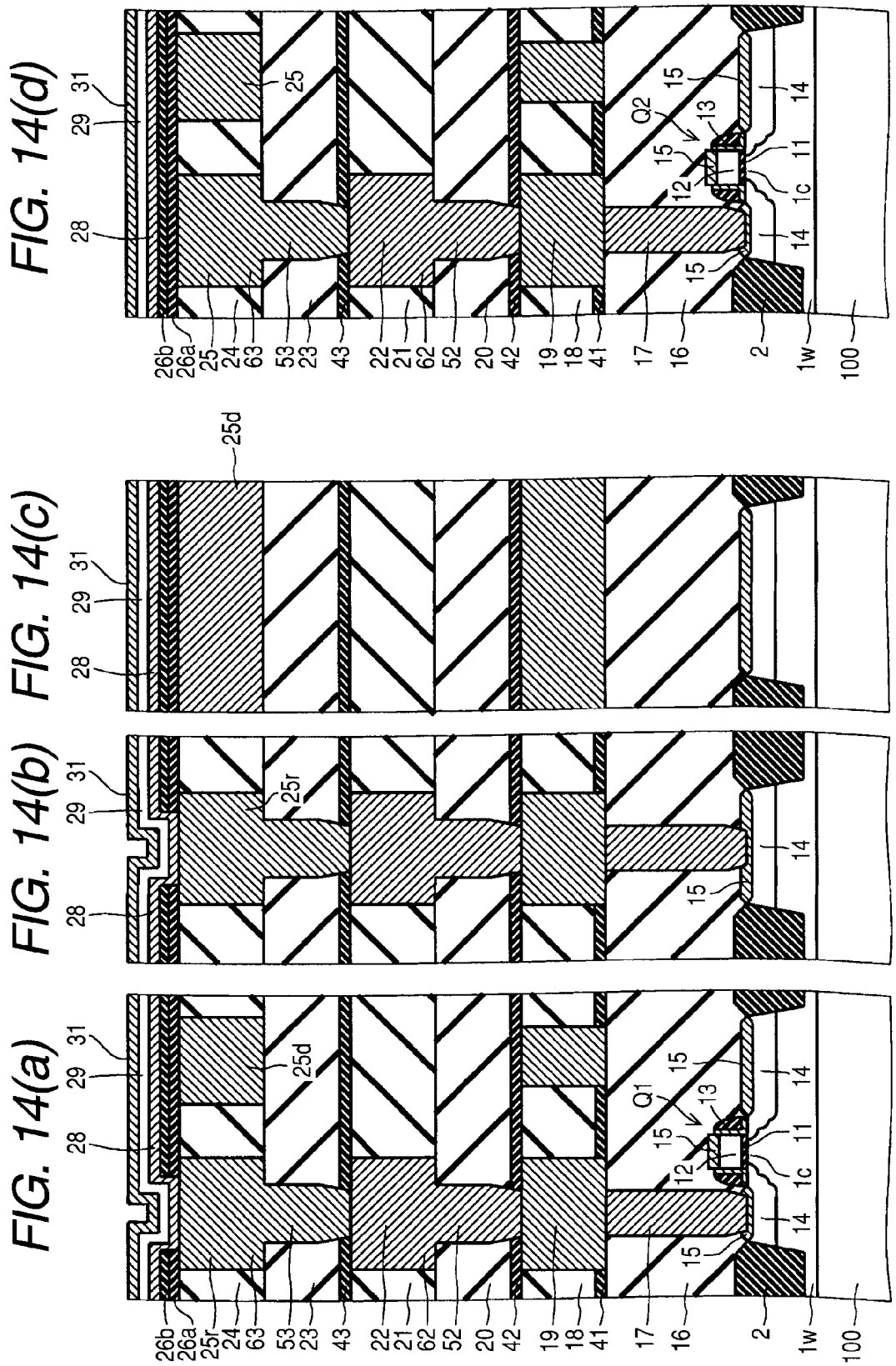

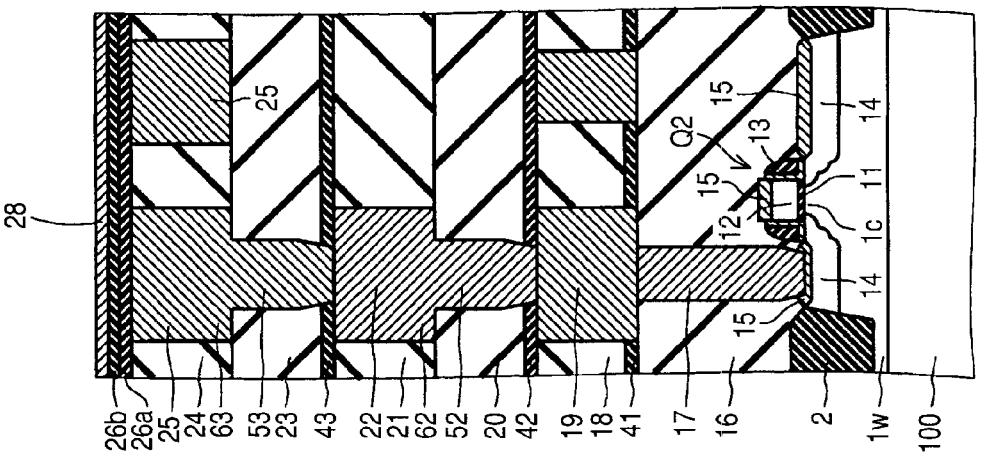
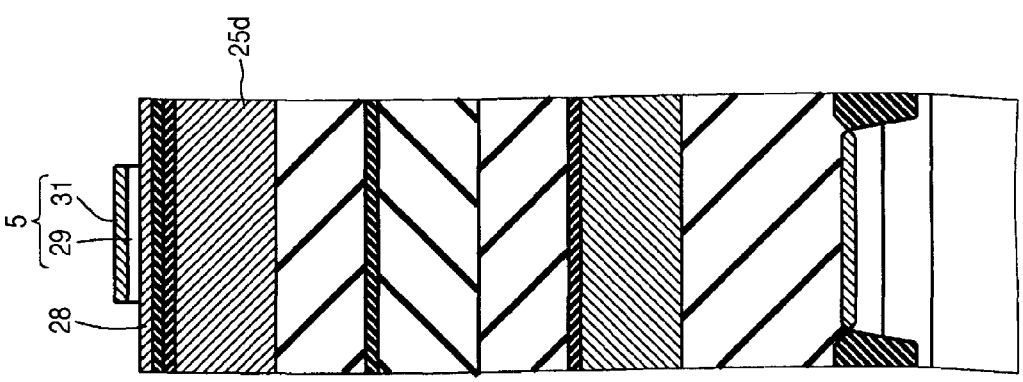
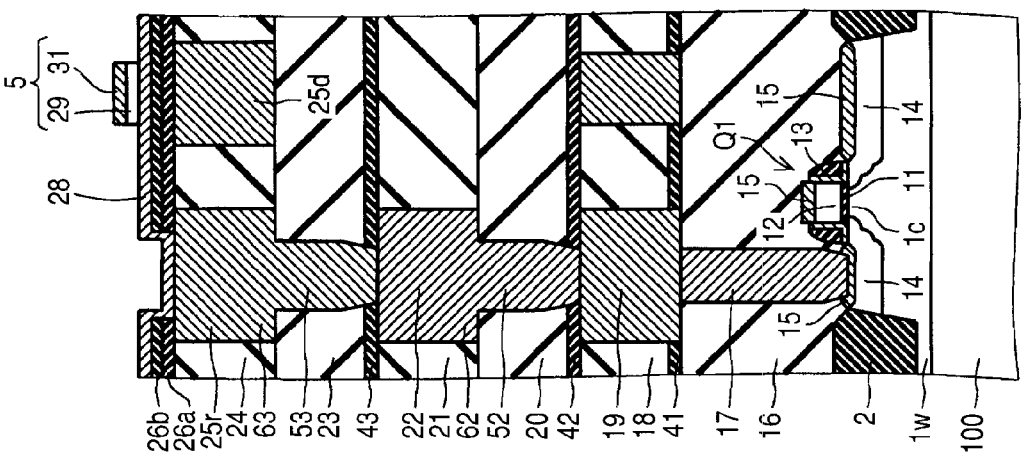

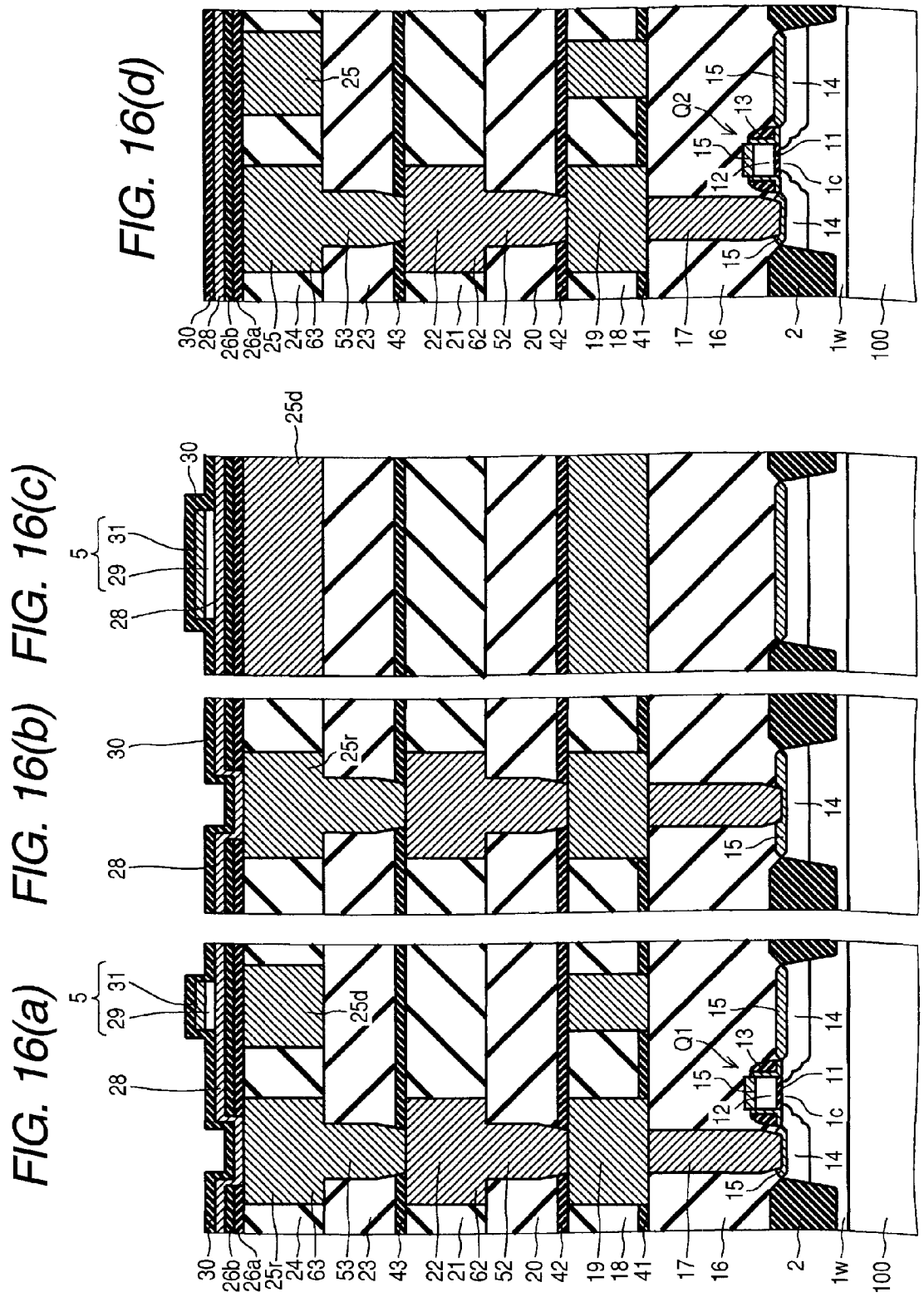

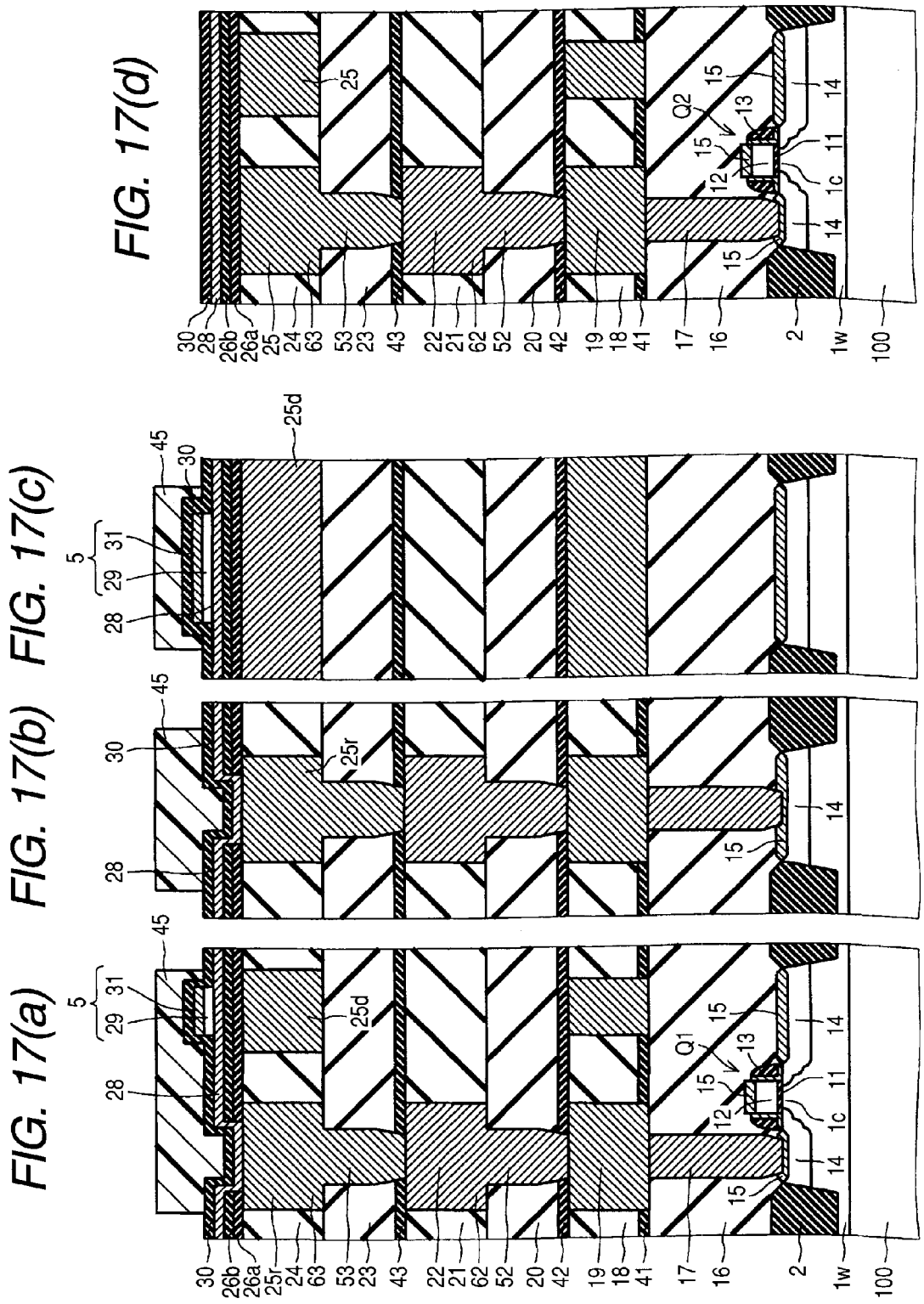

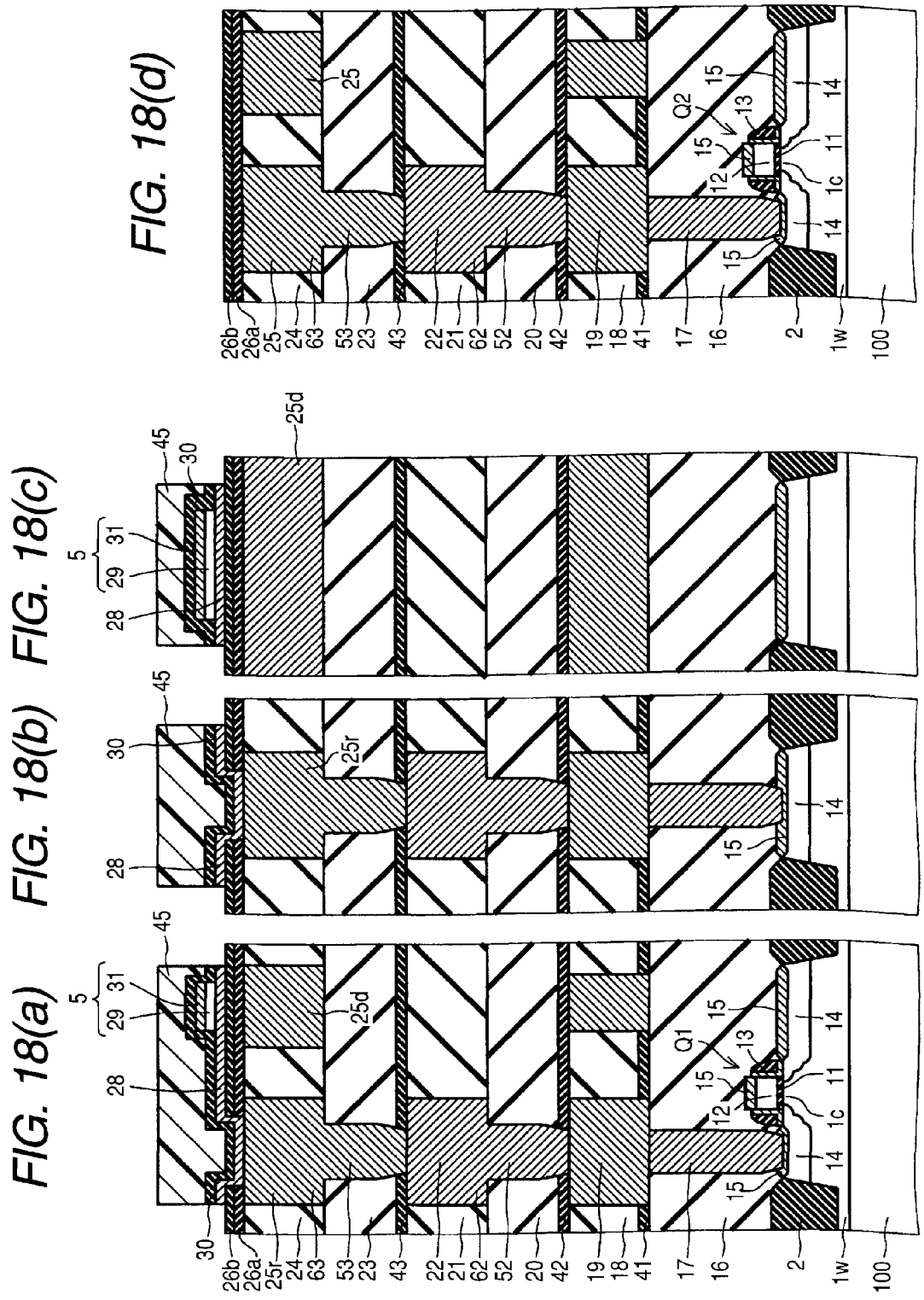

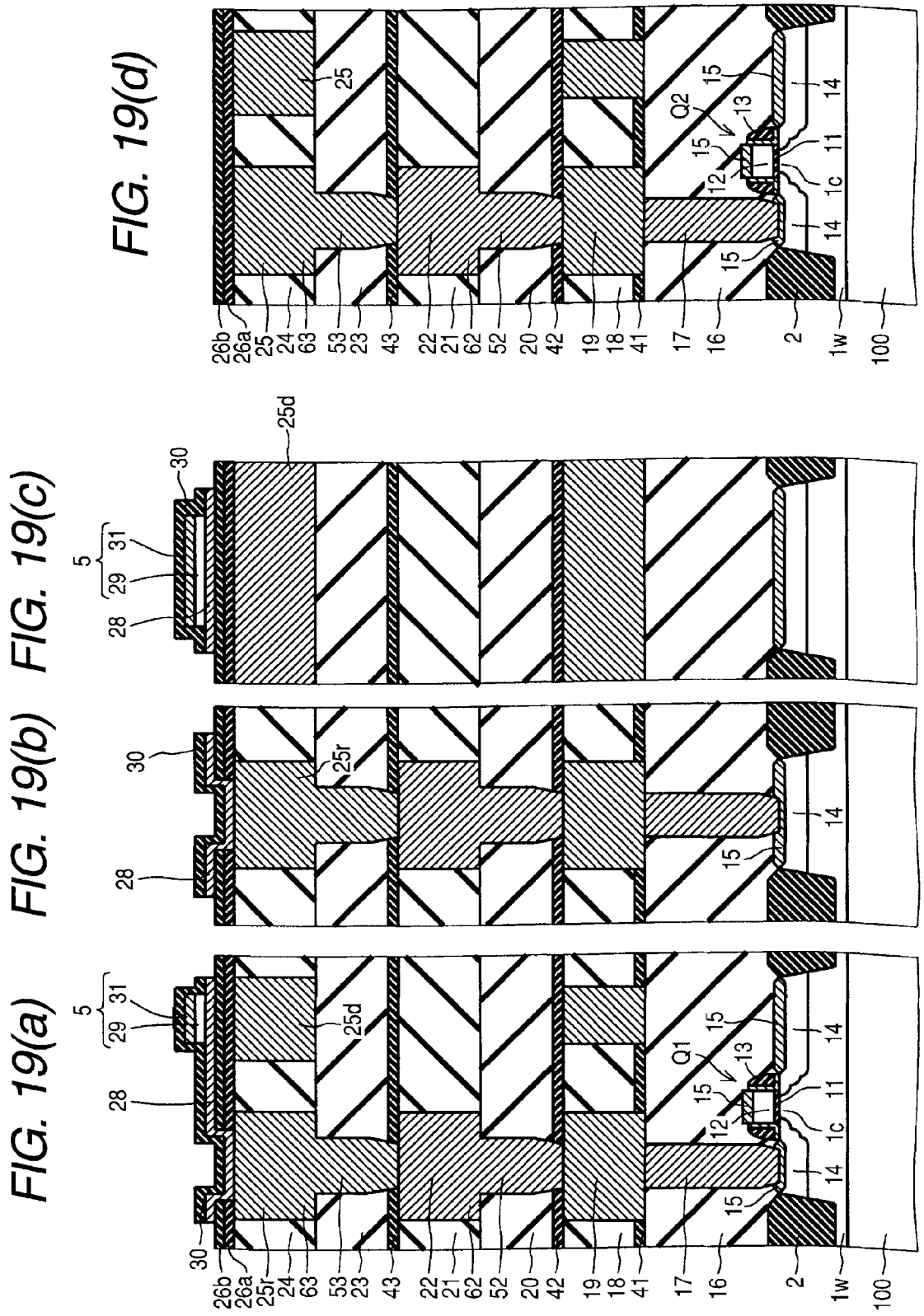

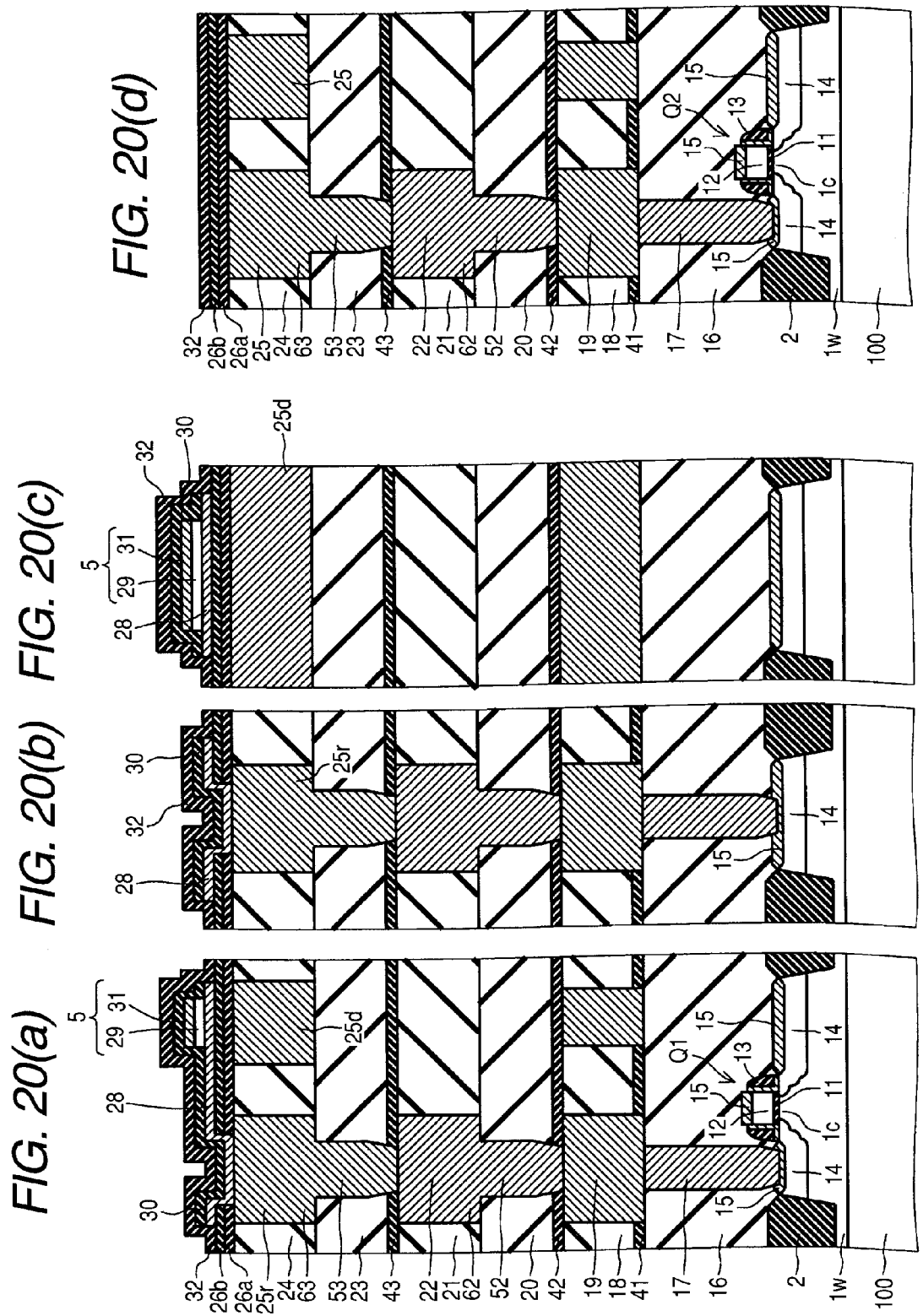

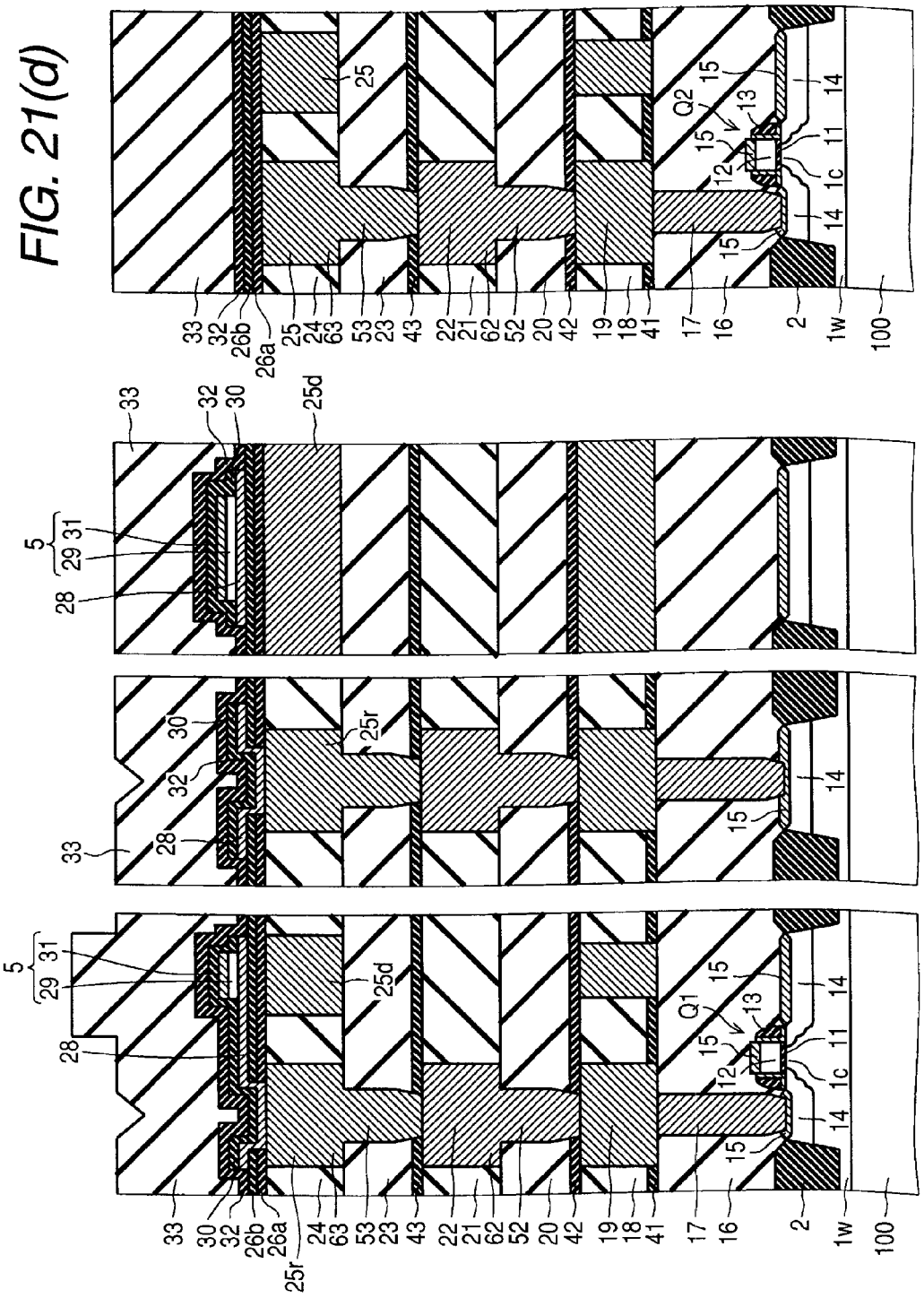

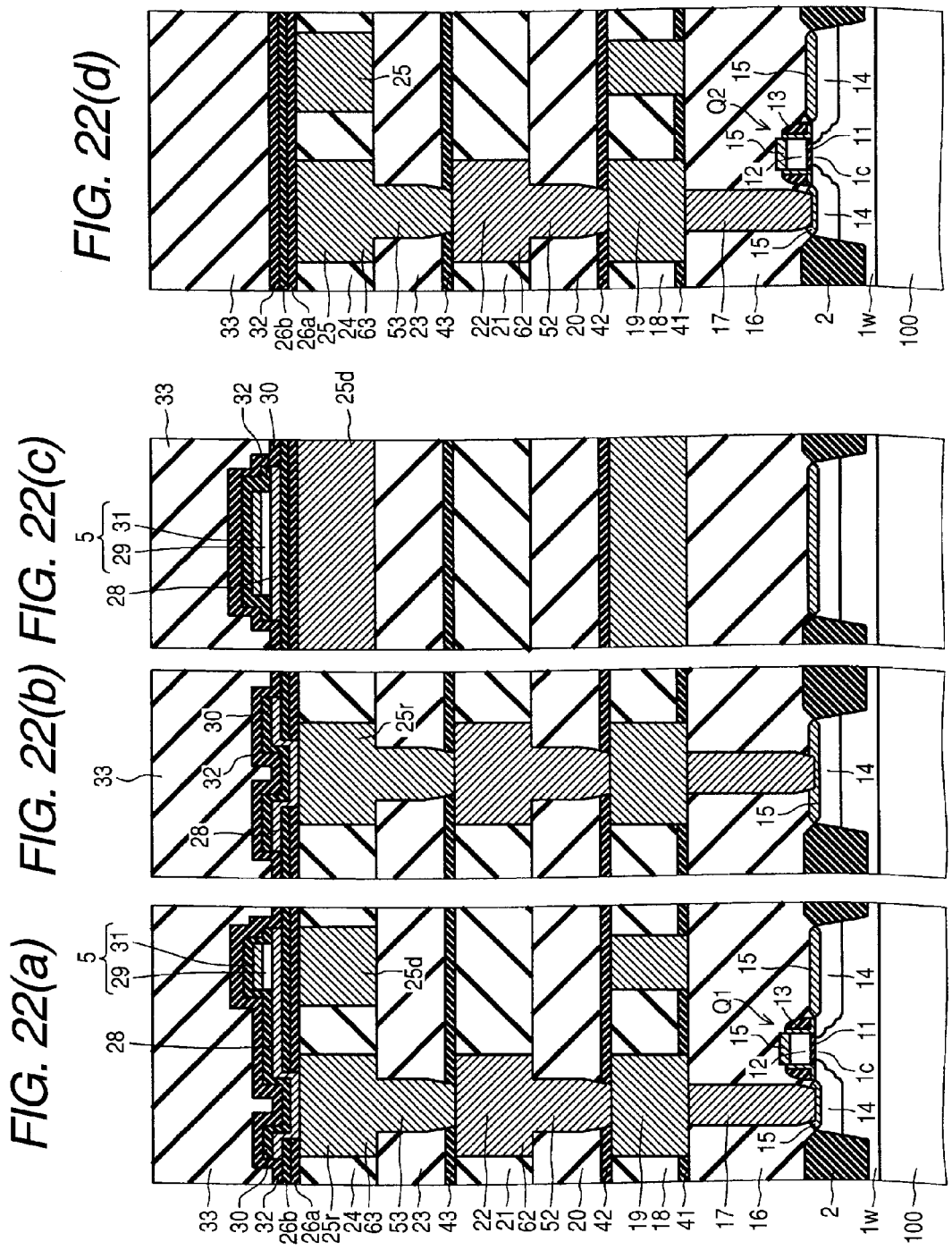

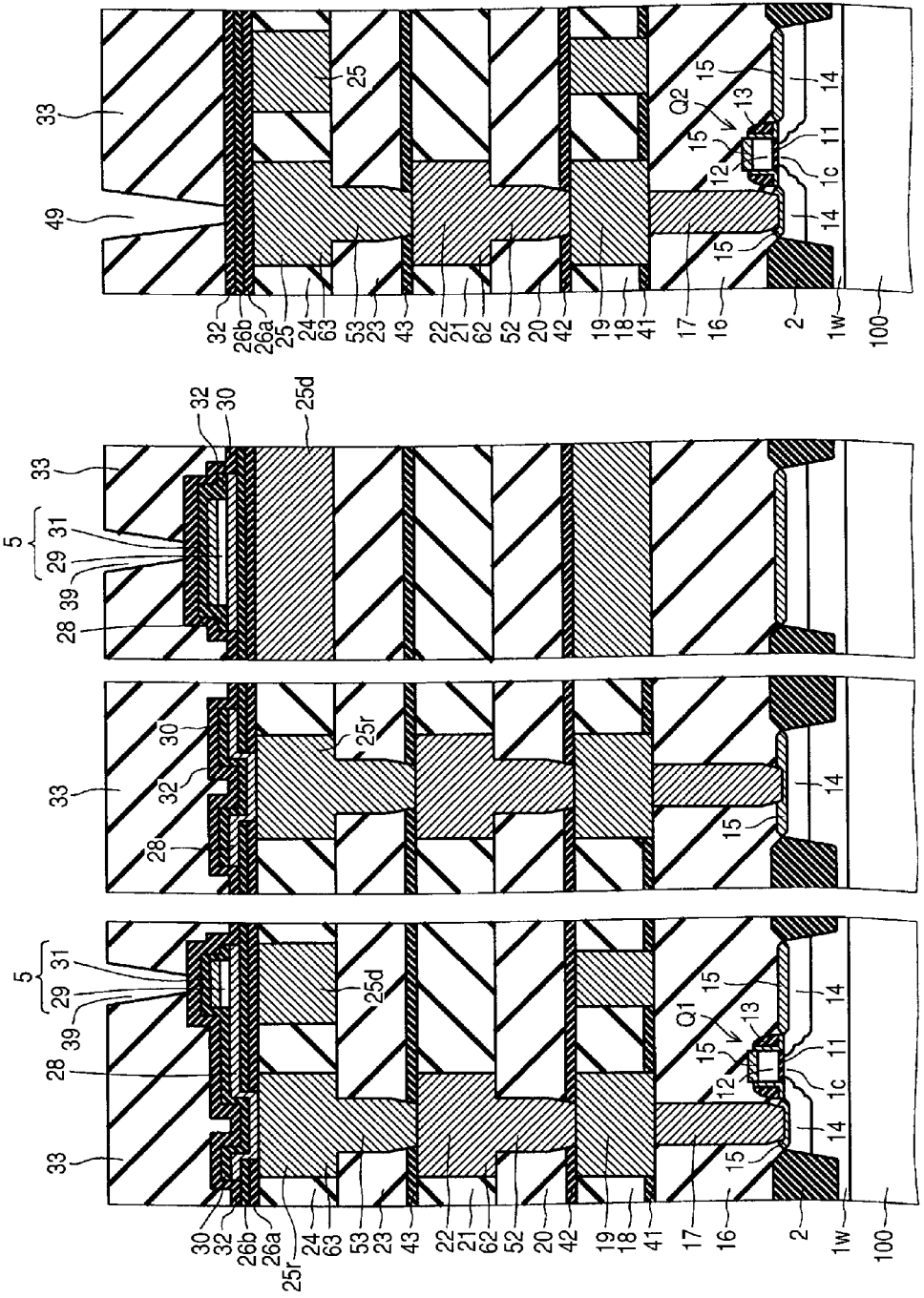

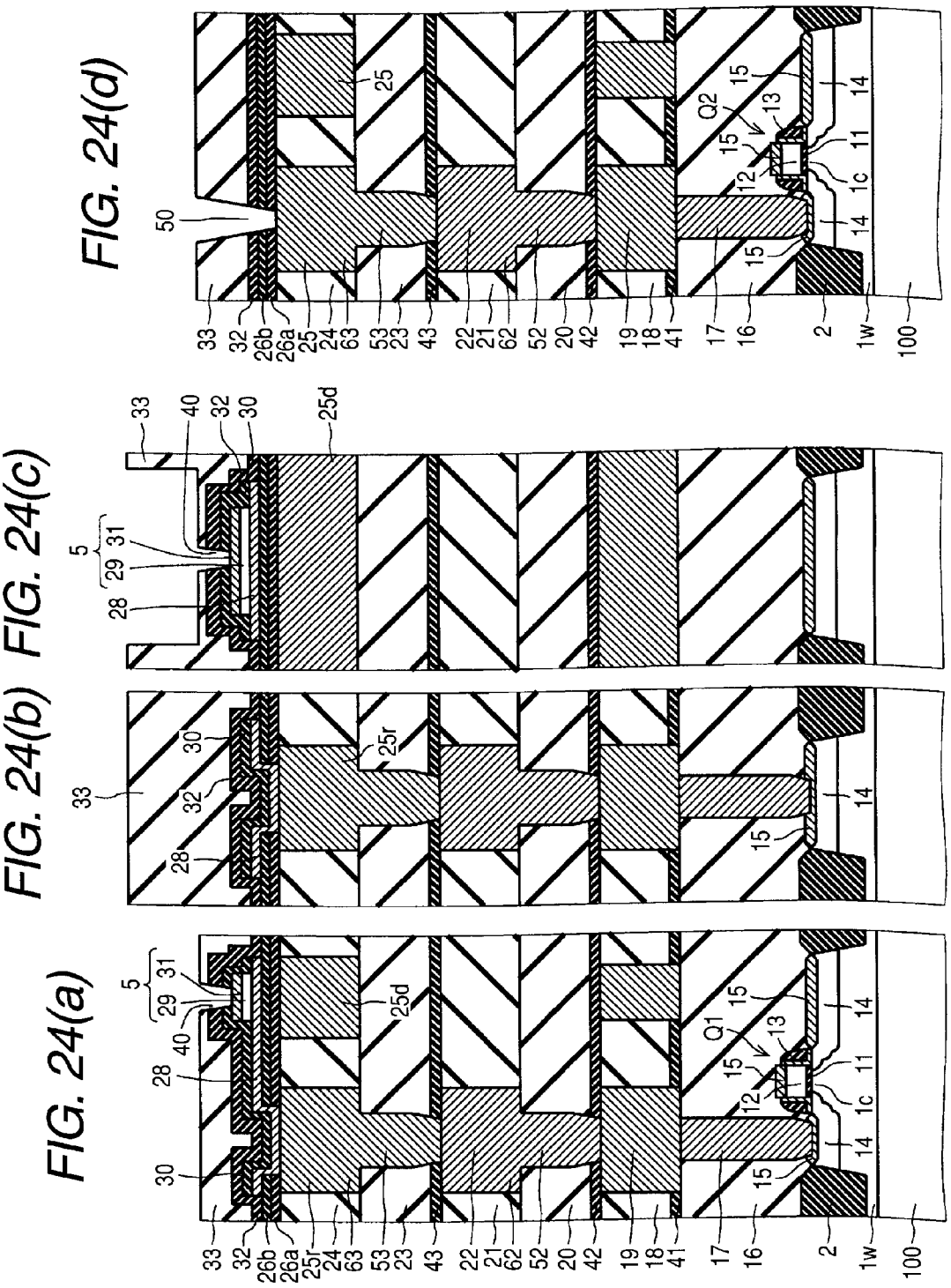

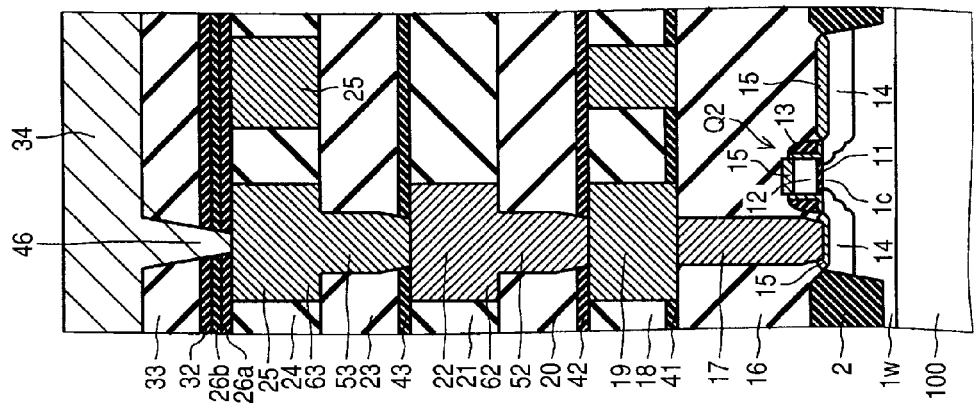
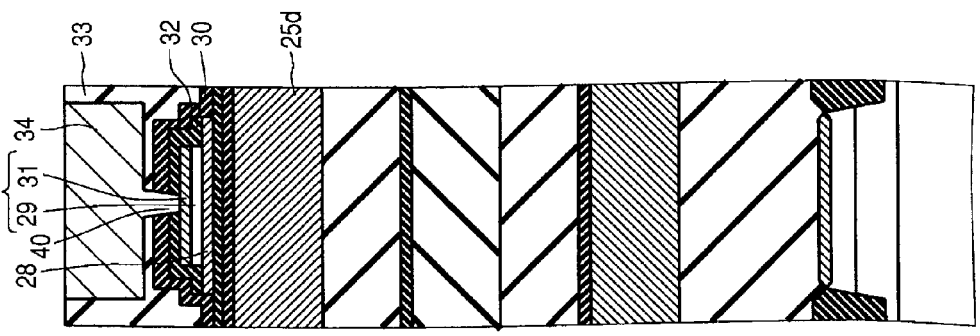
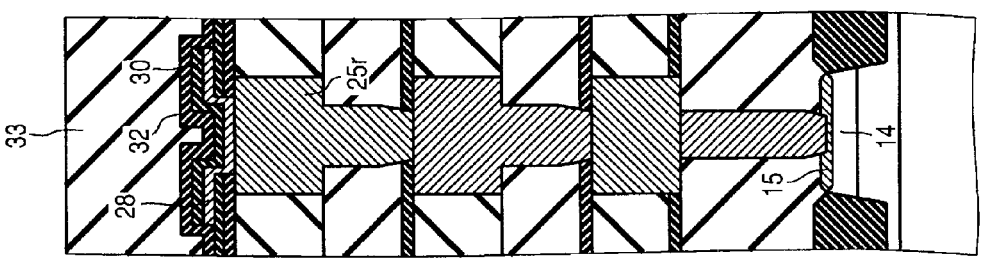
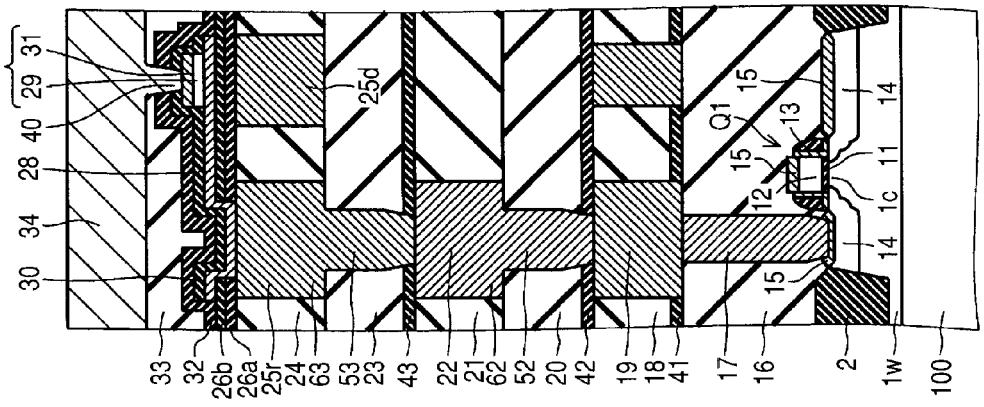

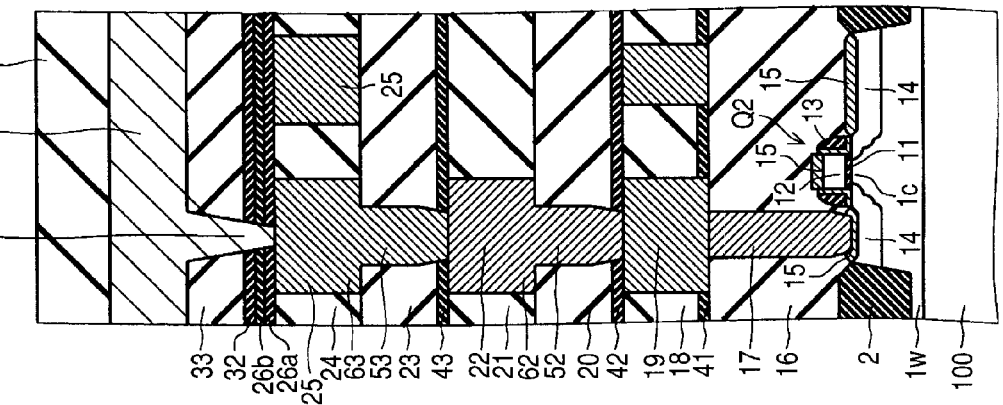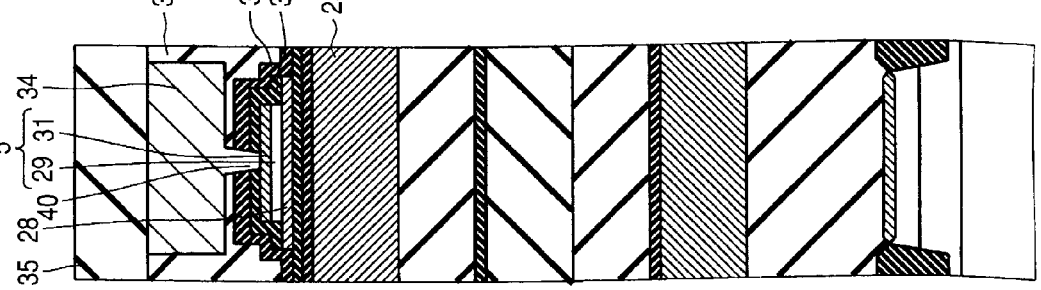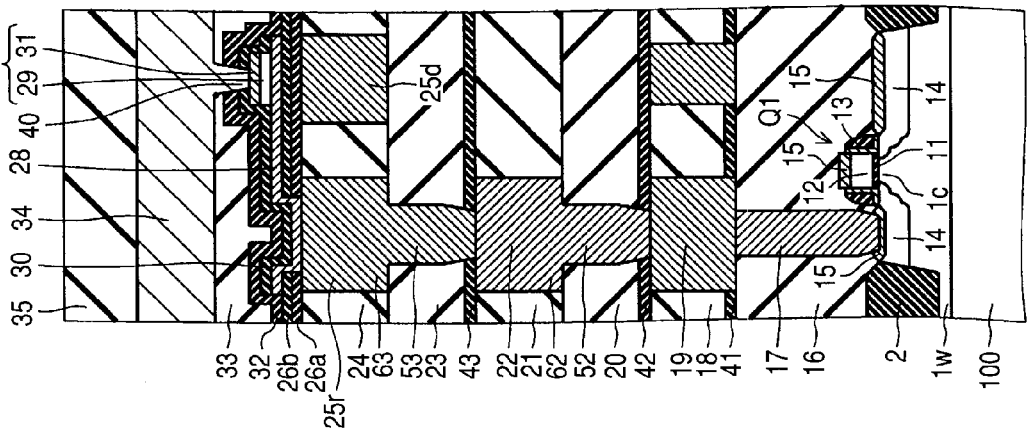

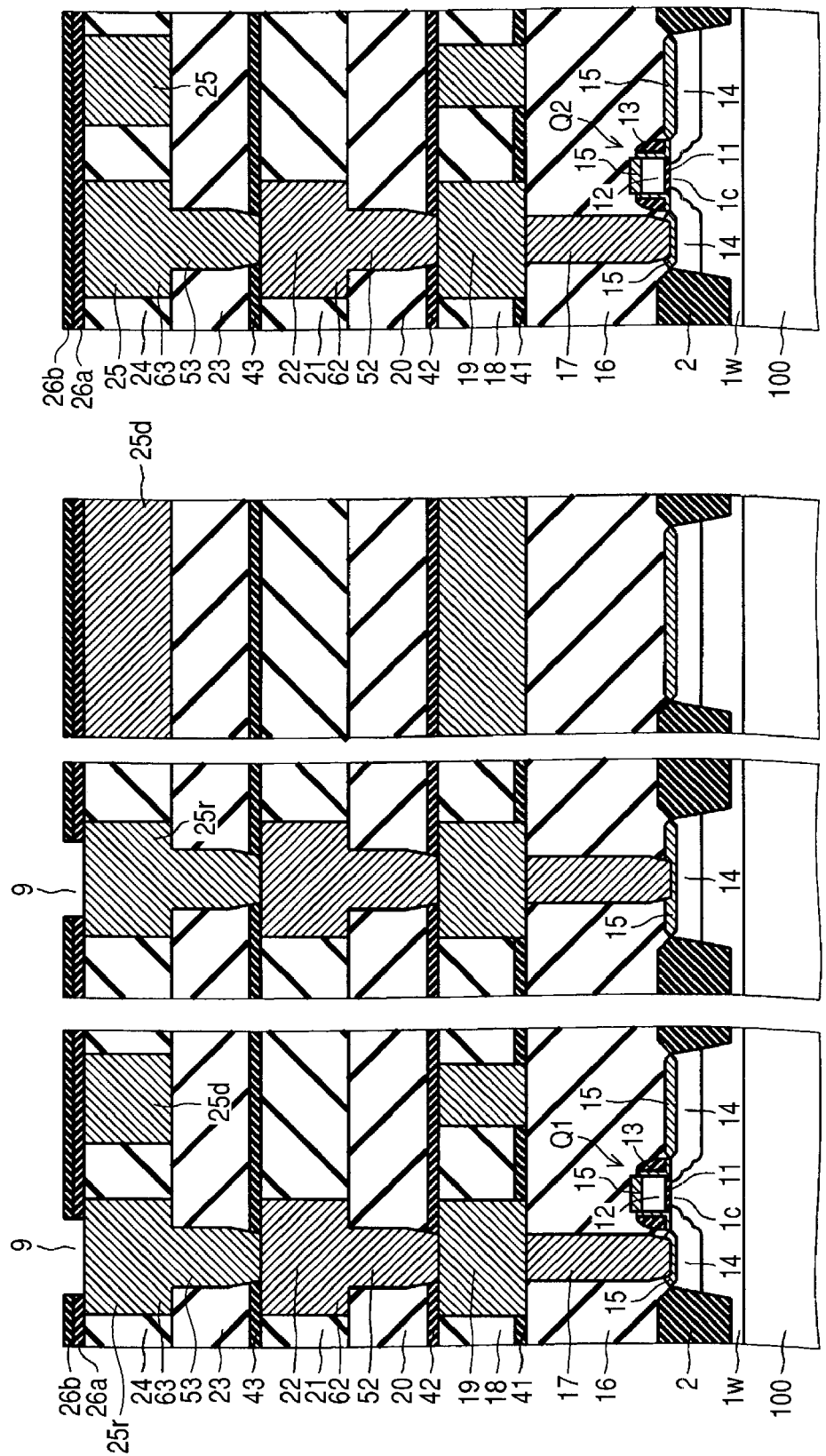

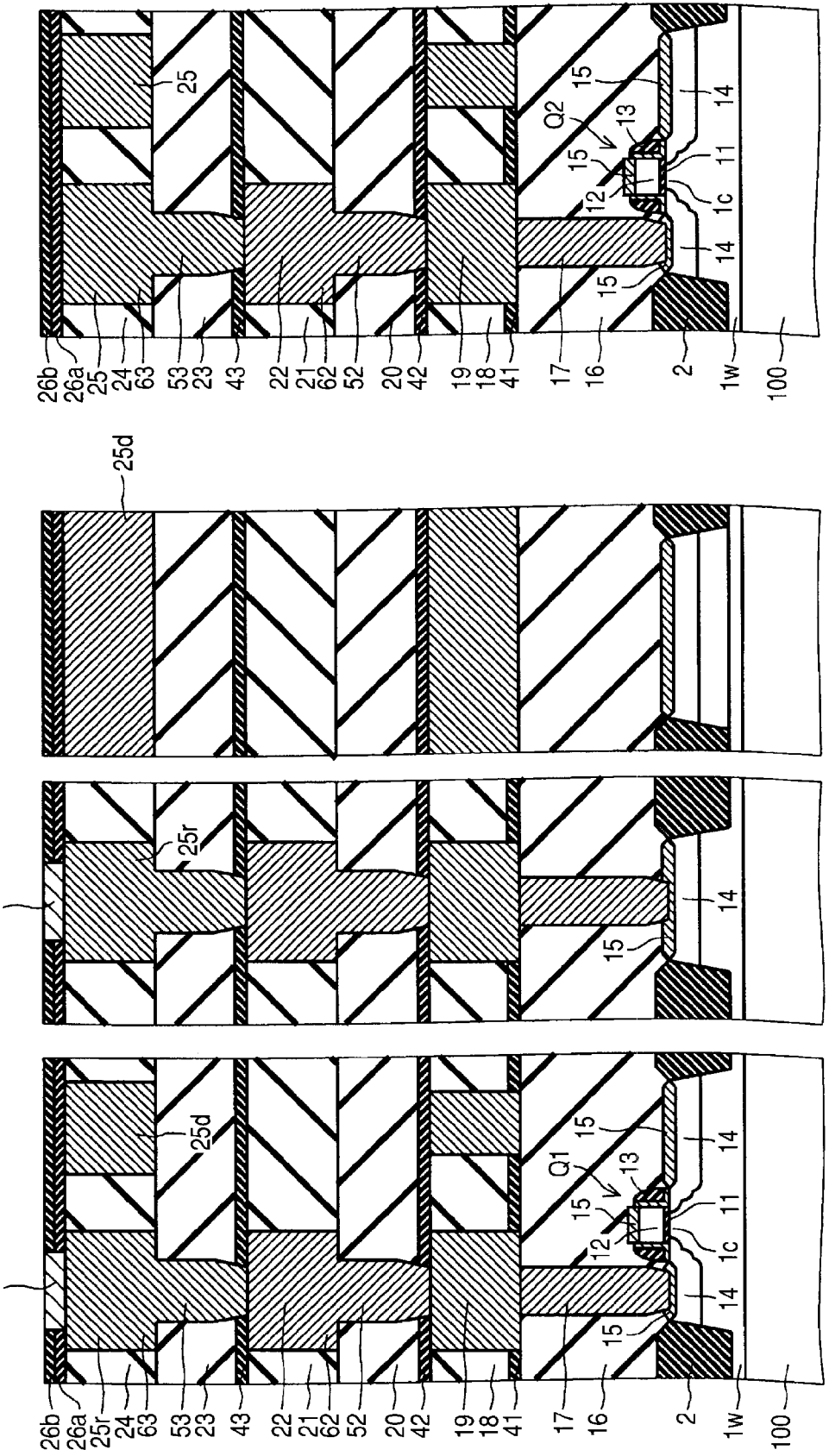

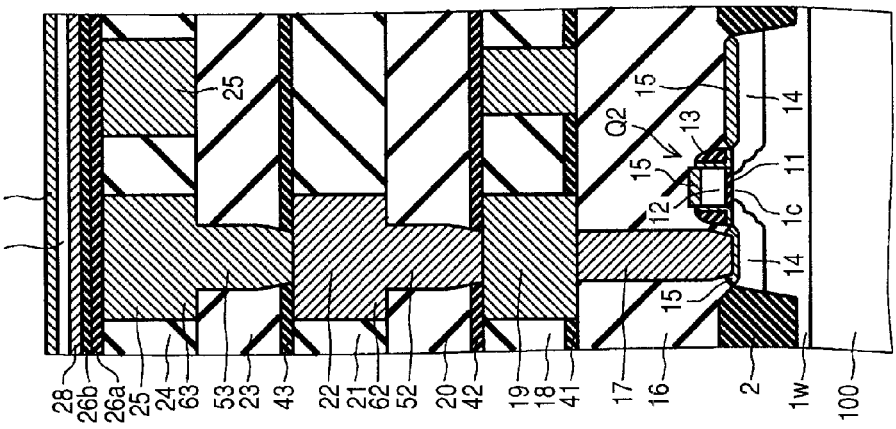
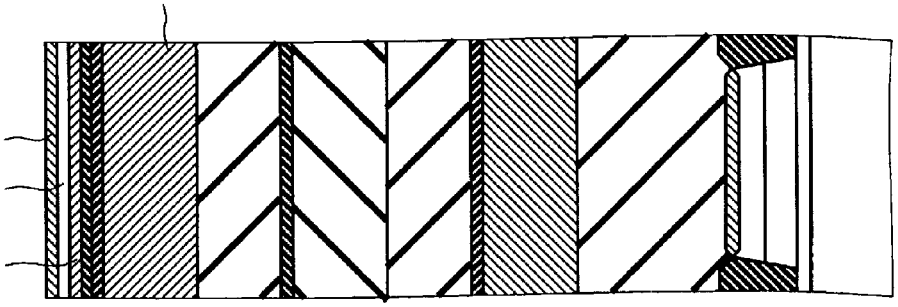
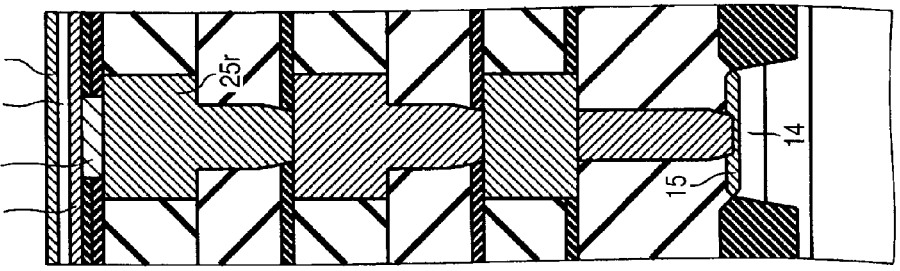
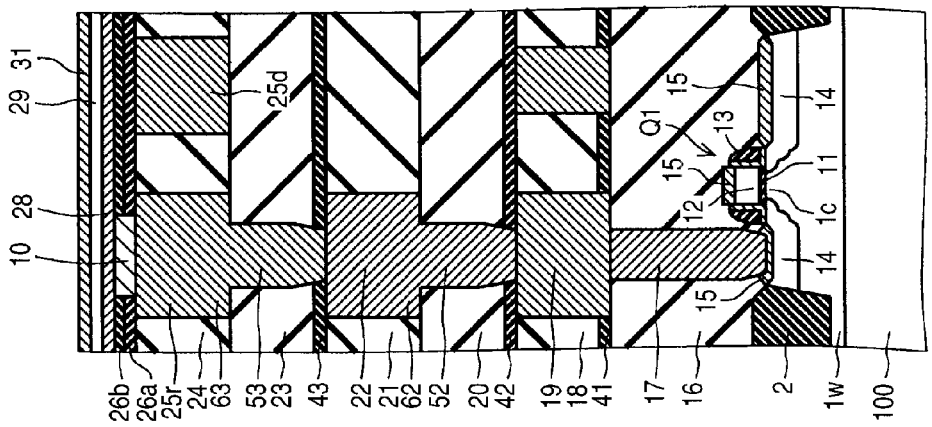

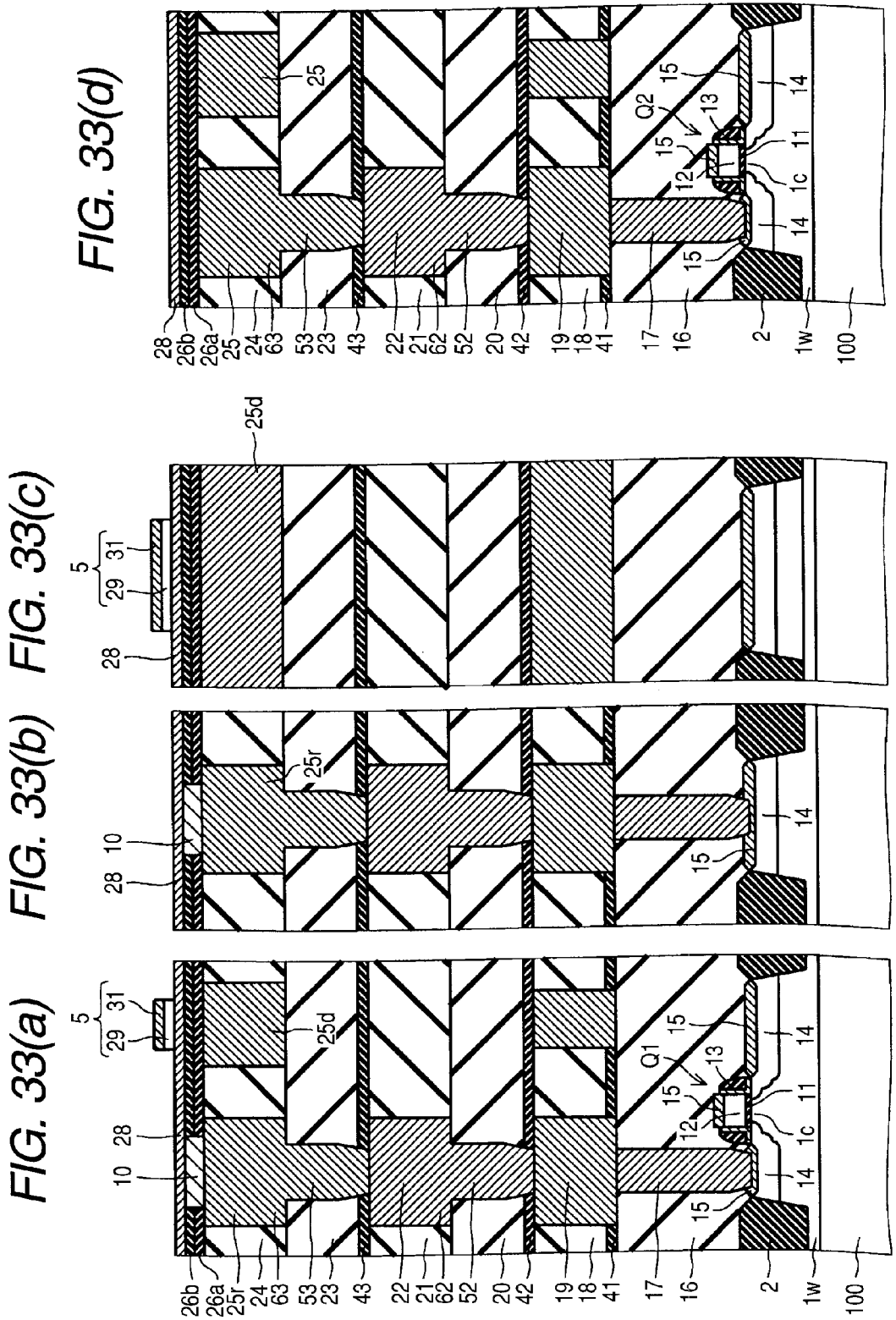

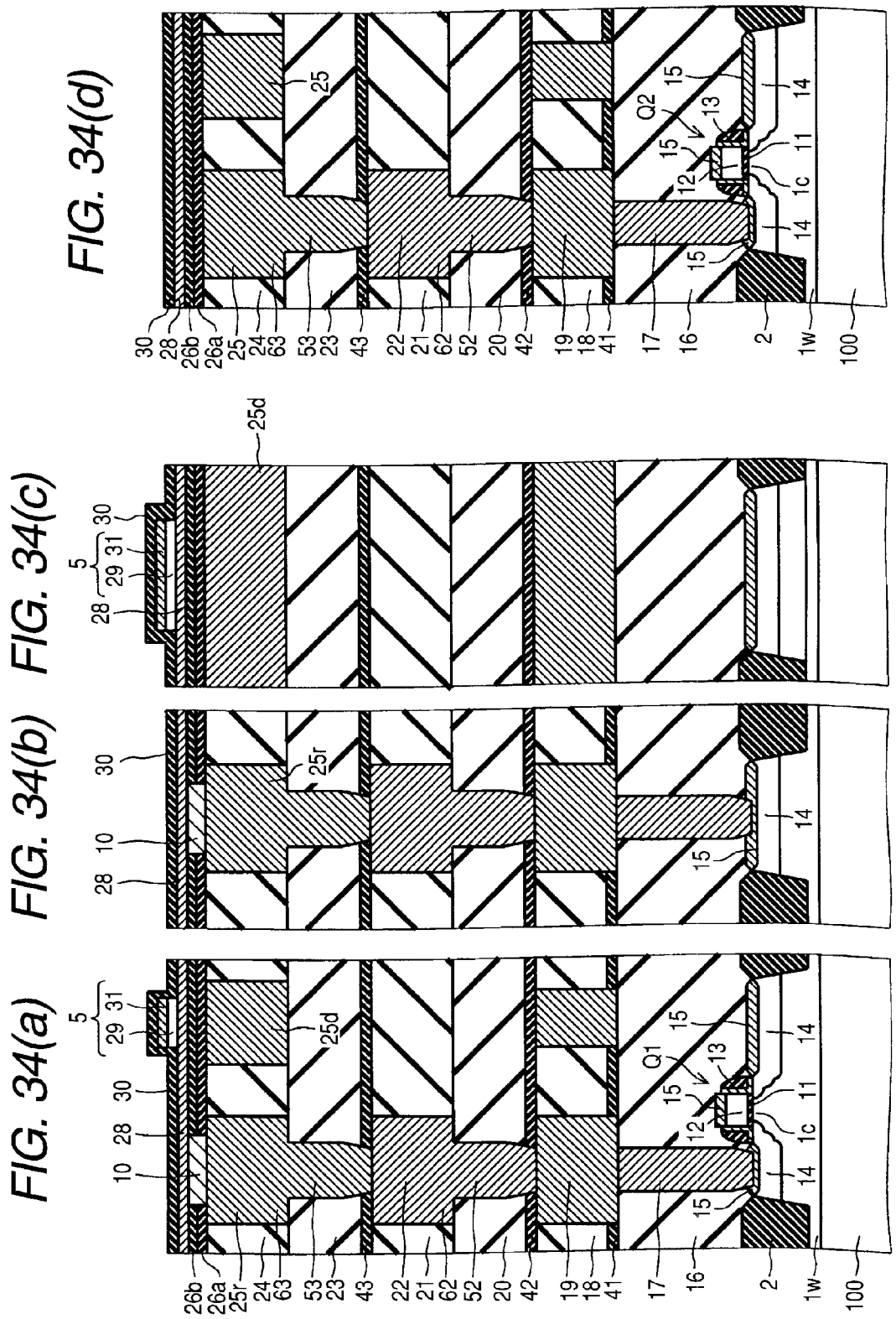

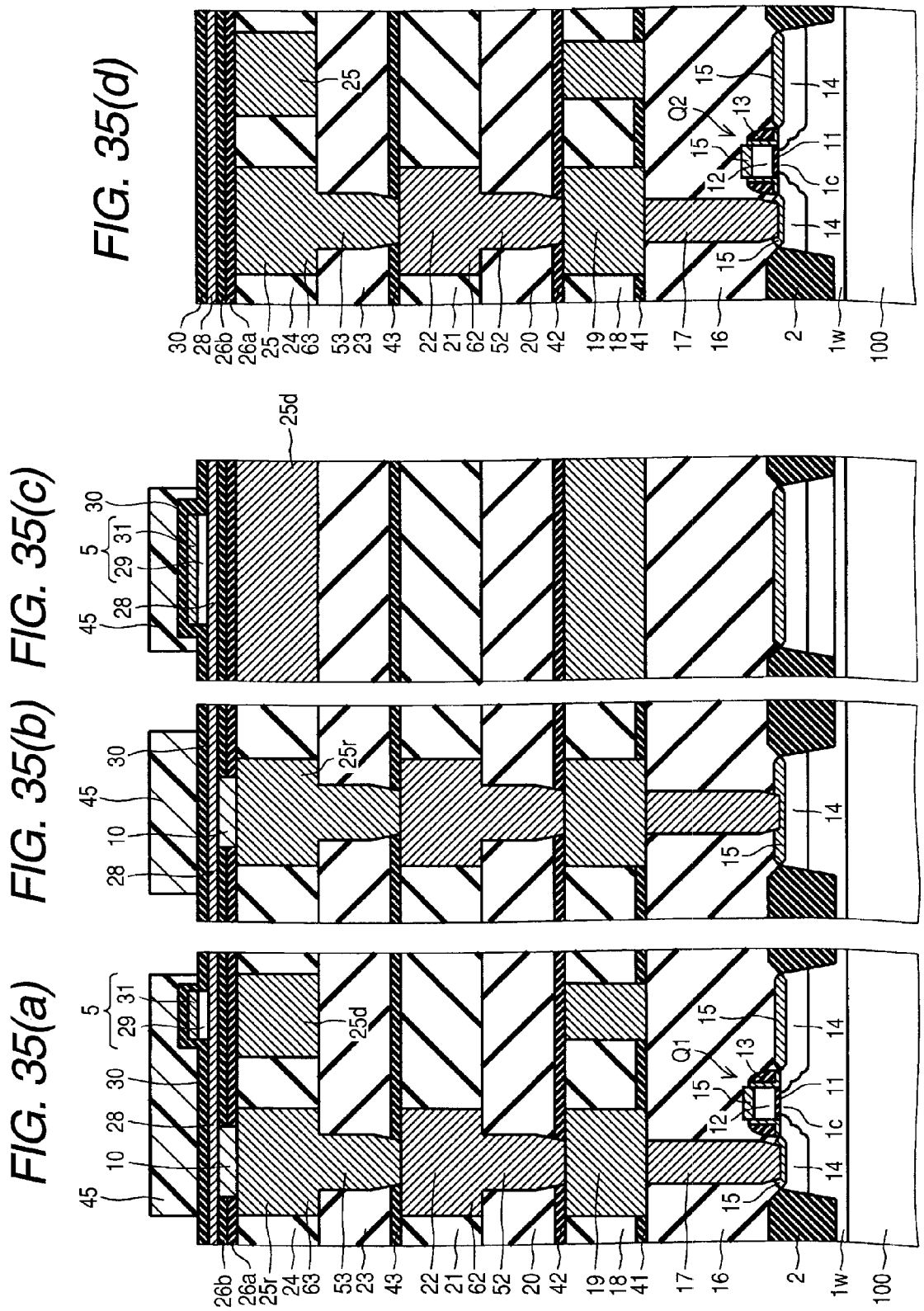

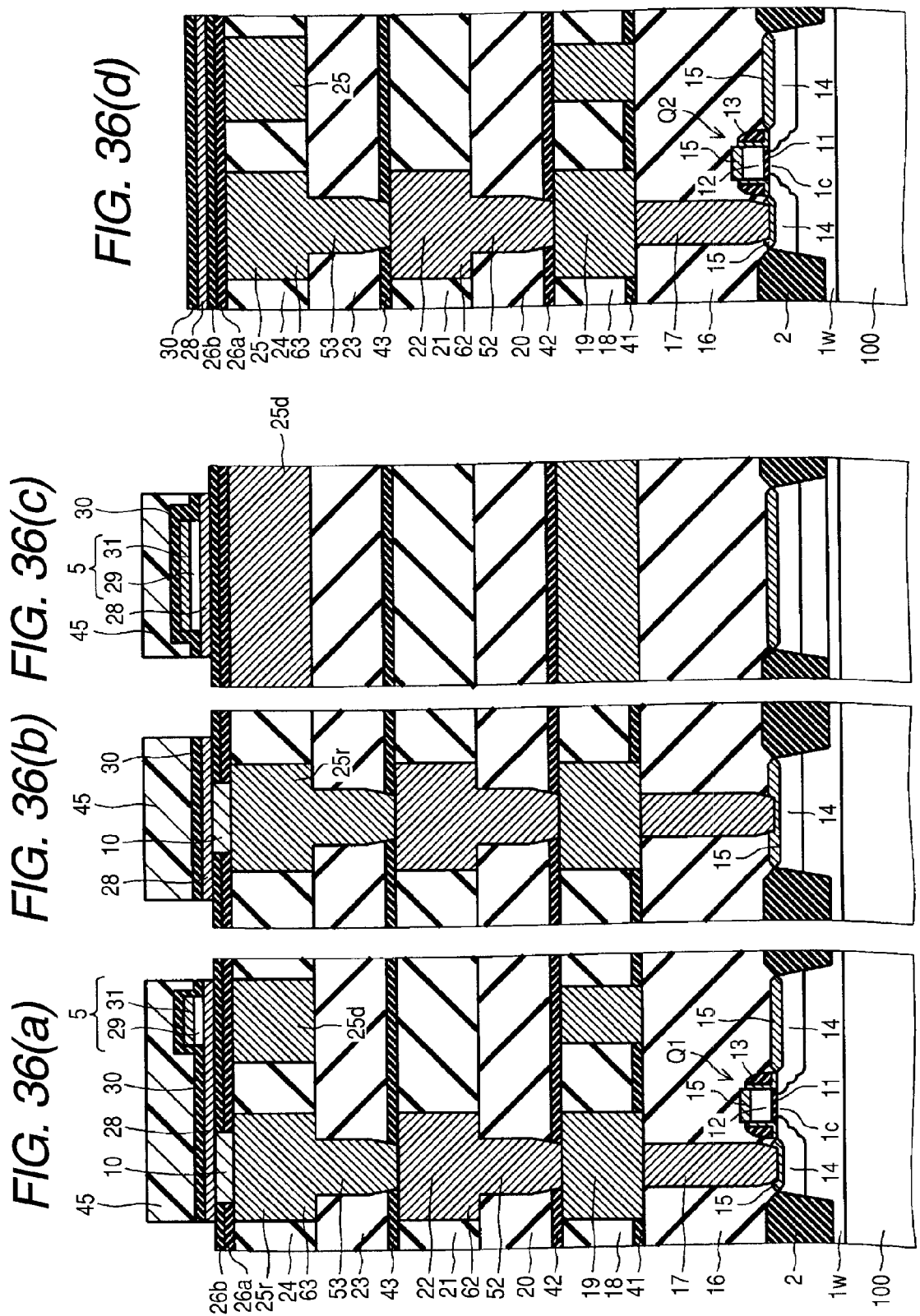

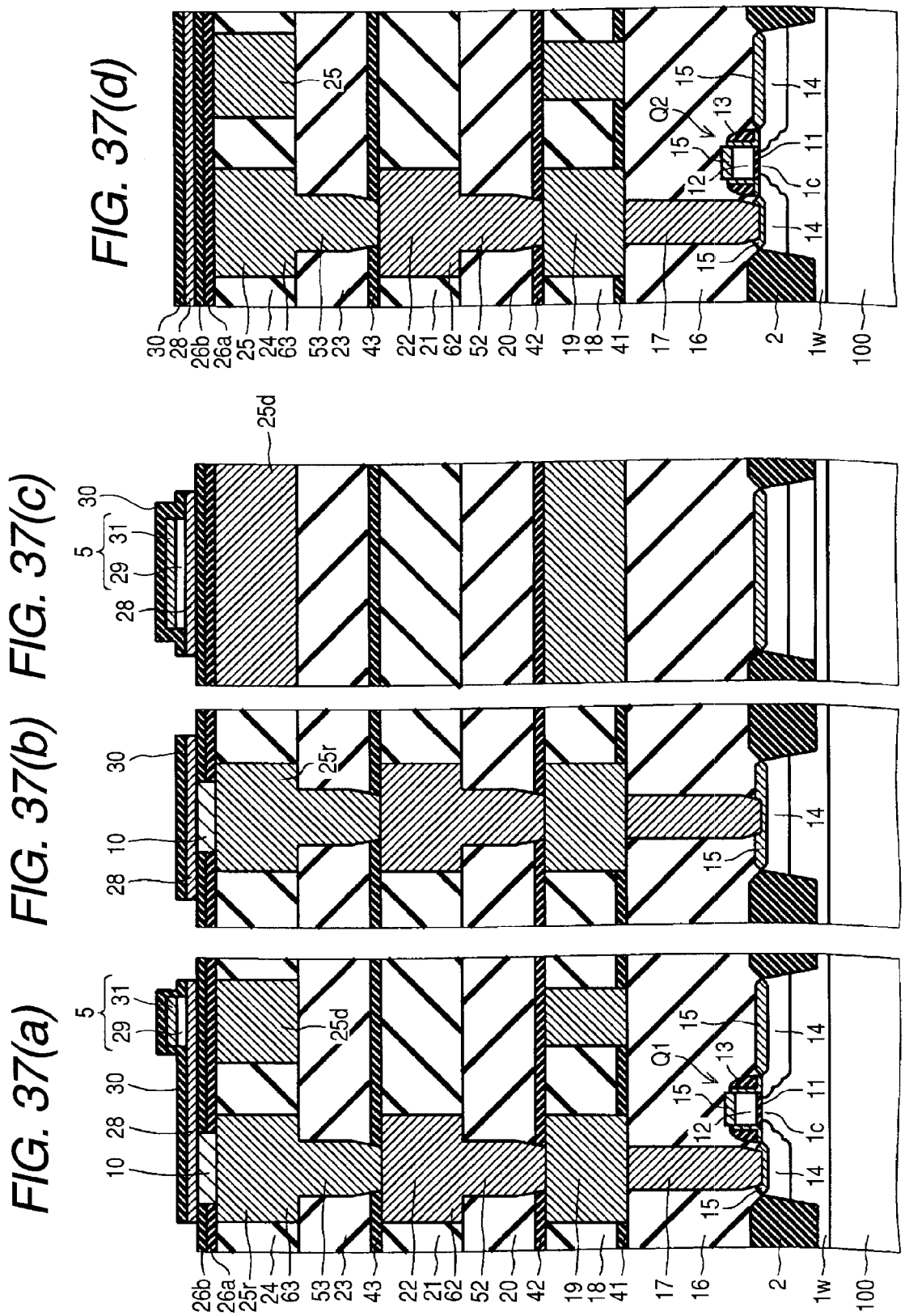

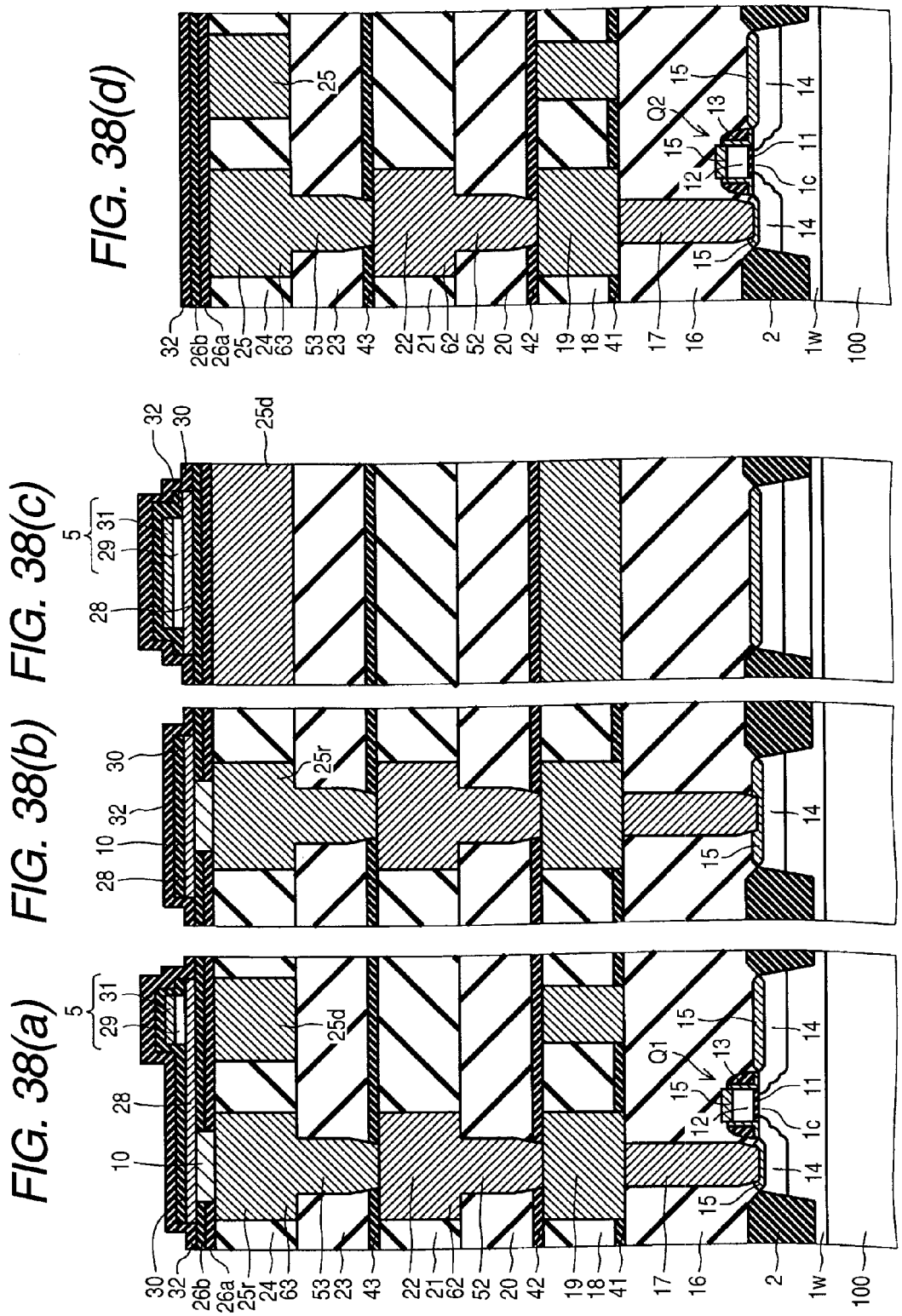

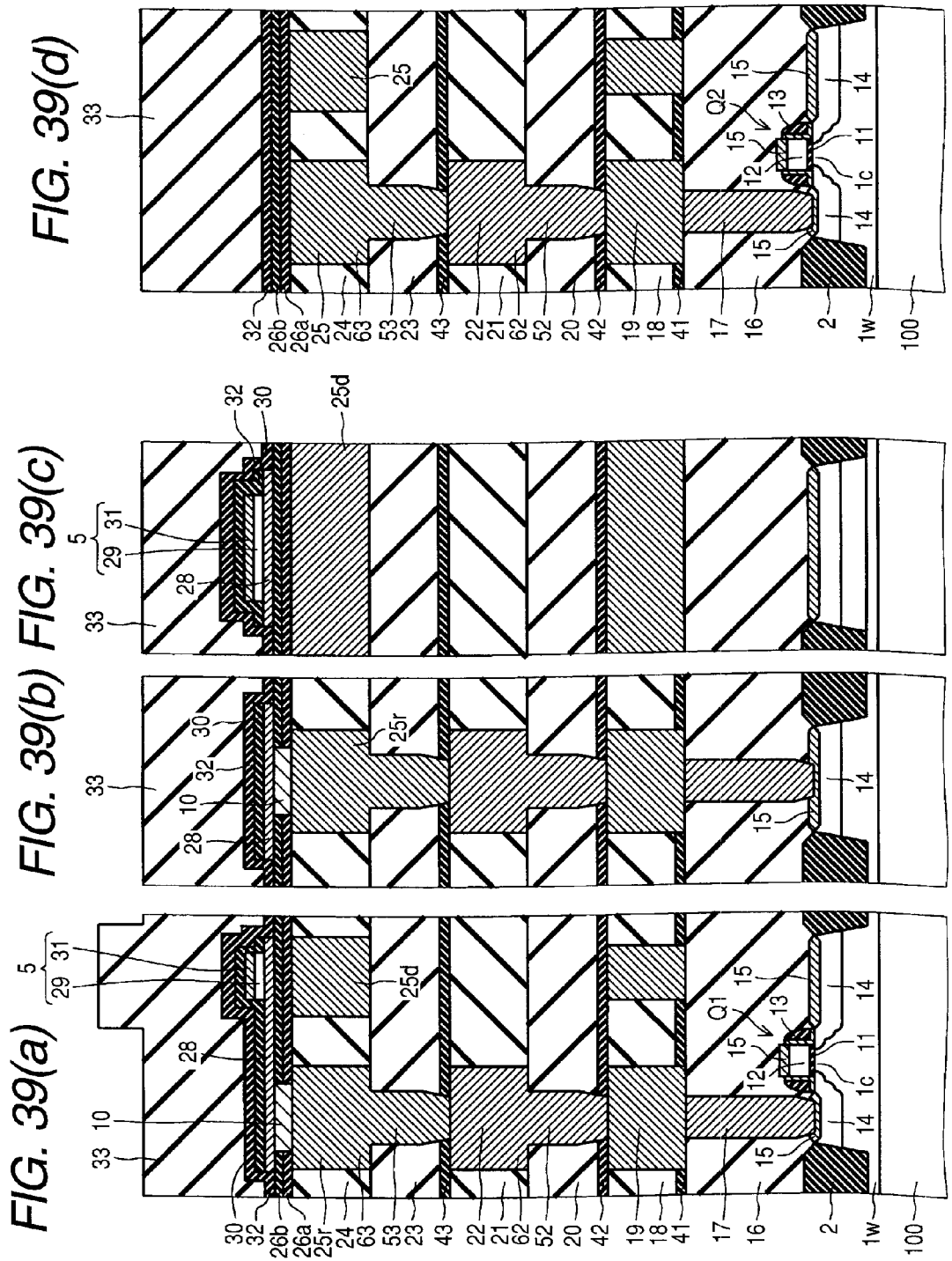

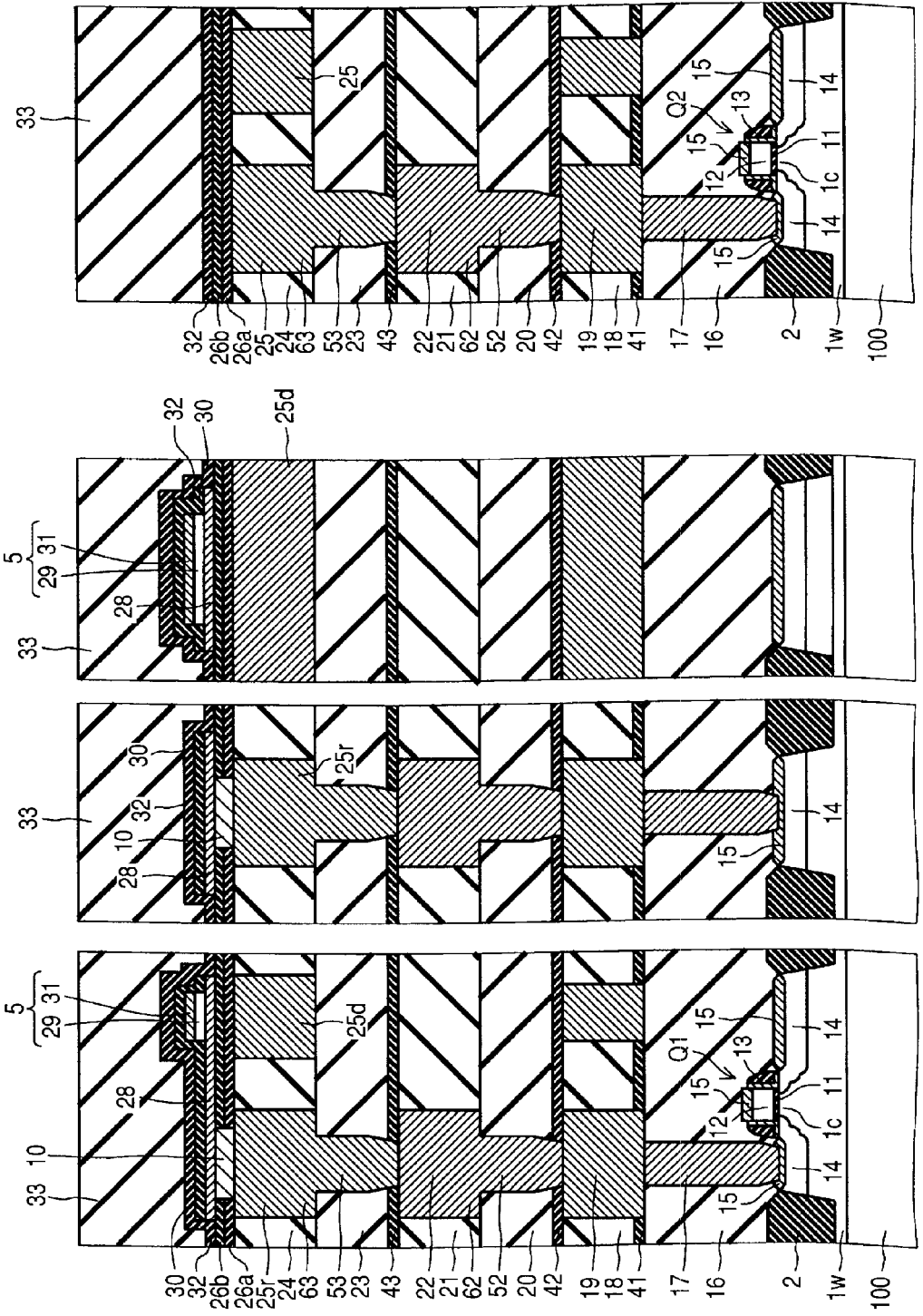

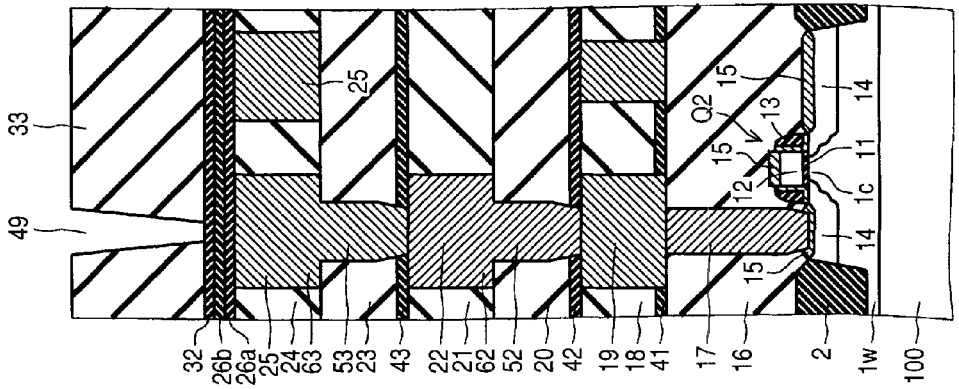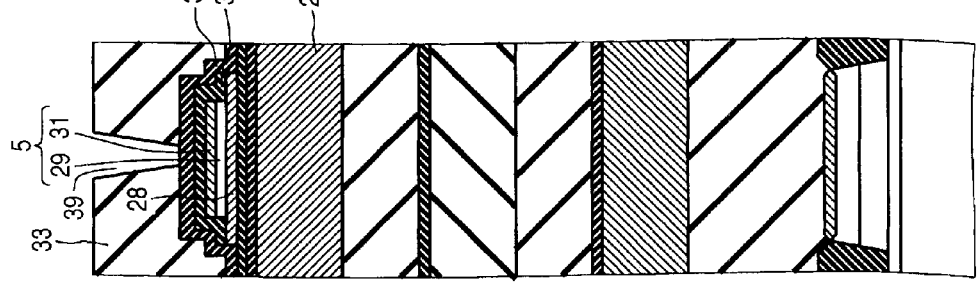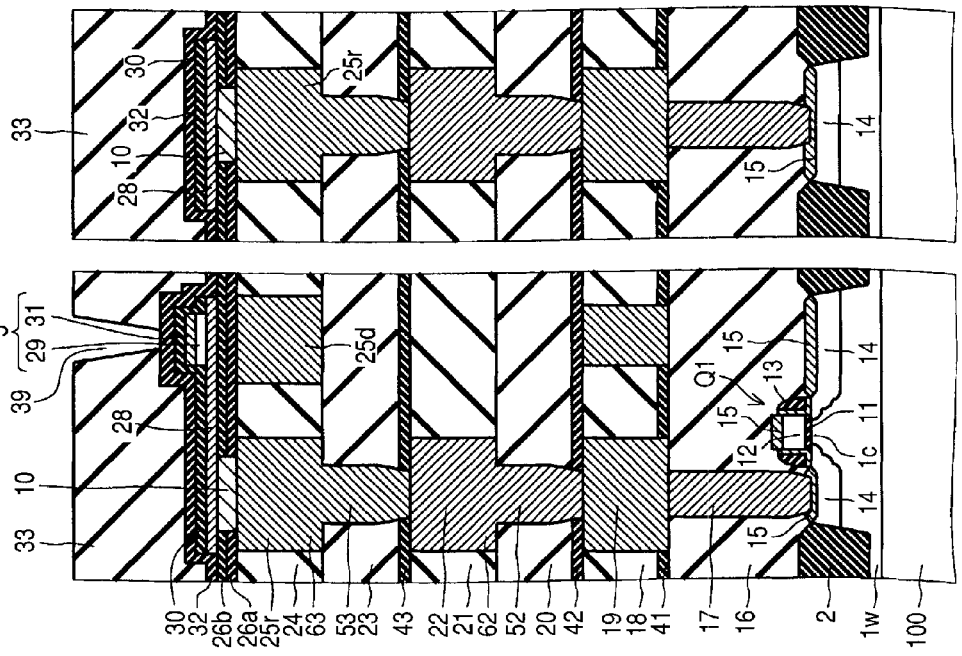

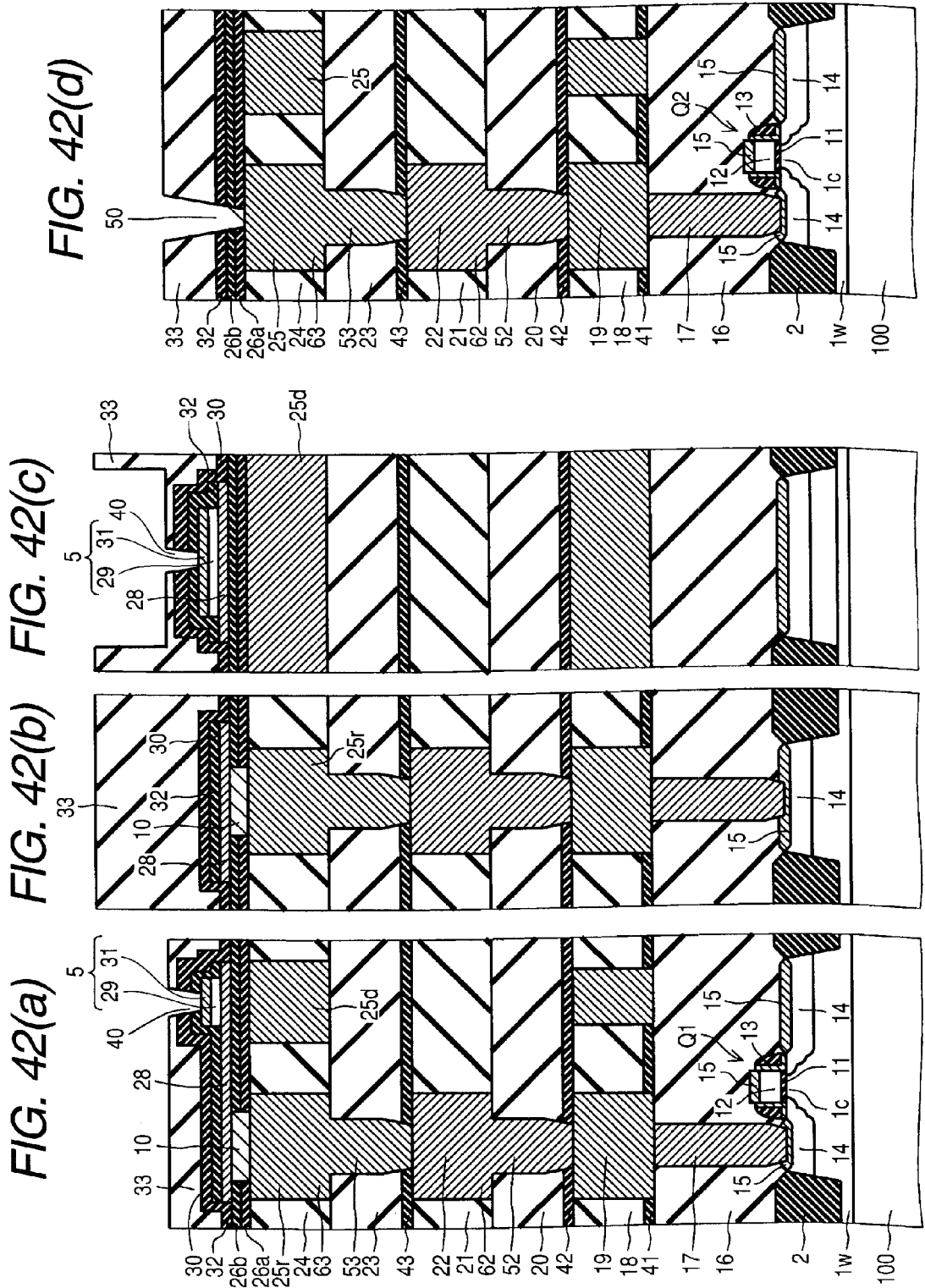

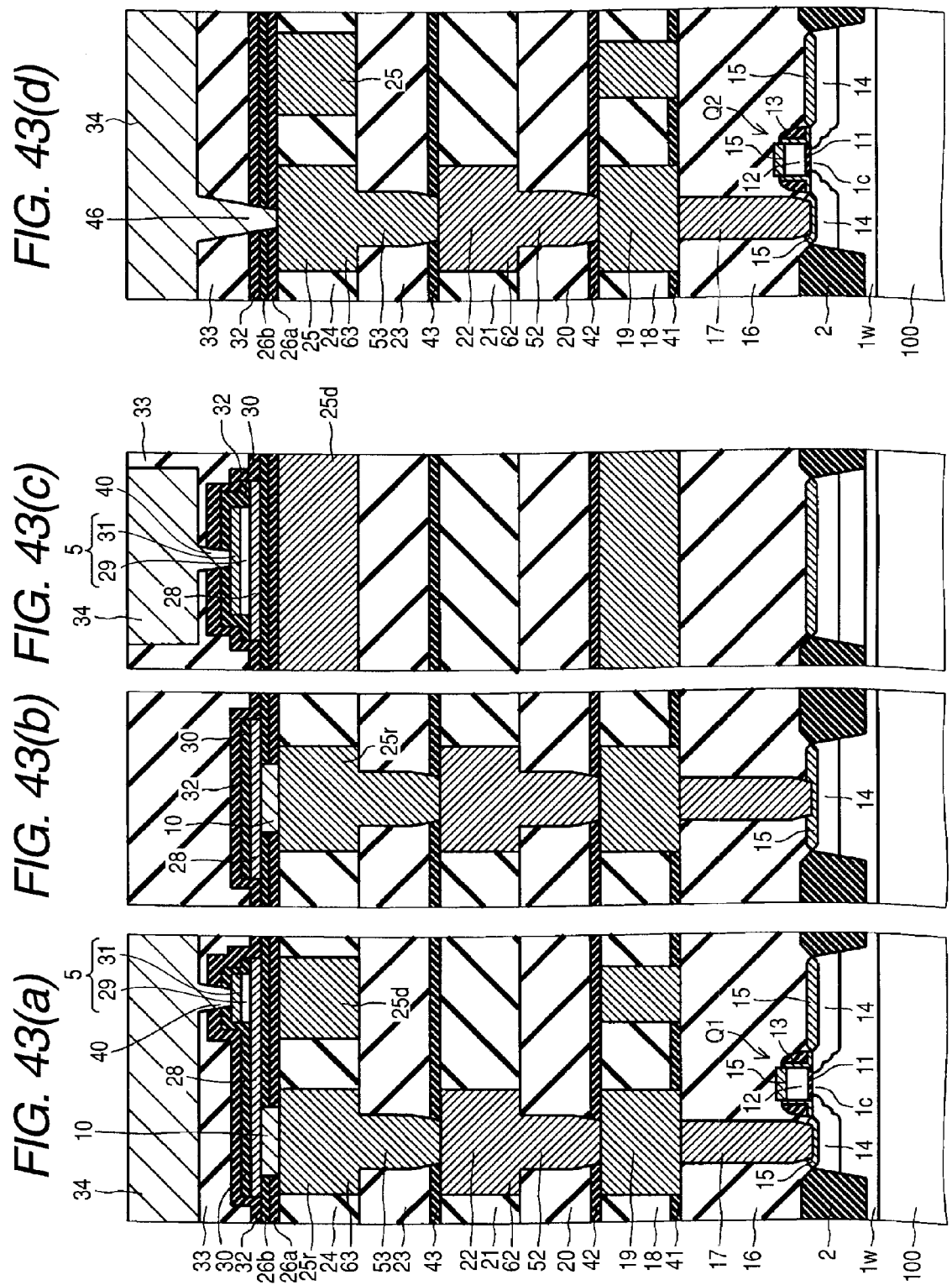

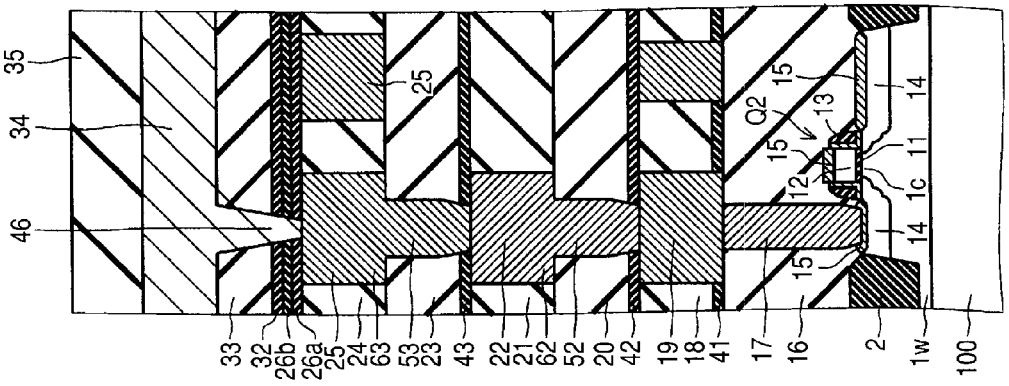
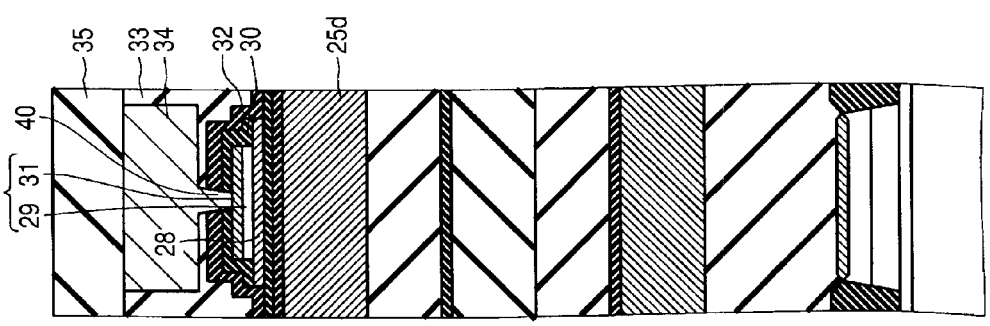
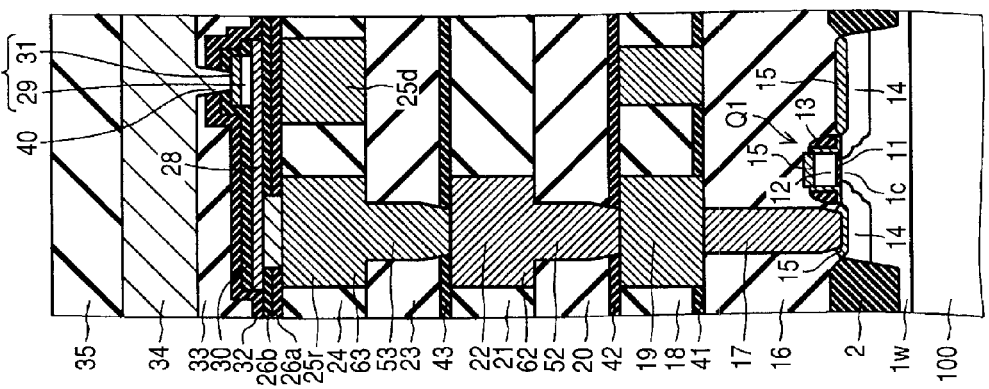
FIG. 44(a) FIG. 44(b) FIG. 44(c) FIG. 44(d)

SEMICONDUCTOR DEVICE AND METHOD OF MANUFACTURING THE SAME

CONTINUING DATA INFORMATION

This is a Divisional Application of U.S. application Ser. No. 11/593,548, filed Nov. 7, 2006 now U.S. Pat. No. 7,605,420, the content of which is hereby incorporated by reference into the present application.

FOREIGN PRIORITY DATA INFORMATION

The present application claims priority from Japanese patent application No. 2005-328845 filed on Nov. 14, 2005, and No. 2006-276259 filed on Oct. 10, 2006, the contents of which are hereby incorporated by reference into this application.

1. Field of the Invention

This invention relates to a semiconductor device which has memory devices, such as TMR (Tunneling Magneto Resistance), and its manufacturing method.

2. Description of the Background Art

MRAM is a memory which holds data by storing information in the spin which an electron has, and the circuit is formed so that the random access is possible. There is a type which uses GMR (Giant Magneto Resistance), TMR, and CMR (Colossal Magneto Resistance) as a basic physical phenomenon.

TMR is a type using the resistance change phenomenon observed in the structure which sandwiches an insulating layer with the magnetic film of two layers. In the state of the spin of the up-and-down magnetic layer which sandwiches an insulating layer, the current (namely, resistance of TMR) which flows through an upper magnetic layer—an insulating layer—a bottom magnetic layer changes. Resistance becomes small when two spin states of an up-and-down magnetic layer are parallel, and if it is antiparallel, resistance becomes large. This change in resistance can perform information storage. There is Patent Reference 1 as literature which disclosed the magnetic memory equipment which has such a TMR element, and its manufacturing method. There is also structure called a MTJ (Magnetro-Tunneling Junction) element as an element of the same structure as TMR. Hereafter, a "TMR element" includes an MTJ element not only a TMR element but widely in a present application specification.

[Patent Reference 1] Japanese Unexamined Patent Publication No. 2003-243630

SUMMARY OF THE INVENTION

However, when the lower lead-out electrode (LS (Local Strap)) of the TMR film (up-and-down magnetic layer which sandwiches an insulating layer) which forms a TMR element is processed, there was a problem that the leakage current through the magnetic layer of the upper and lower sides of a TMR film occurs, and it becomes impossible for a TMR film to secure the predetermined rate of a resistance change, and normal storage operation became impossible and memory accuracy will deteriorate by the deposition of the foreign substance by etching deposition material to the up-and-down magnetic layer of a TMR film.

This invention was made in order to solve the above-mentioned problem. It aims at obtaining the semiconductor device which has a memory cell including the TMR film with which memory accuracy does not deteriorate, and its manufacturing method.

The semiconductor device according to claim 1 concerning this invention has a memory cell which is formed over a semiconductor substrate and includes a laminated structure of a TMR film and an upper electrode formed in a portion over a lower electrode and the lower electrode; an antioxidant film which is formed covering an upper surface of the lower electrode, and a side surface of the TMR film at least, to the memory cell; and an oxide film formed over the antioxidant film.

The semiconductor device according to claim 6 concerning this invention has a memory cell which is formed over a semiconductor substrate and includes a laminated structure of a TMR film and an upper electrode which were formed in a portion over a lower electrode and the lower electrode; a read wire which separates a predetermined distance in plan view and is formed under the lower electrode from the TMR film; and a metal plug which is formed over the read wire and electrically connects the read wire and the lower electrode.

The semiconductor device according to claim 8 concerning this invention has a memory cell which is formed over a semiconductor substrate and includes a laminated structure of a TMR film and an upper electrode which were formed in a portion over a lower electrode and the lower electrode; wherein the upper electrode is a hard mask layer which was formed using the same material as the lower electrode, which has conductivity, and whose thickness is 30-100 nm.

The manufacturing method of the semiconductor device according to this invention has the steps of (a) forming a laminated structure of a TMR film and an upper electrode which were formed in a portion over a lower electrode and the lower electrode over a semiconductor substrate; (b) patterning the upper electrode and the TMR film; (c) forming a first antioxidant film covering the lower electrode, the upper electrode, and the TMR film; (d) patterning the first antioxidant film and the lower electrode after the first antioxidant film has covered the upper electrode and the TMR film; and (e) forming an oxide film in a whole surface.

The manufacturing method of the semiconductor device according to this invention has the steps of (a) forming a read wire over a semiconductor substrate; (b) forming an interlayer insulation film over the read wire; (c) forming a via hole, penetrating the interlayer insulation film over the read wire; (d) forming a metal plug, embedding the via hole; and (e) forming a laminated structure of a lower electrode, a TMR film, and an upper electrode over the interlayer insulation film comprising the via hole; wherein the lower electrode is electrically connected with the read wire via the metal plug, and further comprising a step of: (f) patterning the upper electrode and the TMR film; wherein the TMR film after patterning is formed, separating a predetermined distance in plan view from the read wire.

The manufacturing method of the semiconductor device according to this invention has the steps of (a) forming a laminated structure of a lower electrode, a TMR film, and an upper electrode over a semiconductor substrate; (b) patterning the upper electrode; and (c) patterning the TMR film using the upper electrode as a hard mask layer.

The semiconductor device according to this invention has a first interlayer insulation film formed above a semiconductor substrate; a lower layer wiring which penetrates the first interlayer insulation film and is formed selectively; and a second interlayer insulation film formed over the first interlayer insulation film including the lower layer wiring; wherein the second interlayer insulation film has a via hole where at least a part of the lower layer wiring constitutes a bottom; and further comprising a lower electrode formed at a bottom and a side surface of the via hole, and over the second interlayer insulation film; wherein the lower electrode is electrically connected with the lower layer wiring via the via hole; and further comprising a TMR element which is formed selectively over a portion over the lower electrode, and includes a laminated structure of a TMR film and an upper electrode; and an insulating film formed over the lower electrode comprising an inside of the via hole; wherein both the insulating film and the lower electrode have a side surface over the second interlayer insulation film in a uniform direction; and a side surface of the lower electrode corresponds in a uniform direction to a side surface of the insulating film, or a side surface of the lower electrode is depressed from the insulating film.

The manufacturing method of the semiconductor device according to this invention has the steps of (a) forming a first interlayer insulation film above a semiconductor substrate; (b) forming a lower layer wiring selectively, penetrating the first interlayer insulation film; (c) forming a second interlayer insulation film over the first interlayer insulation film including the lower layer wiring; and (d) forming a via hole, penetrating the second interlayer insulation film over the lower layer wiring; wherein a bottom of the via hole becomes at least a part of the lower layer wiring; and further comprising the steps of: (e) forming a lower electrode over a bottom and a side surface of the via hole, and the first interlayer insulation film; wherein the lower electrode is electrically connected with the lower layer wiring via the via hole; and further comprising the steps of; (f) forming selectively a TMR element used as a laminated structure of a TMR film and an upper electrode over the lower electrode over the second interlayer insulation film; (g) forming an insulating film over the lower electrode comprising the via hole; (h) forming a resist patterned over the insulating film; (i) etching simultaneously the lower electrode and the insulating film by using the resist as a mask, and patterns the lower electrode and the insulating film; and (j) removing the resist.

Since the upper surface of a lower electrode and the side surface of a TMR film are covered at least and the antioxidant film is formed, the semiconductor device can suppress surely that the upper surface of a lower electrode and the side surface of a TMR film oxidize, when an oxide film is formed on an antioxidant film. As a result, the memory cell which has a TMR film with which memory accuracy does not deteriorate can be obtained.

Since a read wire and a lower electrode are electrically connected via a metal plug, a semiconductor device performs the effect which can form a lower electrode with sufficient flatness and can form a memory cell with sufficient accuracy compared with the case where a read wire and a lower electrode are electrically connected directly.

An upper electrode can be used for a semiconductor device as a hard mask, and since the step which forms a hard mask separately becomes unnecessary, it can aim at simplification of a manufacturing process. Since the thickness of the upper electrode was formed by 30-100 nm comparatively thin thickness, relief of the stress applied to a TMR film at the time of formation of an upper electrode can be aimed at, and the magnetic property of a TMR film is not degraded. Since the upper electrode and the lower electrode are formed using the same material, when etching a TMR film by using an upper electrode as a hard mask layer, a lower electrode can be operated as an etching stopper.

The manufacturing method of a semiconductor device forms the first antioxidant film, covering the upper surface and the side surface of a lower electrode, and the side surface of a TMR film at least at the step (c). So, when an oxide film is formed on the first antioxidant film at a step (e), it can suppress surely that the upper surface and the side surface of a lower electrode, and the side surface of a TMR film oxidize. As a result, the memory cell which has a TMR film with which memory accuracy does not deteriorate can be obtained.

Since the via hole is embedded by the metal plug at the step (d) in the manufacturing method of a semiconductor device, the effect which can form a lower electrode with flatness sufficient on an interlayer insulation film, without being influenced by a via hole, and can form a memory cell with sufficient accuracy is performed.

In a step (c), since the step which forms a hard mask separately by using an upper electrode as a hard mask layer becomes unnecessary, the manufacturing method of a semiconductor device can aim at simplification of a manufacturing process. Since the thickness of the upper electrode was formed by 30-100 nm comparatively thin thickness, relief of the stress applied to a TMR film at the time of formation of an upper electrode can be aimed at, and the magnetic property of a TMR film is not degraded. Since the upper electrode and the lower electrode are formed using the same material, when etching a TMR film by using an upper electrode as a hard mask layer, a lower electrode can be operated as an etching stopper.

As for the semiconductor device in this invention, the insulating film is formed on the lower electrode in a via hole. So, since the lower electrode in a via hole is protected by the insulating film by processing a lower electrode simultaneously with processing of an insulating film, in the manufacturing process after lower electrode processing, the damage to the lower layer wiring under a via hole can be avoided, and improvement in the yield can be aimed at.

Since the side surface of a lower electrode corresponds in a uniform direction to the side surface of an insulating film or becomes depressed from the insulating film, even if it processes an insulating film and a lower electrode simultaneously, it does not have a bad influence on the working shape of a lower electrode.

In a step (i), the manufacturing method of the semiconductor device in this invention etched simultaneously the lower electrode and the insulating film by having used resist as the mask, and has patterned the lower electrode and the insulating film. Therefore, since the lower electrode in a via hole is protected by the insulating film after the step (i) execution, in a step (j) running phase, the damage to the lower layer wiring under a via hole can be avoided, and improvement in the yield of the completed semiconductor device can be aimed at.

BRIEF DESCRIPTION OF THE DRAWINGS

FIG. 3 is a cross-sectional view showing the section structure in all the layers of MRAM of Embodiment 1;

FIGS. 4A to 26D are cross-sectional views showing the manufacturing method of MRAM of Embodiment 1;

FIGS. 30A to 44D are cross-sectional views showing the manufacturing method of MRAM of Embodiment 2;

DETAILED DESCRIPTION OF THE PREFERRED EMBODIMENTS

Embodiment 1

(Structure)

Figure 1:
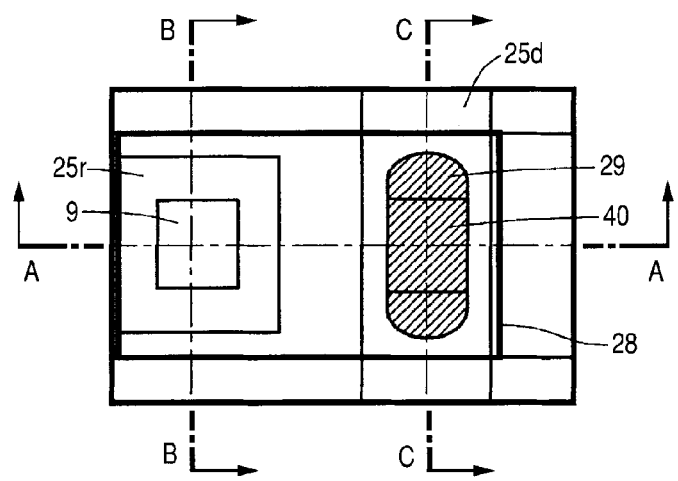
FIG. 1 is a plan view showing the planar structure of the memory cell part of MRAM which is a semiconductor device of Embodiment 1 of this invention.
Figure 2:
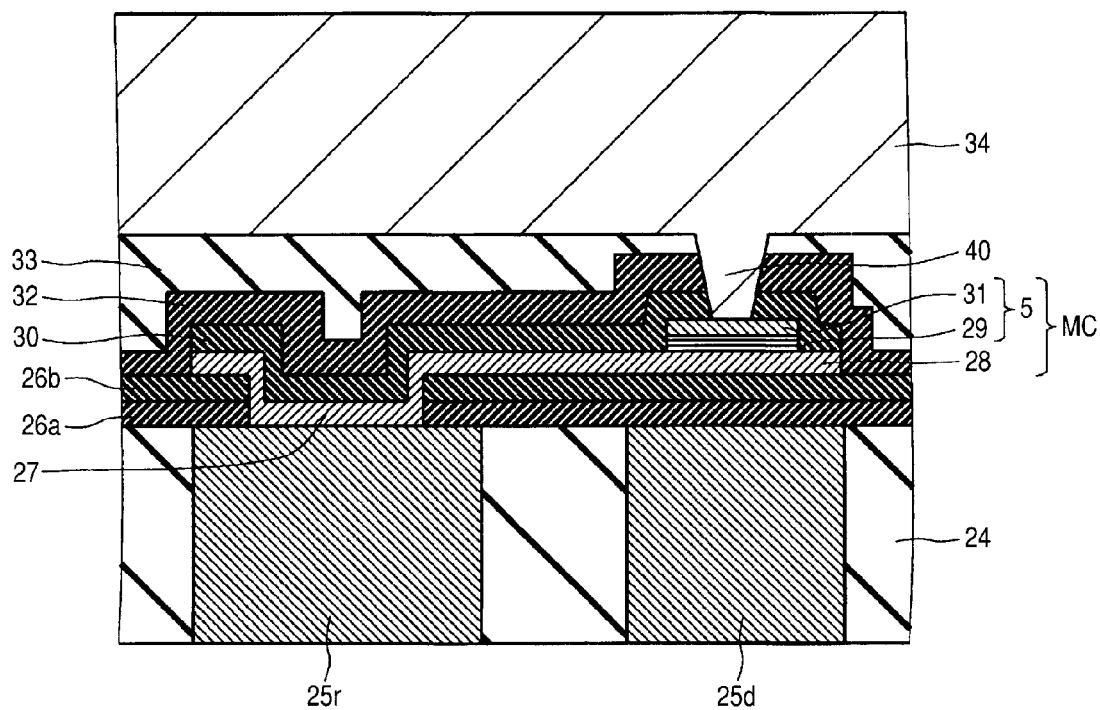
FIG. 2 is a cross-sectional view showing the A-A section of FIG. 1.

FIG. 1 is a plan view showing the planar structure of the memory cell part of MRAM which is a semiconductor device of this embodiment of the invention 1, and FIG. 2 is a cross-sectional view showing the A-A section of FIG. 1.

As shown in FIG. 1, TMR film 29 is assuming the lengthwise form in which four angles were rounded in plan view. As shown in FIG. 2, TMR lower electrode 28 is formed under TMR film 29, and TMR upper electrode 31 is formed on TMR film 29. Memory cell MC includes these TMR lower electrodes 28, TMR films 29, and TMR upper electrodes 31. For convenience of explanation, TMR film 29 and TMR upper electrode 31 may be combined in this specification, and it may be expressed as TMR element 5. TMR film 29 includes the laminated structure of a ferromagnetic layer, a nonmagnetic layer, and a ferromagnetic layer from the upper part, for example. A ferromagnetic layer includes the magnetic film which includes NiFe, CoFeB, and CoFe, for example, and a nonmagnetic layer includes, for example an alumina film or magnesium oxide.

FIGS. 3A, 3B and 3C are cross-sectional views showing the section structure in all the layers of MRAM of Embodiment 1. FIG. 3A is equivalent to the A-A section of FIG. 1, FIG. 3B is equivalent to the B-B section of FIG. 1, and FIG. 3C is equivalent to the C-C section of FIG. 1. Hereafter, the structure of MRAM of Embodiment 1 is explained with reference to FIG. 1-FIG. 3C.

Element isolation region 2 is selectively formed in the upper layer portion of semiconductor substrate 100, and well region 1w between element isolation regions 2 and 2 functions as a transistor formation area. In the above-mentioned transistor formation area, source/drain regions 14 and 14 of a pair are formed across channel region 1c, gate insulating film 11 and gate electrode 12 are laminated on channel region 1c, and sidewall 13 of 2 layer structure is formed in the side surface of gate electrode 12. Cobalt silicide region 15 is formed on source/drain region 14 and gate electrode 12, respectively.

MOS transistor Q1 for selection at the time of read-out is formed by these channel region 1c, gate insulating films 11, gate electrodes 12, sidewalls 13, and source/drain regions 14.

Whole semiconductor substrate 100 upper part surface including MOS transistor Q1 is covered, and interlayer insulation film 16 which includes an oxide film of $SiO_2$ etc. is formed. Interlayer insulation film 16 is penetrated, contact plug 17 is formed, and it electrically connects with one cobalt silicide region 15 of source/drain regions 14 and 14 of a pair.

On interlayer insulation film 16, nitride film 41, and interlayer insulation film 18 which includes an oxide film are laminated, Cu wiring 19 is formed selectively penetrating nitride film 41 and interlayer insulation film 18, and Cu wiring 19 of 1 is electrically connected with contact plug 17.

On interlayer insulation film 18 including Cu wiring 19, nitride film 42, and interlayer insulation film 20 and 21 which includes an oxide film are laminated. Micropore 52 formed by penetrating nitride film 42 and interlayer insulation film 20 and wiring hole 62 formed by penetrating interlayer insulation film 21 are formed, and Cu wiring 22 is formed embedding in micropore 52 and wiring hole 62. Cu wiring 22 is electrically connected with Cu wiring 19 (Cu wiring 19 of above 1 electrically connected with contact plug 17).

On interlayer insulation film 21 including Cu wiring 22, nitride film 43, and interlayer insulation film 23 and 24 which includes an oxide film are laminated. Micropore 53 is formed penetrating nitride film 43 and interlayer insulation film 23, wiring hole 63 is formed penetrating interlayer insulation film 24, and Cu wiring 25 (read wire 25r, digit line 25d) is formed embedding in micropore 53 and wiring hole 63. Read wire 25r is electrically connected with Cu wiring 22 (Cu wiring 22 located on contact plug 17).

Interlayer insulation film 26a which includes a nitride film, and interlayer insulation film 26b which includes an oxide film are laminated on interlayer insulation film 24 including Cu wiring 25. Via hole 9 is formed in interlayer insulation films 26a and 26b which correspond to a part of formation area of read wire 25r in plan view. By forming TMR lower electrode 28 selectively on interlayer insulation film 26b, and the bottom and the side surface of via hole 9, TMR lower electrode 28 is electrically connected with read wire 25r. Since TMR lower electrode 28 includes tantalum (Ta) with a near lattice spacing of a crystal lattice with TMR film 29, it can reduce distortion generated on TMR film 29. TMR lower electrode 28 may be called the lead-out wiring (LS (Local Strap)) which electrically connects read wire 25r and TMR film 29.

TMR element 5 (TMR film 29, TMR upper electrode 31) is selectively formed in the region which corresponds in plan view on TMR lower electrode 28 in a part of formation area of 25d of digit lines. TMR upper electrode 31 is formed by the thickness of 30-100 nm of tantalum (Ta), and functions also as a hard mask at the time of a manufacturing process.

And interlayer insulation film 30 including LT (Low Temperature)-SiN on the whole surface of TMR element 5 and the upper surface of TMR lower electrode 28 is formed. Interlayer insulation film 32 which covers the whole surface comprising the side surface of TMR lower electrode 28, and includes LT-SiN is formed. Interlayer insulation film 33 which covers the whole surface and includes $SiO_2$ is formed.

Cu wiring 34 used as a bit line is selectively formed in the upper layer portion of interlayer insulation film 33. In the part of the region in which TMR element 5 is formed in plan view, interlayer insulation film 30, interlayer insulation film 32, and interlayer insulation film 33 are penetrated, and via hole 40 is formed, By embedding Cu wiring 34 also in this via hole 40, Cu wiring 34 and TMR upper electrode 31 are electrically connected. And passivation film 35 film is formed on the whole surface on interlayer insulation film 33 including Cu wiring 34.

MRAM of Embodiment 1 is assuming the above structures and has the first and second feature shown below.

The first feature is that it has covered all of the upper surface and the side surface of TMR lower electrode 28, and the side surface of TMR element 5 with interlayer insulation film 32 in addition to interlayer insulation film 30 formed from LT-SiN.

Although interlayer insulation films 30 and 32 which include LT-SiN function as an antioxidant film at the time of depositing interlayer insulation film 33 which includes $SiO_2$, in the case of only interlayer insulation film 30, when the side surface of TMR film 29 becomes thin, it is sometimes difficult to function sufficiently as an antioxidant film. However, in Embodiment 1, sufficient antioxidant function can be exhibited by protecting TMR film 29 with interlayer insulation film 30 and 32 of two layers. Since the upper surface and the side surface of TMR lower electrode 28 are covered and interlayer insulation film 30 and 32 is formed, sufficient antioxidant function can be exhibited also to TMR lower electrode 28.

In addition, since interlayer insulation film 30 has covered all the side surfaces of TMR element 5 at the time of processing of TMR lower electrode 28, by protecting surely the side surface of memory cell MC, especially TMR film 29, it can prevent the foreign substance by etching deposition material adhering, and leakage current occurring.

Since LT-SiN is formed at comparatively low temperature of less than 300° C., the magnetic property of TMR film 29 is not degraded at the time of manufacture of interlayer insulation film 30 and 32.

The second feature is the point which made it possible to use as a hard mask at the time of a manufacturing process by using Ta of the thickness of 30-100 nm as TMR upper electrode 31.

According to this second feature, TMR upper electrode 31 can be used as a hard mask, the step which forms a hard mask separately becomes unnecessary, and simplification of a manufacturing process can be aimed at. Since the thickness of TMR upper electrode 31 was formed by the thickness of comparatively thin 30-100 nm, relief of the stress applied to TMR film 29 at the time of formation of TMR upper electrode 31 can be aimed at, and the magnetic property of TMR film 29 is not degraded.

By both forming TMR lower electrode 28 and TMR upper electrode 31 with the same material (Ta), when processing TMR film 29 by using TMR upper electrode 31 as a mask, TMR lower electrode 28 functions as a stopper, and the effect that TMR film 29 can be formed with sufficient patterning accuracy is acquired.

(Manufacturing Method)

FIG. 4A-FIG. 26D are the cross-sectional views showing the manufacturing method of MRAM of Embodiment 1. In these drawings, "A" is equivalent to the A-A section of FIG. 1, "B" is equivalent to the B-B section of FIG. 1, and "C" is equivalent to the C-C section of FIG. 1. "D" in FIG. 12A-FIG. 26D shows the section of the peripheral circuit part. Hereafter, the manufacturing method of MRAM of Embodiment 1 is explained with reference to these drawings.

First, as shown in FIGS. 4A to 4C, element isolation region 2 is selectively formed in the upper layer portion of semiconductor substrate 100. The upper layer portion of semiconductor substrate 100 between element isolation regions 2 and 2 becomes active region 1 in which a transistor etc. is formed.

Figure 5A:
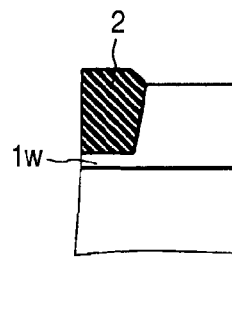
Figure 5B:
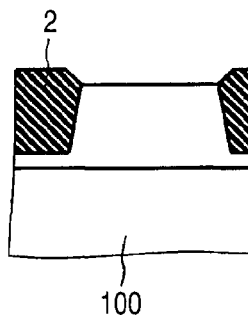
Figure 5C:
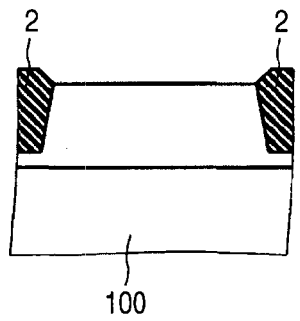

And as shown in FIGS. 5A to 5C, well region 1w is formed in the upper layer portion of semiconductor substrate 100 by introducing the impurity of the first conductivity type.

Figure 6A:
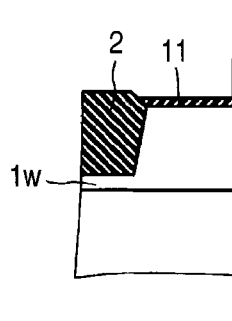
Figure 6B:
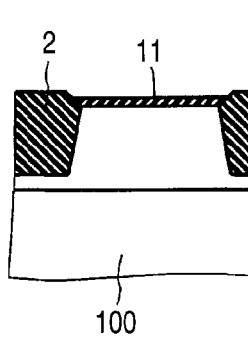
Figure 6C:
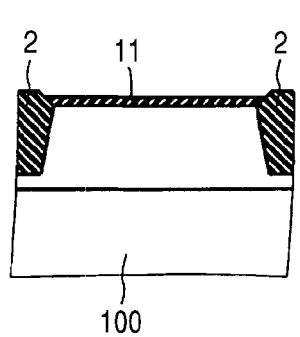

Next, as shown in FIGS. 6A to 6C, gate insulating film 11 is formed on well region 1w, and gate electrode 12 is selectively formed on gate insulating film 11. The front surface of well region 1w under gate electrode 12 is specified as channel region 1c.

Figure 7A:
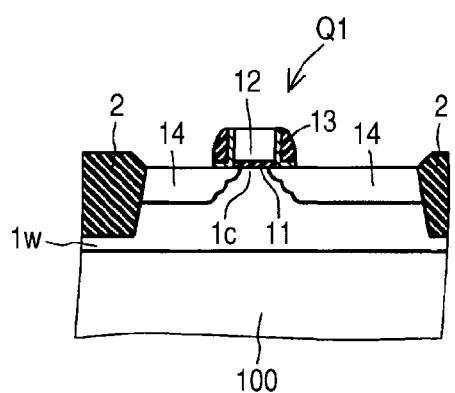
Figure 7B:
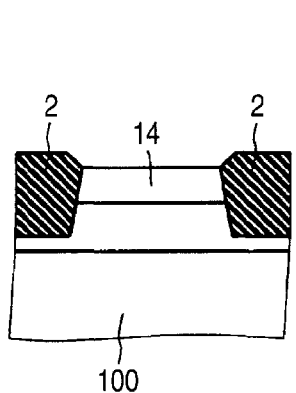
Figure 7C:
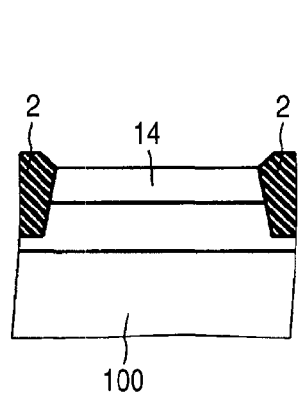

Then, as shown in FIGS. 7A to 7C, the impurity of the second conductivity type (conductivity type opposite to the first conductivity type) is implanted and diffused in self align to gate electrode 12, and after forming sidewall 13 of 2 layer structure in the side surface of gate electrode 12, the impurity of the second conductivity type is implanted and diffused in self align to gate electrode 12 and sidewall 13. This forms source/drain regions 14 and 14 of the pair which has an extension region near the channel region 1c. As a result, MOS transistor Q1 which includes channel region 1c, gate insulating film 11, gate electrode 12, and source/drain region 14 is formed.

Next, as shown in FIGS. 8A to 8C, cobalt silicide region 15 is formed, respectively on source/drain regions 14 and 14 and the front surface of gate electrode 12.

Then, as shown in FIGS. 9A to 9C, interlayer insulation film 16 is formed in the whole surface, interlayer insulation film 16 is penetrated and contact plug 17 is formed selectively. This contact plug 17 is electrically connected with one cobalt silicide region 15 of the source/drain regions 14 and 14 of a pair.

As shown in FIG. 10, nitride film 41 and (it is an oxide film) interlayer insulation film 18 are laminated on the whole surface, nitride film 41 and interlayer insulation film 18 are penetrated on it, and Cu wiring 19 is selectively formed in it. As a result, a part of Cu wiring 19 is electrically connected with contact plug 17. Thus, Cu wiring 19 which is a first layer metal wiring is formed.

Figures 11A, 11B, 11C:
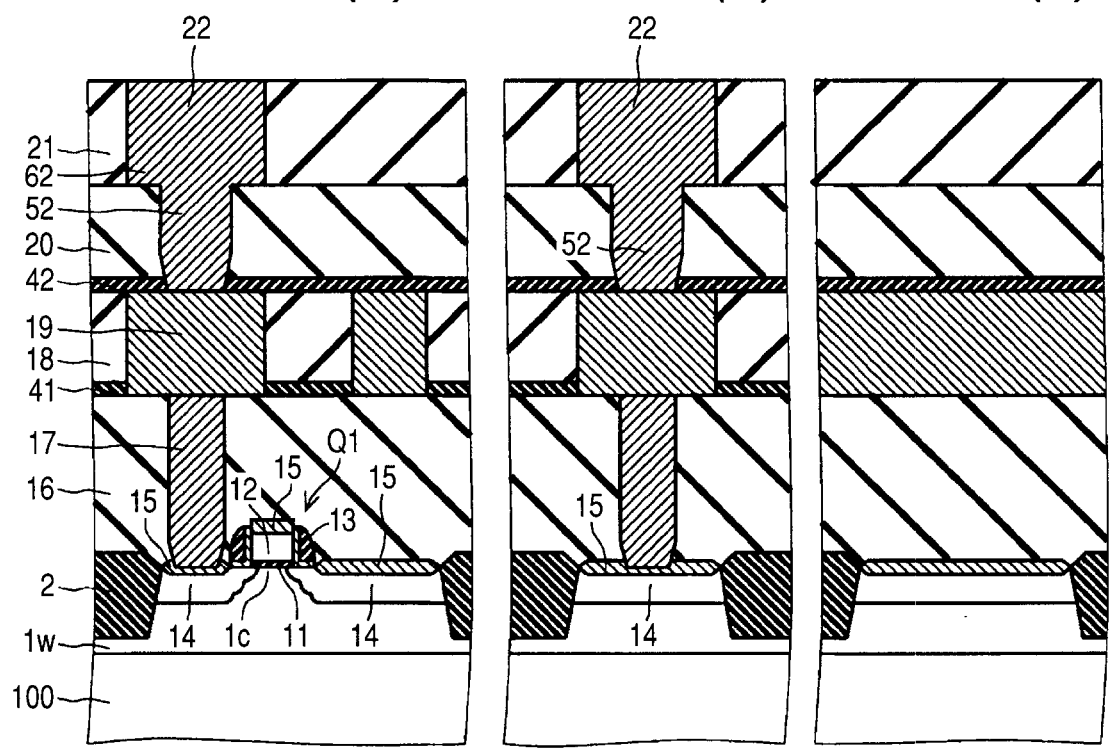

Then, as shown in FIGS. 11A to 11C, nitride film 42, and interlayer insulation films 20 and 21 (it is an oxide film) are laminated by the whole surface, nitride film 42 and interlayer insulation film 20 are penetrated on it, and micropore 52 is selectively formed in it. Interlayer insulation film 21 on a region including micropore 52 is penetrated, wiring hole 62 is formed selectively, after that, micropore 52 and wiring hole 62 are embedded, and Cu wiring 22 is formed. Cu wiring 22 is electrically connected with Cu wiring 19 (Cu wiring 19 electrically connected with contact plug 17). Thus, Cu wiring 22 which is a second layer metal wiring is formed using damascene technology.

Then, as shown in FIGS. 12A to 12D, nitride film 43 and interlayer insulation films (it includes an oxide film) 23 and 24 are formed, nitride film 43 and interlayer insulation film 23 are penetrated on the whole surface, and micropore 53 is selectively formed in it. Interlayer insulation film 24 on a region including micropore 53 is penetrated, and wiring hole 63 is formed selectively. Then, micropore 53 and wiring hole 63 are embedded, and Cu wiring 25 (read wire 25r, digit line 25d) is formed. And read wire 25r is electrically connected with Cu wiring 22. Thus, Cu wiring 25 which is a third layer metal wiring is formed using damascene technology.

As shown in FIG. 12D, also in a peripheral region, MOS transistor Q2 equivalent to MOS transistor Q1 is formed on semiconductor substrate 100, Cu wiring 19, Cu wiring 22, and Cu wiring 25 are formed in each first-third layer metal wiring.

Then, as shown in FIGS. 13A to 13D, interlayer insulation films 26a and 26b are formed in the whole surface, the portion on the region of read wire 25r in a memory cell part is penetrated, and via hole 9 is formed selectively.

And as shown in FIGS. 14A to 14D, the layer which should constitute TMR lower electrode 28, TMR film 29, and TMR upper electrode 31 is laminated on the whole surface. On this occasion, TMR lower electrode 28 is electrically connected with read wire 25r by forming TMR lower electrode 28 in the bottom and the side surface of via hole 9.

On this occasion, by forming the thickness of TMR upper electrode 31 by 30-100 nm comparatively thin thickness, relief of the stress applied to TMR film 29 at the time of formation of TMR upper electrode 31 can be aimed at, and the magnetic property of TMR film 29 is not degraded. TMR lower electrode 28 and TMR upper electrode 31 make Ta construction material, as mentioned above, for example, they are formed of a sputtering technique.

Then, as shown in FIGS. 15A to 15D, after patterning TMR upper electrode 31 using the patterned resist which is not illustrated, it etches to TMR film 29 by making patterned TMR upper electrode 31 into a hard mask, and TMR element 5 is completed TMR lower electrode 28 including the same Ta as TMR upper electrode 31 functions as an etching stopper in the case of etching.

Thus, since the step which forms a hard mask separately becomes unnecessary by using TMR upper electrode 31 as a hard mask, simplification of a manufacturing process can be aimed at.

There is also no degradation of the magnetic film by ashing and the cleaning treatment for resist removal of TMR film 29 without the deposition material of the organic substance system which worsens an element characteristic adhering to the side wall of TMR film 29 like at the time of etching with a resist mask.

Next, as shown in FIGS. 16A to 16D, interlayer insulation film 30 which includes LT-SiN is formed in the whole surface by the low temperature condition less than 300° C., and as shown in FIGS. 17A to 17D, resist 45 patterned so that only the formation area of a memory cell might be covered is formed.

And as shown in FIGS. 18A to 18D, by etching TMR lower electrode 28 and interlayer insulation film 30 by using patterned resist 45 as a mask, TMR lower electrode 28 is patterned, and as shown in FIGS. 19A to 19D, resist 45 is removed. Here, after etching interlayer insulation film 30 by using patterned resist 45 as a mask and removing resist 45, TMR lower electrode 28 may be patterned by making interlayer insulation film 30 into a hard mask. Hereby, TMR lower electrode 28 can be patterned still with high precision.

Next, as shown in FIGS. 20A to 20D, interlayer insulation film 32 which includes LT-SiN is formed in the whole surface by the low temperature condition less than 300° C. As a result, the side surface region of TMR film 29 and TMR lower electrode 28 are covered with interlayer insulation films 30 and 32.

Next, as shown in FIGS. 21A to 21D, interlayer insulation film 33 which includes $SiO_2$ is formed in the whole surface. On this occasion, since the side surface region of TMR film 29 is covered with interlayer insulation films 30 and 32, an antioxidant function can fully be exhibited at the time of formation of interlayer insulation film 33. Therefore, TMR film 29 is not damaged at the time of formation of interlayer insulation film 33. Since the upper surface and the side surface of TMR lower electrode 28 are covered and interlayer insulation films 30 and 32 are formed, sufficient antioxidant function can be exhibited also to TMR lower electrode 28.

Since LT-SiN which is a forming material of interlayer insulation films 30 and 32 is formed by low temperature condition of comparatively below 300° C., the magnetic property of TMR film 29 is not degraded.

Then, as shown in FIGS. 22A to 22D, flattening of the interlayer insulation film 33 is done by performing CMP treatment to interlayer insulation film 33.

Then, as shown in FIGS. 23A to 23D, via hole 39 which penetrates interlayer insulation film 33 is formed at the upper part of TMR element 5. As shown in FIG. 23D, via hole 49 is formed in the upper layer of a part of Cu wiring 25 in a peripheral region.

And as shown in FIGS. 24A to 24D, etching removal of the interlayer insulation film 33 is selectively done to bit line formation. On this occasion, etching removal also of the interlayer insulation films 30 and 32 under via hole 39 is done, and via hole 40 is formed. Etching removal of the interlayer insulation films 30 and 32 under via hole 49 is done, and via hole 50 is formed.

Next, as shown in FIGS. 25A to 25D, a bit line is formed by embedding Cu wiring 34 to the region which did etching removal of the interlayer insulation film 33 comprising via holes 40 and 50. As a result, in a memory circuit region, Cu wiring 34 is electrically connected with TMR element 5 (TMR upper electrode 31) via via hole 40, and Cu wiring 34 is electrically connected with Cu wiring 25 in a peripheral circuit area. Thus, Cu wiring 34 which is a fourth layer metal wiring is formed.

Finally, as shown in FIGS. 26A to 26D, MRAM (a peripheral circuit is included) of Embodiment 1 is completed by forming passivation film 35 in the whole surface.

Although the example which forms memory cell circuits (memory cell MC, a bit line (Cu wiring 34), etc.) in a third layer and a fourth layer metal wiring was shown in Embodiment 1, it may be made to form a memory cell circuit in a part for a first layer and a second layer metal wiring part. It may form from five or more layers.

Embodiment 2

(Structure)

Figure 27:
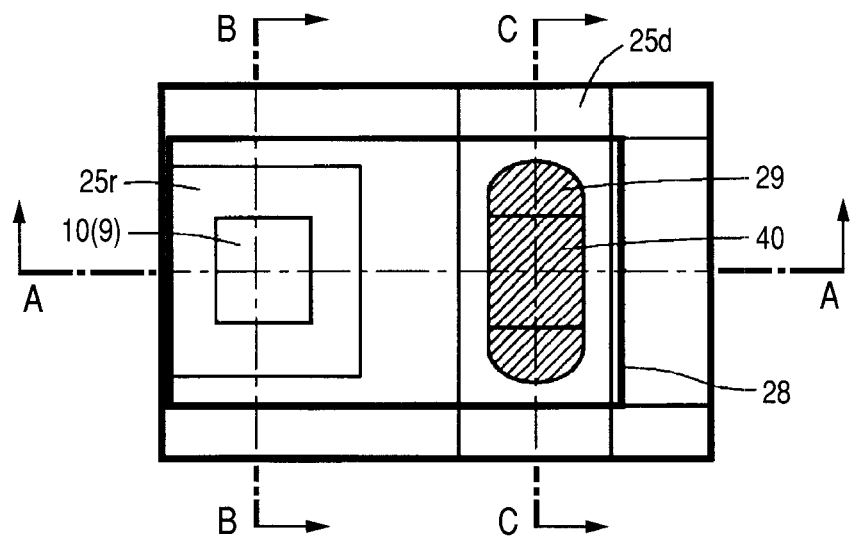
FIG. 27 is a plan view showing the planar structure of the memory cell part of MRAM which is a semiconductor device of Embodiment 2 of this invention.
Figure 28:
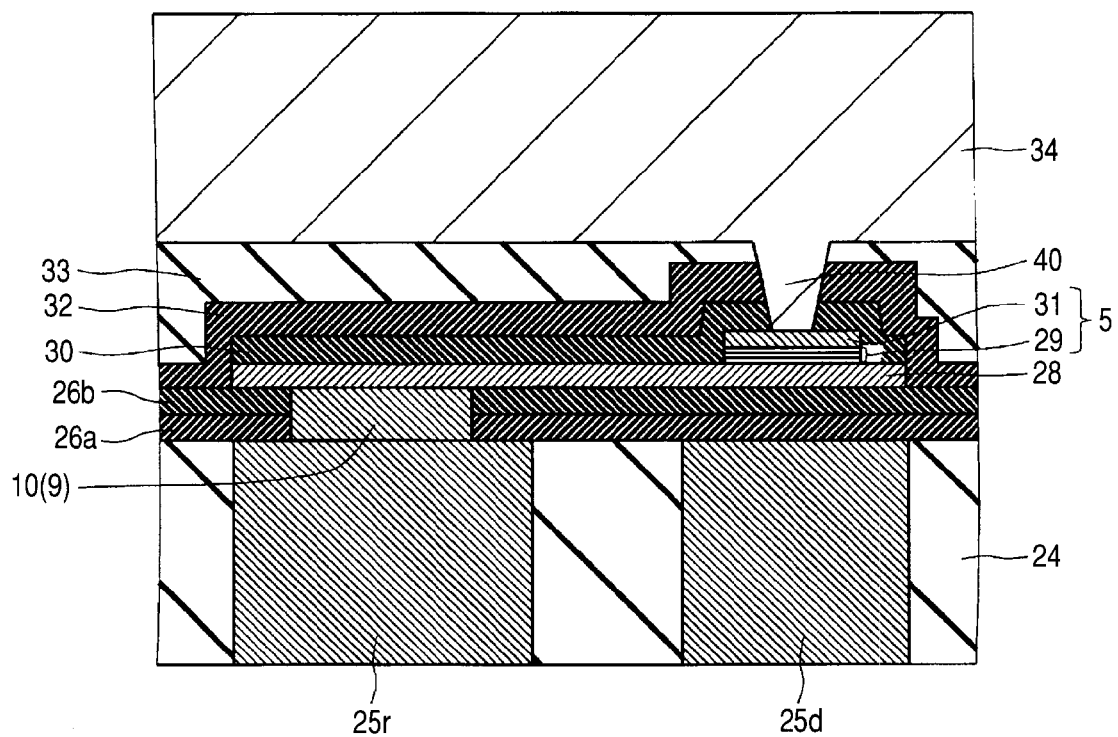
FIG. 28 is a cross-sectional view showing the A-A section of FIG. 27.

FIG. 27 is a plan view showing the planar structure of the memory cell part of MRAM which is a semiconductor device of Embodiment 2 of this invention, and FIG. 28 is a cross-sectional view showing the A-A section of FIG. 27.

Figures 29A, 29B, 29C:
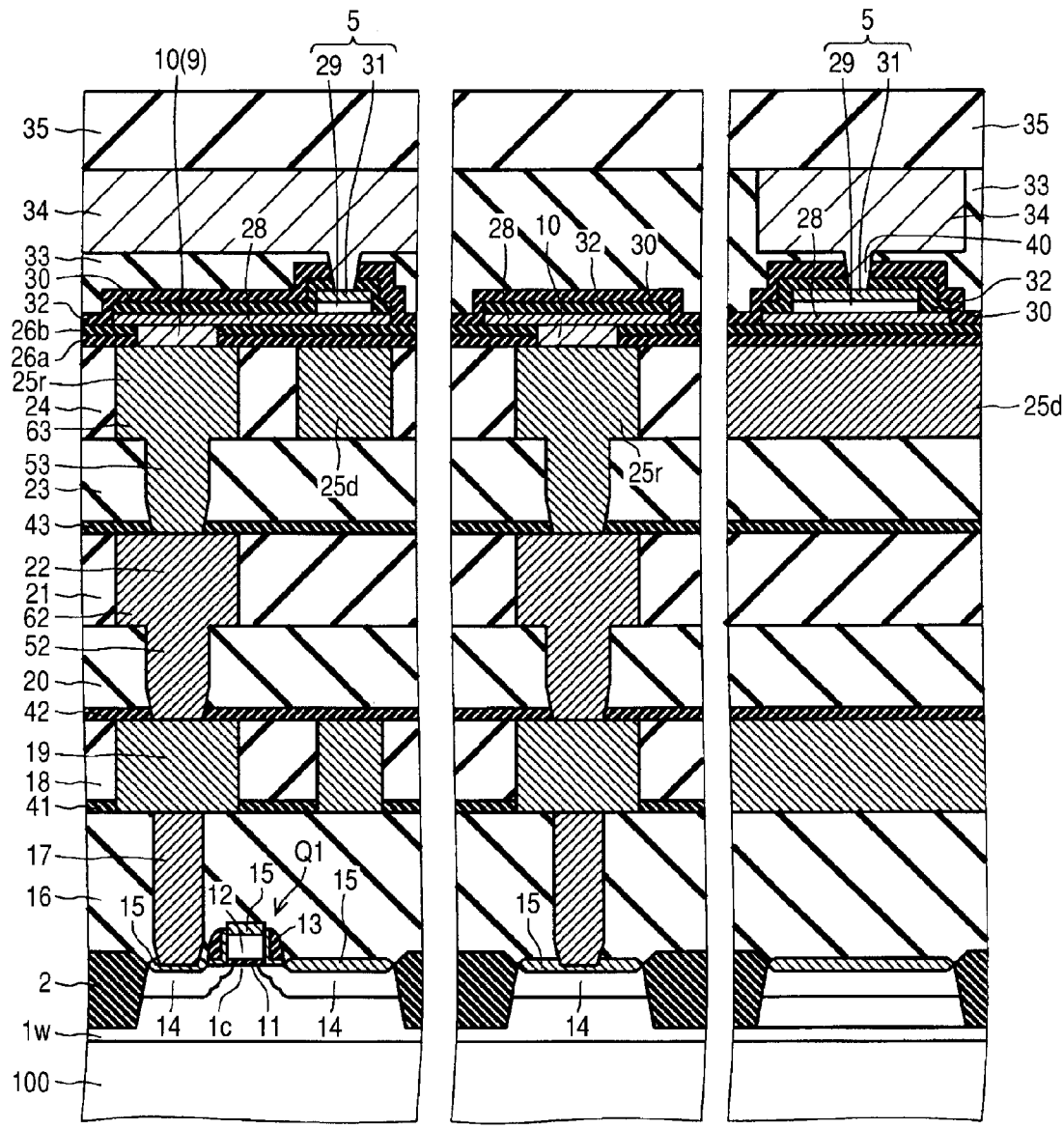
FIG. 29 is a cross-sectional view showing the section structure in all the layers of MRAM of Embodiment 2.

FIGS. 29A to 29C are cross-sectional views showing the section structure in all the layers of MRAM of Embodiment 2, FIG. 29A is equivalent to the A-A section of FIG. 27, FIG. 29B is equivalent to the B-B section of FIG. 27, and FIG. 29C is equivalent to the C-C section of FIG. 27. Hereafter, the structure of MRAM of Embodiment 2 is explained with reference to FIG. 27-FIG. 29C. Since the structure from semiconductor substrate 100 to Cu wiring 25 which is a third layer metal wiring, and the structure from interlayer insulation film 33 to passivation film 35 are the same as that of MRAM of Embodiment 1 shown by FIG. 1-FIG. 3C, explanation is omitted.

On interlayer insulation film 24 including Cu wiring 25, interlayer insulation films 26a and 26b are laminated, via hole 9 is formed in interlayer insulation films 26a and 26b which correspond to a part of formation area of read wire 25r in plan view, this via hole 9 is filled up, and Cu plug 10 is formed.

TMR lower electrode 28 is selectively formed on interlayer insulation film 26b including Cu plug 10. Therefore, TMR lower electrode 28 is electrically connected with read wire 25r via Cu plug 10. TMR lower electrode 28 includes tantalum (Ta) in order to take the consistency of a crystal lattice with TMR film 29. TMR lower electrode 28 may be called the lead-out wiring (LS (Local Strap)) which electrically connects read wire 25r and TMR film 29.

TMR element 5 (TMR film 29, TMR upper electrode 31) is selectively formed in plan view on TMR lower electrode 28 to the region corresponding to a part of formation area of digit line 25d. TMR upper electrode 31 is formed by 30-100 nm thickness of tantalum (Ta), and functions also as a hard mask at the time of a manufacturing process.

And interlayer insulation film 30 formed from LT-SiN is formed on the whole surface of TMR element 5, and the upper surface of TMR lower electrode 28. The whole surface comprising a side surface of TMR lower electrode 28 is covered, and interlayer insulation film 32 which includes LT-SiN is formed. Interlayer insulation film 33 which covers the whole surface and includes $SiO_2$ is formed.

MRAM of Embodiment 2 is assuming the above structures, has the first and second feature mentioned above like Embodiment 1, and performs the same effect as Embodiment 1.

MRAM of Embodiment 2 has the following third features. Cu plug 10 is embedded and formed in via hole 9, and the third feature is the point of aiming at electric connection between TMR lower electrode 28 and read wire 25r by this Cu plug 10.

Since via hole 9 is embedded by Cu plug 10 by having the third feature, the effect that TMR lower electrode 28 can be formed with sufficient flatness, without being influenced by via hole 9, and memory cell MC can be formed with sufficient accuracy is performed.

Hereafter, the above-mentioned effect is explained as compared with the structure of Embodiment 1. Since TMR lower electrode 28 is formed also in via hole 9 in the case of Embodiment 1, as the distance between the formation positions of via hole 9 and TMR element 5 becoming near, the flatness of TMR lower electrode 28 worsens under the influence of via hole 9.

On the other hand, with the structure of Embodiment 2, since Cu plug 10 is embedded in via hole 9 and TMR lower electrode 28 is not formed in via hole 9, regardless of the distance of via hole 9 and TMR element 5, TMR lower electrode 28 can be formed with sufficient flatness. That is, the structure of Embodiment 2 is more suitable for microfabrication.

Other structures which form TMR element 5 in right above Cu plug 10 (i.e., the upper part of read wire 25r) are considered as a structure near the structure of Embodiment 2. As opposed to TMR lower electrode 28 being formed on Cu plug 10 with other structure described above, with the structure of Embodiment 2, TMR lower electrode 28 is formed on interlayer insulation film 26b, and the structure of Embodiment 2 can form TMR lower electrode 28 with sufficient flatness. Since the distance of digit line 25d and TMR element 5 becomes far inevitably on the relation to which read wire 25r is located directly under TMR element 5 in the case of other structure described above, there is also a minus surface which a write-in defect tends to generate.

(Manufacturing Method)

FIG. 30A-FIG. 44D are the cross-sectional views showing the manufacturing method of MRAM of Embodiment 2. In these drawings, "A" shows the A-A section of FIG. 27, "B" shows the B-B section of FIG. 27, "C" shows the C-C section of FIG. 27, and "D" shows the section of the peripheral circuit part. Hereafter, the manufacturing method of MRAM of Embodiment 2 is explained with reference to these drawings.

After passing through the step shown by the FIG. 4A-FIG. 12D of Embodiment 1, as shown in FIG. 30, interlayer insulation films 26a and 26b are formed in the whole surface, the portion on the region of read wire 25r in a memory cell part is penetrated, and via hole 9 is formed selectively.

Then, as shown in FIGS. 31A to 31D, via hole 9 is filled using damascene technology, and Cu plug 10 is formed.

And as shown in FIGS. 32A to 32D, the layer which should constitute TMR lower electrode 28, TMR film 29, and TMR upper electrode 31 is laminated on the whole surface. On this occasion, TMR lower electrode 28 is electrically connected with read wire 25r via Cu plug 10. By forming the thickness of TMR upper electrode 31 by 30-100 nm comparatively thin thickness, relief of the stress which takes for TMR film 29 at the time of formation of TMR upper electrode 31 can be aimed at, and the magnetic property of TMR film 29 is not degraded. TMR lower electrode 28 and TMR upper electrode 31 make Ta construction material, as mentioned above, for example, they are formed of a sputtering technique.

Since TMR lower electrode 28 is not formed in via hole 9 as mentioned above, TMR lower electrode 28 can be formed with flatness sufficient on interlayer insulation film 26b and Cu plug 10.

Then, as shown in FIGS. 33A to 33D, after patterning TMR upper electrode 31, it etches to TMR film 29 by making patterned TMR upper electrode 31 into a hard mask, and TMR element 5 is completed. TMR lower electrode 28 formed by the same Ta as TMR upper electrode 31 functions as an etching stopper in the case of etching.

Thus, by using TMR upper electrode 31 as a hard mask, the step which forms a hard mask separately becomes unnecessary, and simplification of a manufacturing process can be aimed at.

There is also no degradation of the magnetic film by ashing and the cleaning treatment for resist removal of TMR film 29 without the deposition material of the organic substance system which worsens an element characteristic adhering to the side wall of TMR film 29 like at the time of etching with a resist mask.

Next, as shown in FIGS. 34A to 34D, interlayer insulation film 30 which includes LT-SiN is formed in the whole surface, and as shown in FIGS. 35A to 35D, resist 45 patterned so that only the formation area of memory cell MC might be covered is formed.

And as shown in FIGS. 36A to 36D, by etching TMR lower electrode 28 and interlayer insulation film 30 by using patterned resist 45 as a mask, TMR lower electrode 28 is patterned, and as shown in FIGS. 37A to 37D, resist 45 is removed.

Next, as shown in FIGS. 38A to 38D, interlayer insulation film 32 which includes LT-SiN is formed in the whole surface. As a result, while the side surface region of TMR film 29 is covered with interlayer insulation films 30 and 32, the side surface region of TMR lower electrode 28 is covered with interlayer insulation film 32.

Next, as shown in FIGS. 39A to 39D, interlayer insulation film 33 which includes $SiO_2$ is formed in the whole surface. On this occasion, since the side surface region of TMR film 29 is covered with interlayer insulation films 30 and 32, an antioxidant function can fully be exhibited at the time of formation of interlayer insulation film 33. Therefore, TMR film 29 is not damaged at the time of formation of interlayer insulation film 33.

In addition, since interlayer insulation film 30 has covered all the side surfaces of TMR element 5 at the time of processing of TMR lower electrode 28, it can prevent the foreign substance by etching deposition material adhering, and leakage current occurring by protecting surely the side surface of memory cell MC, especially TMR film 29.

Then, as shown in FIGS. 40A to 40D, flattening of the interlayer insulation film 33 is done by performing CMP treatment to interlayer insulation film 33.

Then, as shown in FIG. 41, via hole 39 which penetrates interlayer insulation film 33 is formed at the upper part of TMR element 5. As shown in FIG. 41D, via hole 49 is formed in the upper layer of a part of Cu wiring 25 in a peripheral region.

And as shown in FIGS. 42A to 42D, etching removal of the interlayer insulation film 33 is selectively done to bit line formation. On this occasion, etching removal also of the interlayer insulation films 30 and 32 under via hole 39 is done, via hole 40 is formed, etching removal of the interlayer insulation films 30 and 32 under via hole 49 is done, and via hole 50 is formed.

Next, as shown in FIG. 43, a bit line is formed by embedding Cu wiring 34 to the region which did etching removal of the interlayer insulation film 33 comprising via holes 40 and 50. As a result, in a memory circuit region, Cu wiring 34 is electrically connected with TMR element 5 (TMR upper electrode 31) via via hole 40, and Cu wiring 34 is electrically connected with Cu wiring 25 in a peripheral circuit area. Thus, Cu wiring 34 which is a fourth layer metal wiring is formed.

Finally, as shown in FIGS. 44A to 44D, MRAM (a peripheral circuit is included) of Embodiment 2 is completed by forming passivation film 35 in the whole surface.

Embodiment 3

Premise Technology

Figure 45:
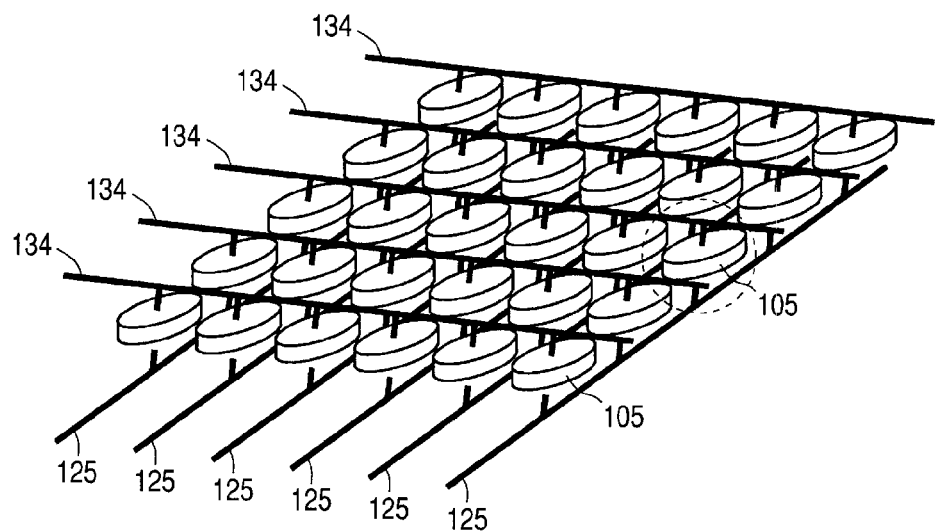
FIG. 45 is an explanatory diagram showing the outline of MRAM structure.

FIG. 45 is an explanatory diagram showing the outline of MRAM structure. As shown in the same drawing, a plurality of memory devices 102 are arranged at matrix form. Two or more upper Cu wiring 134 is formed along a column direction (slanting horizontal direction in a drawing), it electrically connects with memory device 102 at a column unit, two or more lower Cu wiring 125 is formed along a row direction (slanting longitudinal direction in a drawing), and it electrically connects with TMR element 105 per line.

Figure 46:
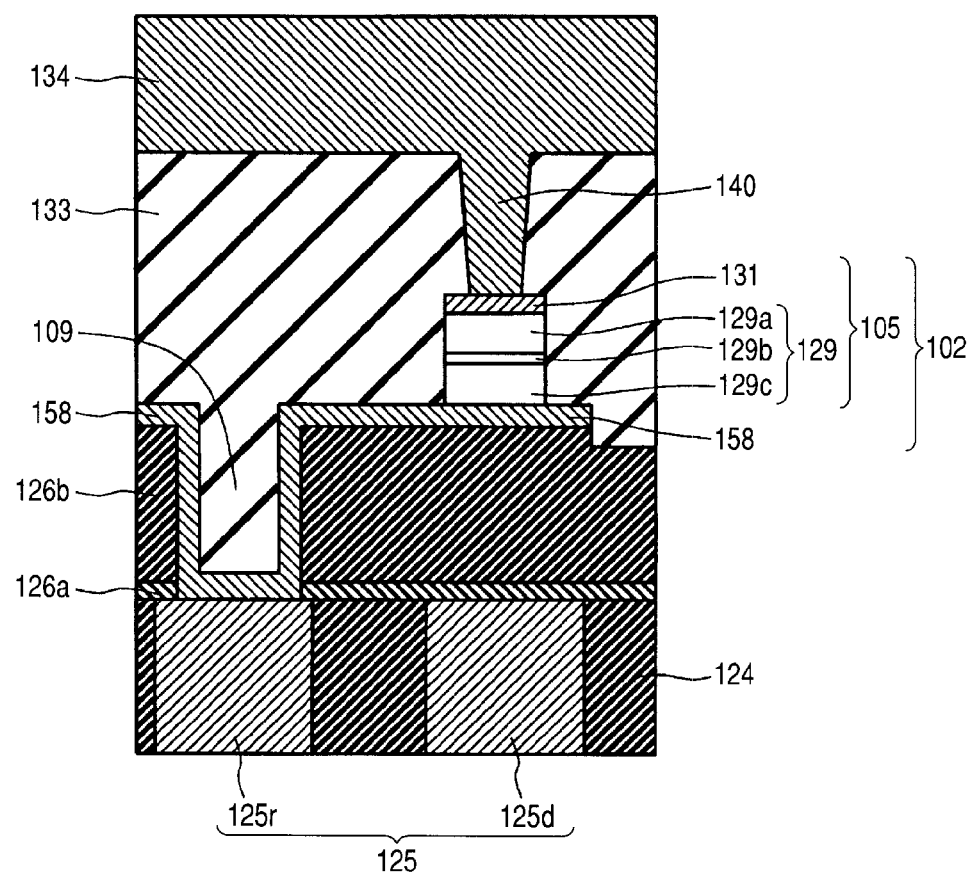
FIG. 46 is a cross-sectional view showing the detail of connecting relation with the memory device of MRAM, upper Cu wiring, and lower Cu wiring.

FIG. 46 is a cross-sectional view showing the detail of the connecting relation of memory device 102, and upper Cu wiring 134 and lower Cu wiring 125 (read wire 125r, digit line 125d). As shown in the same drawing, the inside of oxide film 124 formed above semiconductor substrate 100 (it does not illustrate but see the FIG. 3 etc.) is penetrated, and lower Cu wiring 125 is formed selectively. On oxide film 124 including lower Cu wiring 125, silicon nitride film 126a and oxide film 126b are laminated. Via hole 109 (local via hole) is formed in interlayer insulation films 126a and 126b which correspond to a part of formation area of read wire 125r in plan view. By forming selectively TMR lower electrode 158 used as lead-out wiring (LS (Local Strap)) on interlayer insulation film 126b, and the bottom and the side surface of via hole 109, TMR lower electrode 158 is electrically connected with read wire 125r.

TMR element 105 (TMR film 129, TMR upper electrode 131) is selectively formed in the region which corresponds in plan view on TMR lower electrode 158 in a part of formation area of digit line 125d. Memory device 102 includes TMR element 105 and TMR lower electrode 158. TMR film 129 has the laminated structure of ferromagnetic layer 129a, non-magnetic layer 129b, and ferromagnetic layer 129c from upper part.

And oxide film 133 which covers the whole surface including TMR element 105, and includes $SiO_2$ is formed.

Top Cu wiring 134 used as a bit line is selectively formed in the upper layer portion of oxide film 133. Oxide film 133 is penetrated, and via hole 140 is formed at the region in which TMR element 105 is formed in plan view. By embedding upper Cu wiring 134 also in this via hole 140, upper Cu wiring 134 and TMR upper electrode 131 are electrically connected.

As mentioned above, a general structure (it is hereafter written as "via hole LS connection structure") of electrically connecting lower Cu wiring 125 (read wire 125r) and TMR element 105 (TMR film 129) by forming TMR lower electrode 158 in via hole 109 is shown in FIG. 46.

In order to acquire the structure shown by FIG. 46, it passes through the manufacturing process which generally includes the following (1)-(9).

(1) Deposit silicon nitride film 126a and oxide film 126b on oxide film 124 including lower Cu wiring 125.

(2) Form selectively via hole 109 which penetrates silicon nitride film 126a and oxide film 126b.

(3) Deposit the metallic thin film used as TMR lower electrode 158 on oxide film 126b comprising via hole 109.

(4) Deposit the formative layer of TMR element 105 on TMR lower electrode 158 on oxide film 126b.

(5) Pattern TMR element 105.

(6) Pattern the metallic thin film formed above (3), and form TMR lower electrode 158.

(7) Deposit oxide film 133 on the whole surface.

(8) Form selectively via hole 140 which penetrates oxide film 133, and the formation area of upper Cu wiring 134.

(9) Do CMP treatment after embedding and depositing upper Cu wiring 134.

It supposes that the above-mentioned step of (6) is called LS step, and there is a problem shown below in this LS step.

Figure 47:
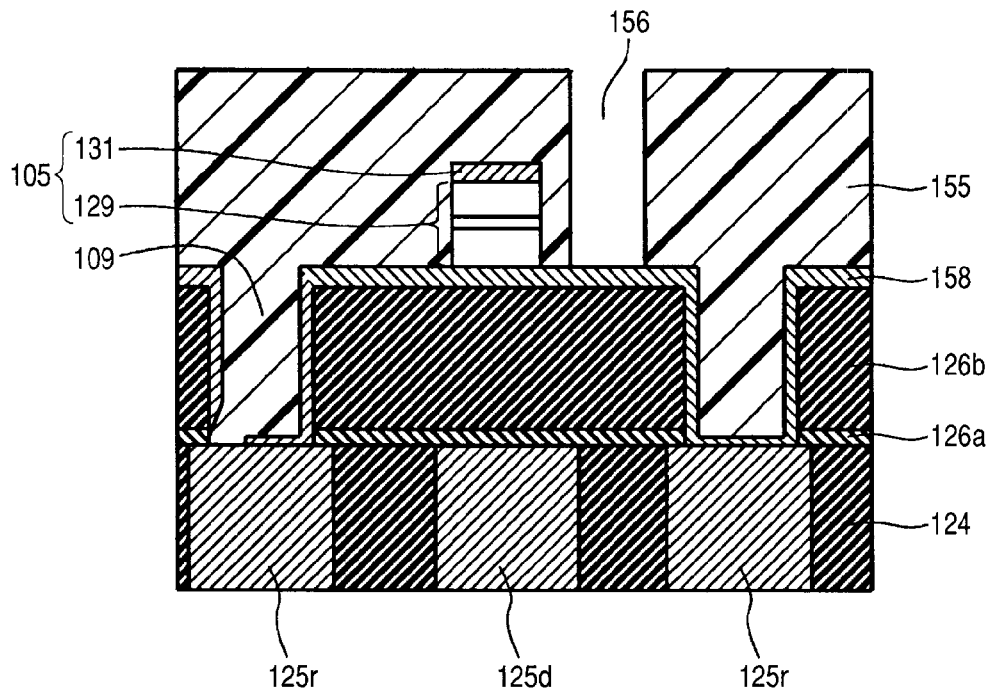
FIGS. 47 to 49 are cross-sectional views showing LS step for acquiring via hole LS connection structure.
Figure 48:
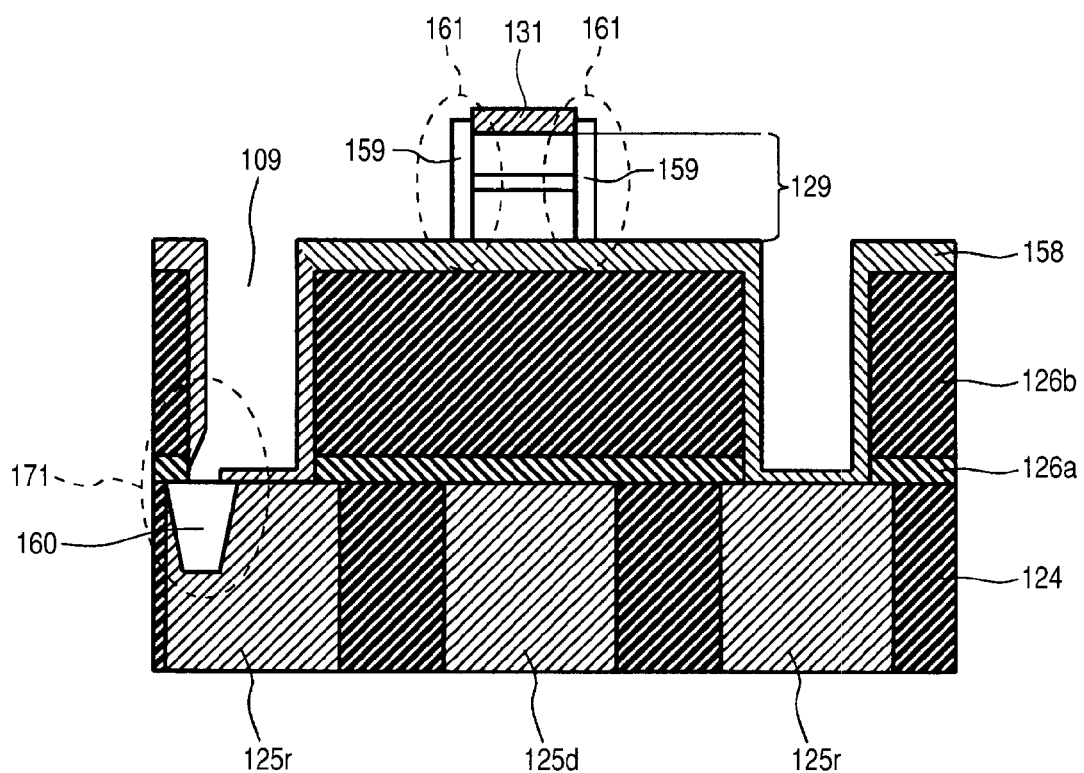
Figure 49:
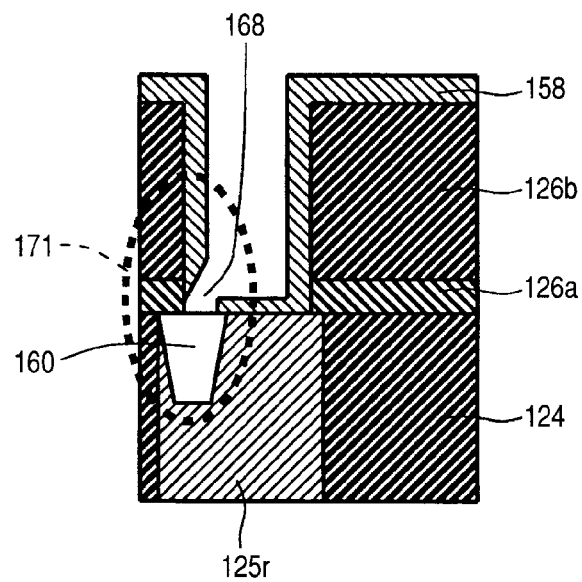

FIG. 47-FIG. 49 are the cross-sectional views showing LS step for acquiring via hole LS connection structure (referring to FIG. 46). Hereafter, LS step is explained with reference to these drawings.

As shown in FIG. 47, lower Cu wiring 125 (read wire 125r, digit line 125d) which penetrates oxide film 124 is selectively formed after the oxide film 124 formation formed above the semiconductor substrate. After forming silicon nitride film 126a and oxide film 126b in the whole surface, via hole 109 which penetrated silicon nitride film 126a and oxide film 126b, and used a part of read wires 125r as the bottom is formed. After forming TMR lower electrode 158 on the bottom and the side surface of via hole 109, and oxide film 126b, TMR element 105 (TMR film 129, TMR upper electrode 131) is obtained. After forming resist 155 in the whole surface, resist 155 is patterned by forming opening 156 for separating TMR lower electrode 158 per element.

And as shown in FIG. 48, TMR lower electrode 158 is patterned by etching TMR lower electrode 158 by using resist 155 as a mask. Then, ashing treatment removes resist 155.

On this occasion, as shown in FIG. 48, there is a source of anxiety with which side wall reaction part 159 which includes a polymer, a magnetic film, etc. by the reaction in the side wall of TMR film 129 is formed. As shown in FIG. 49, at via hole bottom end portion region 171 of via hole 109, there was a source of anxiety that a part of lower Cu wiring 125 (read wire 125r) under TMR lower electrode 158 corrodes, and Cu corrosion part 160 generates from a part of ultra thin film formation parts of TMR lower electrode 158, or non-film formation part 168.

Such a source of anxiety originates in the ability of TMR lower electrode 158 for covering nature not to improve embedded formation in via hole 109 from a reason with the point which embeds and forms a part of TMR lower electrodes 158 in via hole 109, and the point which has restrictions in the thickness of TMR lower electrode 158. That restrictions occur in the thickness of TMR lower electrode 158 is because the thickness of TMR lower electrode 158 used as the foundation layer of TMR element 105 is restricted to 100 nm or less since the characteristics are influenced by the roughness of TMR lower electrode 158 which is a foundation layer as to TMR element 105 formed on TMR lower electrode 158.

Therefore, since a possibility that an ultra thin film formation part or non-film formation part 168 will occur in TMR lower electrode 158 at via hole bottom end portion region 171 is high, the source of anxiety of Cu corrosion from an ultra thin film formation part or non-film formation part 168 to lower Cu wiring 125 cannot be disregarded at the time of ashing of resist 155.

As a result, electric connection between TMR lower electrode 158 and read wire 125r could not fully be made by realization of the above-mentioned source of anxiety, but there was a problem of resulting in a wiring failure. Embodiment 3 aimed at the settlement of this problem.

Structure of Embodiment 3

Figure 50:
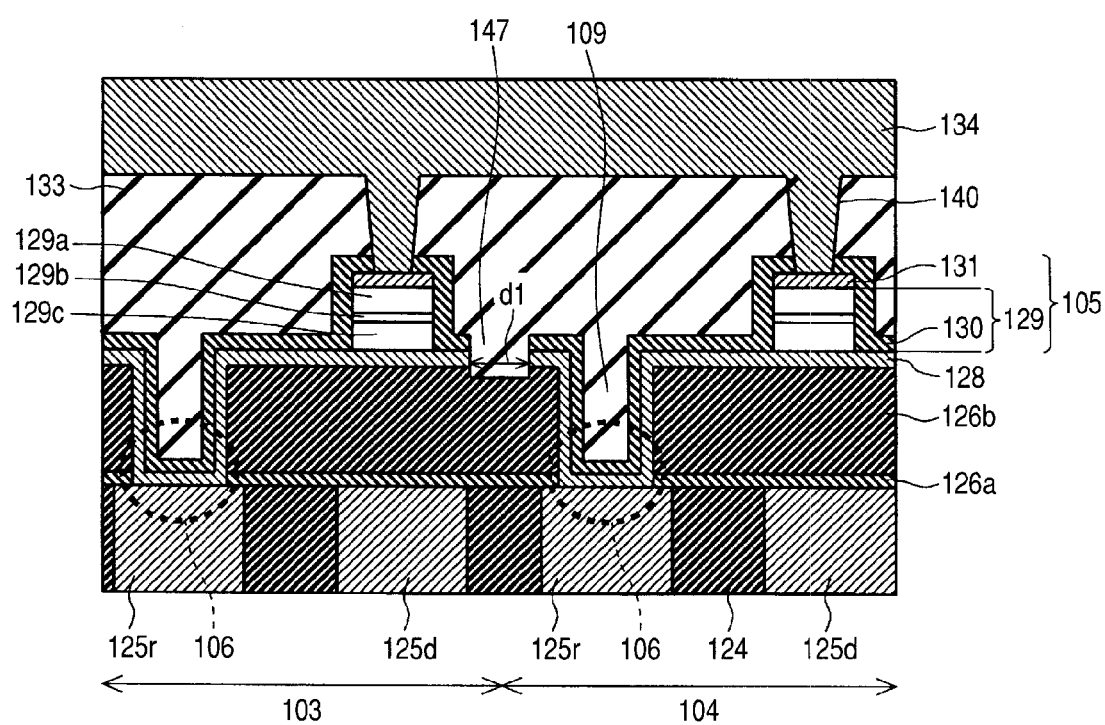
FIG. 50 is a cross-sectional view showing the structure of the memory cell part of MRAM which is a semiconductor device of Embodiment 3 of this invention.

FIG. 50 is a cross-sectional view showing the structure of the memory cell part of MRAM which is a semiconductor device of Embodiment 3 of this invention. In FIG. 50, the structure where TMR element 105 (first and second TMR element) of the same structure is formed in two TMR formation areas 103,104 (first and second TMR formation area), respectively is shown.

As shown in the same drawing, oxide film 124 which is first interlayer insulation film is penetrated, and read wire 125r and digit line 125d which form lower Cu wiring 125 (lower layer wiring) selectively are formed in each of TMR formation area 103,104. Although MRAM of Embodiment 3 as well as MRAM of Embodiment 1 is formed above semiconductor substrate 100 by a laminated structure, the drawing shows and explains only the superstructure from oxide film 124 on account of explanation. Oxide film 124 is equivalent to interlayer insulation film 24 (references, such as FIG. 3) of Embodiment 1.

And silicon nitride film 126a (first partial interlayer insulation film) and oxide film 126b (second partial interlayer insulation film) which includes $SiO_2$ are laminated on oxide film 124 including lower Cu wiring 125, and silicon nitride film 126a and oxide film 126b form the second interlayer insulation film.

In each of TMR formation area 103,104, via hole 109 (local via hole) is formed in interlayer insulation films 126a and 126b which correspond to a part of formation area of read wire 125r in plan view. By selectively forming TMR lower electrode 128 used as LS on interlayer insulation film 126b, and the bottom and the side surface of via hole 109, in each of TMR formation area 103,104, TMR lower electrode 128 is electrically connected with read wire 125r.

TMR lower electrode 128 (first lower electrode) of TMR formation area 103 and TMR lower electrode 128 (second lower electrode) of TMR formation area 104 are mutually separated by opening 147 (distance d1) formed in TMR formation area 103,104 boundary and its neighboring region.

TMR element 105 (TMR film 129, TMR upper electrode 131) is selectively formed in the region which corresponds in plan view on each TMR lower electrode 128 of TMR formation area 103,104 in a part of formation area of digit line 125d. TMR film 129 includes the laminated structure of ferromagnetic layer 129a, nonmagnetic layer 129b, and ferromagnetic layer 129c from the upper part, for example.

And the upper surface of TMR lower electrode 128, and the side surface and the upper surface of TMR element 105 are covered, and insulating film 130 is formed. As insulating film 130, a nitride film (SiN), an oxide film ($SiO_2$, GeO, $Al_2O_3$), etc. can be considered.

Insulating film 130 is formed using the insulating material formed at the low temperature less than 300° C. For example, a nitride film formed at low temperature (LT (Low Temperature)-SiN) etc. can be considered as insulating film 130.

And the whole surface including insulating film 130 is covered, and oxide film 133 which includes $SiO_2$ and is third interlayer insulation film is formed. On this occasion, oxide film 133 is formed of the material with same chemical species with oxide film 126b. Oxide film 133 is completely manufactured by the manufacturing process of the same contents with oxide film 126b.

Insulated separation of TMR lower electrode 128 of TMR formation area 103 and the TMR lower electrode 128 of TMR formation area 104 is thoroughly done by forming oxide film 133 also in opening 147.

Upper Cu wiring 134 used as a bit line is selectively formed in the upper layer portion of oxide film 133. At the region in which TMR element 105 is formed in plan view in each of TMR formation area 103,104, oxide film 133 and insulating film 130 are penetrated, and via hole 140 is formed. By embedding upper Cu wiring 134 also in this via hole 140, upper Cu wiring 134 and TMR upper electrode 131 are electrically connected.

As mentioned above, it is assuming the via hole LS connection structure which electrically connects lower Cu wiring 125 (read wire 125r) and TMR element 105 (TMR film 129) by forming TMR lower electrode 128 in via hole 109.
(Effect)

Figure 51:
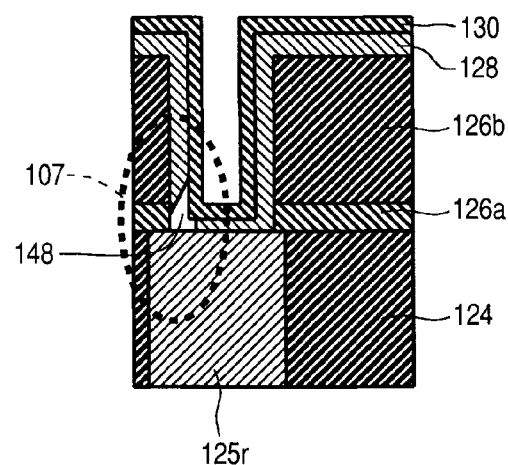
FIG. 51 is a cross-sectional view showing the effect of the semiconductor device of Embodiment 3.

FIG. 51 is a cross-sectional view showing the effect of the semiconductor device of Embodiment 3. Since insulating film 130 is formed on TMR lower electrode 128 in via hole 109 even if ultra thin film formation part or non-film formation part 148 occurs in a part of TMR lower electrodes 128 in via hole bottom end portion region 107 as shown in the same drawing, when performing ashing treatment of the resist used for the patterning of TMR lower electrode 128 in LS step after LS step, it can avoid surely that Cu corrosion advances from ultra thin film formation part or non-film formation part 148 to lower Cu wiring 125 (read wire 125r) at the time of ashing treatment.

Therefore, Cu corrosion part 160 as shown in FIG. 49 does not occur, and good electric connecting relation is collateralized between TMR lower electrode 128 and read wire 125r, and the effect that improvement in the yield is expectable is performed.

The effect mentioned above can be demonstrated also in the structure (references, such as FIG. 2) of Embodiment 1 where interlayer insulation film 30 is formed on TMR lower electrode 28.

Since the side surface of TMR lower electrode 128 and insulating film 130 in the neighboring region of opening 147 is almost matched, the microfabrication effect of distance d1 between TMR lower electrodes 128 formed in each of TMR formation area 103,104 by newly forming insulating film 130 not spreading, and not spoiling an integration degree is performed.

That is, since the side surface of TMR lower electrode 128 is matched to the side surface of insulating film 130, even if it patterns simultaneously insulating film 130 and TMR lower electrode 128 so that it may mention later, it does not have a bad influence on the working shape of TMR lower electrode 128.

In addition, since the low-temperature insulation film formed at the low temperature less than 300° C. as insulating film 130 is used, by forming insulating film 130 at the low temperature less than 300° C., the performance degradation of TMR element 105 at the time of formation of insulating film 130 can be prevented surely. Namely, it does not have a bad influence on the characteristics of TMR element 105 at the time of formation of insulating film 130. As a result, compared with the case where the insulating film which results more than 300° C. is formed, the spin orientation improvement of a magnetic multilayer film, the switched connection improvement between magnetic multilayer films, and reduction of heat stress are expectable regarding TMR film 129.

The effect mentioned above can be demonstrated also in the structure (references, such as FIG. 2) of Embodiment 1 which forms interlayer insulation film 30 formed from LT-SiN on TMR lower electrode 28.

Figure 52:
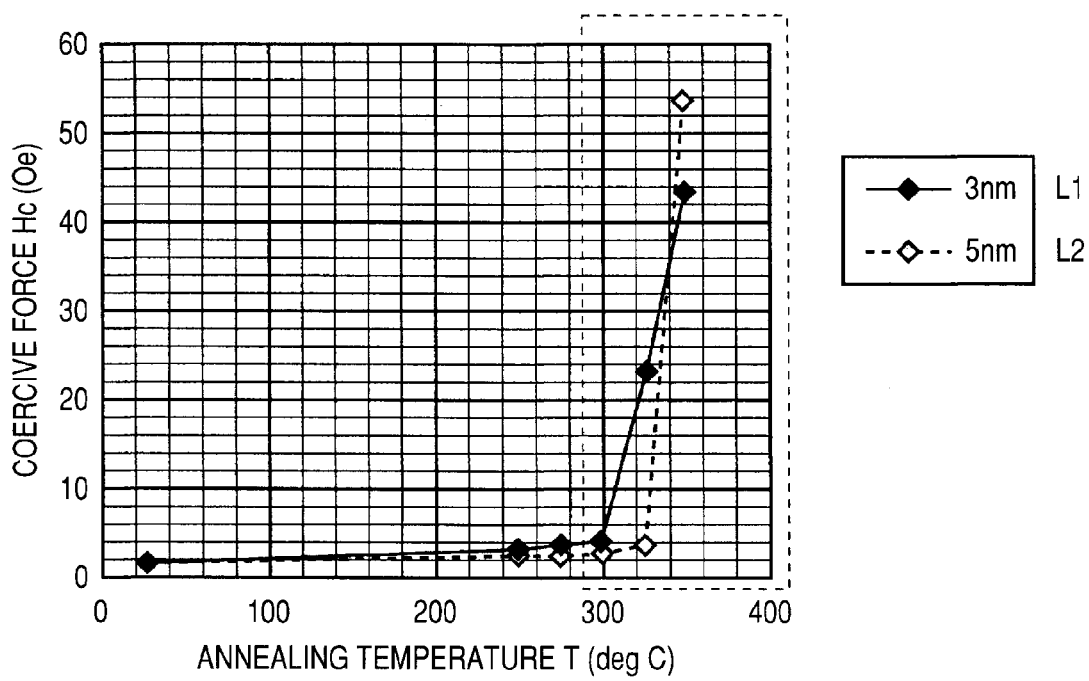
FIG. 52 is graph which shows the coercive force of the TMR element to the forming temperature of an insulating film.
Figure 53:
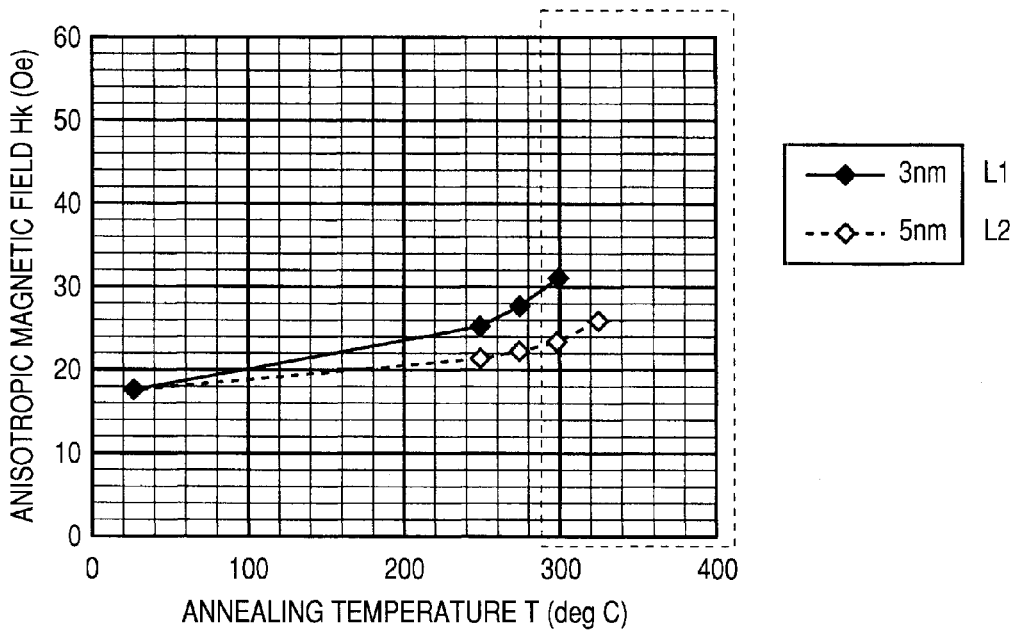
FIG. 53 is graph which shows the anisotropic magnetic field of a TMR element to the forming temperature of an insulating film.

FIG. 52 and FIG. 53 are graph which shows the effect at the time of forming insulating film 130 from a low-temperature formation insulating material. FIG. 52 shows the annealing temperature dependency of coercive force Hc of TMR element 105, and FIG. 53 shows the annealing temperature dependency of anisotropic magnetic field Hk of TMR element 105. An equivalent for the forming temperature of insulating film 130 is also included in these temperature zones. In FIG. 52 and FIG. 53, L1 shows the case where the thickness of ferromagnetic layer 129a is 3 nm, and L2 shows the case where the thickness of ferromagnetic layer 129a is 5 nm.

In the region in which formation of insulating film 130 exceeds 300° C. as shown in FIG. 52, the inclination of coercive force Hc over the temperature change of TMR element 105 becomes steep, and it becomes very difficult to set up coercive force Hc with sufficient accuracy. In the region in which formation of insulating film 130 exceeds 300° C. as shown in FIG. 53, the inclination of anisotropic magnetic field Hk to the temperature change of TMR element 105 becomes higher, and it becomes difficult to set up anisotropic magnetic field Hk with sufficient accuracy.

Thus, when processing which exceeds 300° C. after formation of TMR element 105 is performed, it becomes difficult to control the magnetic property of TMR element 105 with sufficient accuracy, and a possibility that magnetic property will deteriorate is high as a result.

However, in MRAM of Embodiment 3, magnetic property degradation of TMR element 105 can be effectively suppressed by forming insulating film 130 at the low temperature less than 300° C. using a low-temperature formation insulating material.

Figure 54:
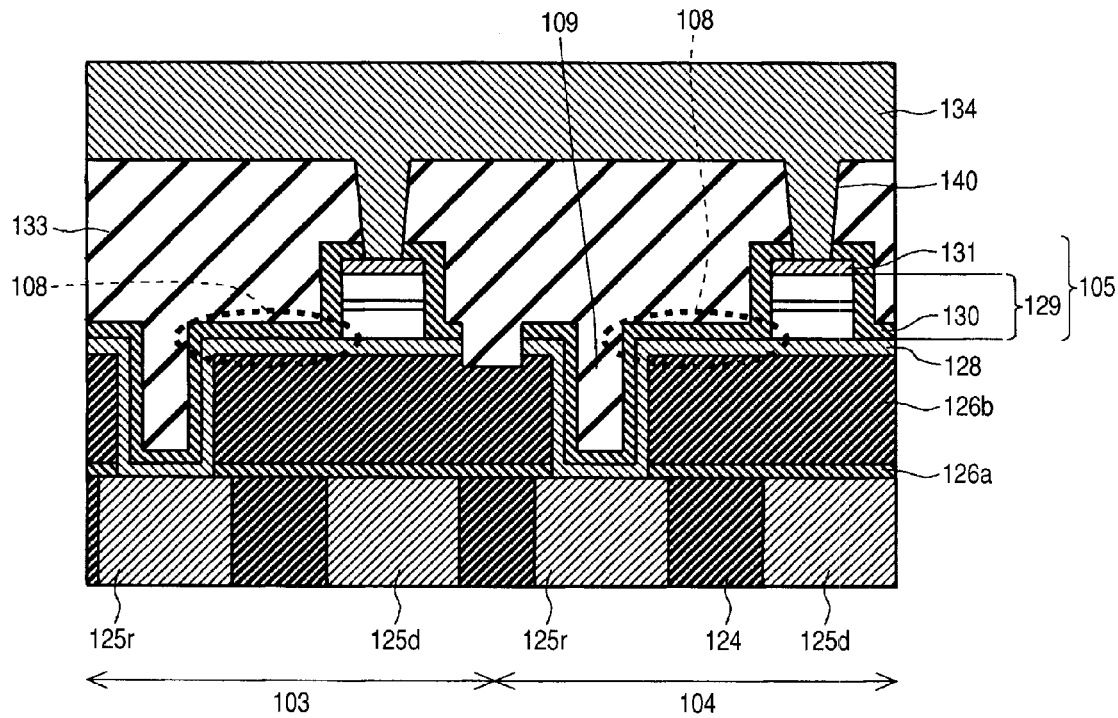
FIGS. 54 and 55 are cross-sectional views showing the effect of the semiconductor device of Embodiment 3.

Since insulating film 130 is formed all over TMR lower electrode 128 upper part also in TMR peripheral region 108 on oxide film 126b in which TMR element 105 is not formed as shown in FIG. 54, the antioxidant effect in TMR lower electrode 128 front surface and the improvement (resistance reduction) effect of the electrical property of TMR lower electrode 128 are expectable at the time of LS step.

The effect mentioned above can be demonstrated also in the structure (references, such as FIG. 2) of Embodiment 1 which forms interlayer insulation film 30 on TMR lower electrode 28 on interlayer insulation film 26b with which TMR element 5 is not formed.

Figure 55:
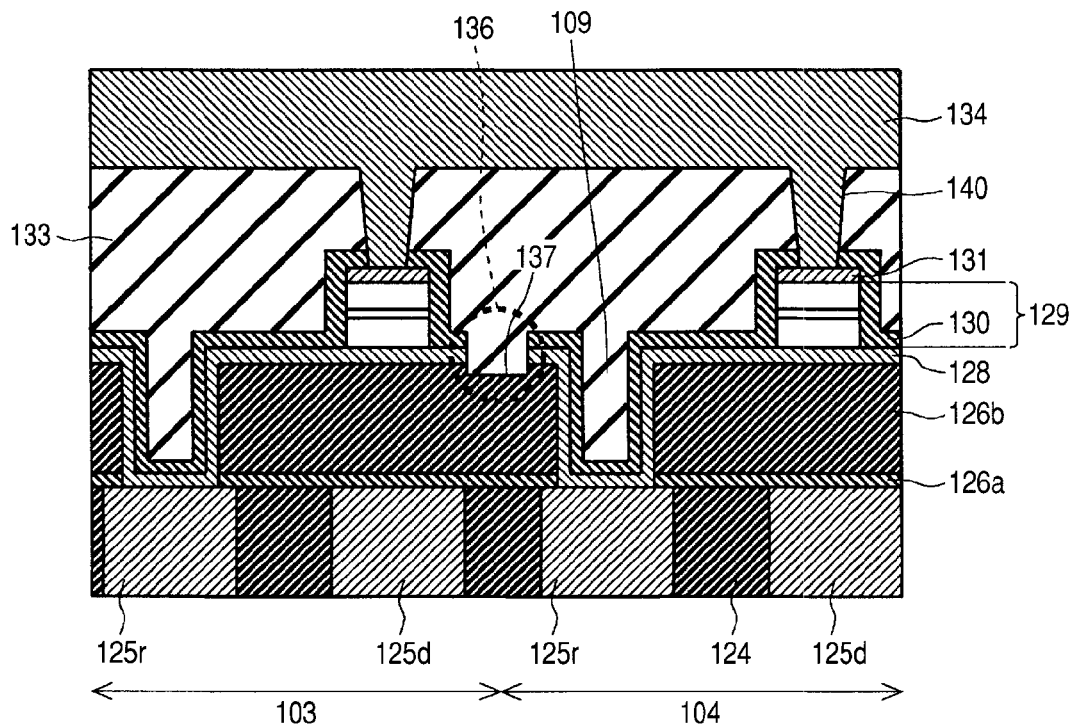

In addition, by forming oxide film 126b and oxide film 133 with the same material ($SiO_2$) in chemical species as shown in FIG. 55, in insulating region 136 between straps, interface 137 which oxide film 126b and oxide film 133 of the same material contact is formed.

For example, it is expected that when the interface of a nitride film and an oxide film exists, the defect in an interface will be transmitted, and in TMR formation area 103,104, leakage current flows between TMR lower electrodes 128, 128 which adjoin mutually. This leakage current poses a remarkable problem as the microfabrication of equipment progresses.

However, since the defect in interface 137 can be surely reduced in Embodiment 3 by forming chemical species for oxide film 126b and oxide film 133 with the same material, the above-mentioned leakage current can be reduced effectively and improvement in the yield can be expected. In addition, the effect of making microfabrication of equipment possible is performed.

Although the case where oxide film 126b and oxide film 133 were $SiO_2$ was mentioned as the example in both these embodiments, of course, other modes, such as a low-k film of the same material, are sufficient.

Since oxide film 126b and oxide film 133 are formed by the manufacturing process of the same contents in Embodiment 3, respectively, the above-mentioned leakage current suppression effect can be demonstrated further, and the further improvement in the yield and a microfabrication facilitatory effect can be expected.

(Other Modes)

By forming only from a low-k film formed at low temperature as oxide film 133 with which between TMR lower electrodes 128,128 in TMR formation area 103,104 is insulated, the capacity between wirings generated between TMR lower electrodes 128,128 is reduced, and high-speed operation becomes possible.

Figure 56:
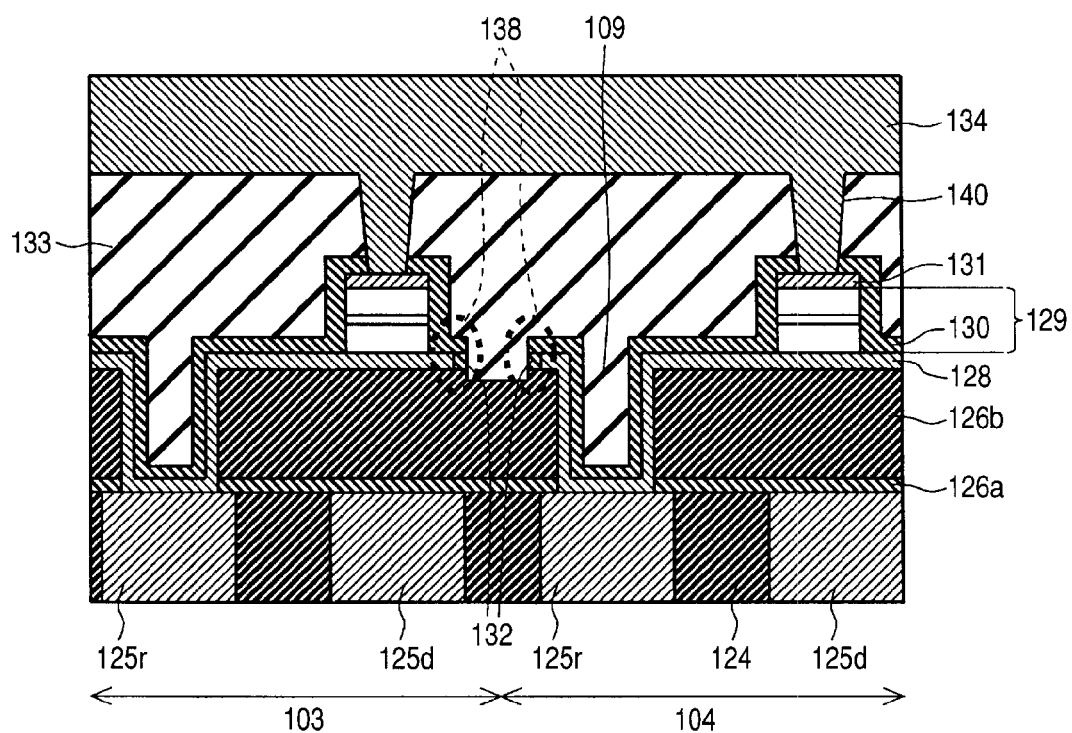
FIG. 56 is a cross-sectional view showing other modes of Embodiment 3.

FIG. 56 is a cross-sectional view showing other modes of Embodiment 3. As shown in the same drawing, when the end portion of TMR lower electrode 128 oxidizes, in strap insulation end portion region 138, it is end portion oxidization region 132.

Thus, in other modes of Embodiment 3, the end portion side surface of TMR lower electrode 128 in strap insulation end portion region 138 will be located inside insulating film 130 by existence of end portion oxidization region 132. As a result, the effect which can increase the insulation between TMR lower electrodes 128,128 (between the first and second lower electrodes) in TMR formation area 103,104 is performed, without spoiling the integration degree of equipment. Since end portion oxidization region 132 is sufficiently small to TMR lower electrode 128, the conductivity of TMR lower electrode 128 does not deteriorate by end portion oxidization region 132.

When forming end portion oxidization region 132, it is desirable to form TMR lower electrode 128 from material with which it is high melting point metals, such as titanium (Ti) and Ta, and an oxide has insulation. For example, tantalum oxide ($Ta_2O_5$) can be formed as end portion oxidization region 132 from the end portion of TMR lower electrode 128 by forming TMR lower electrode 128 by Ta at the time of ashing treatment.

Thus, by forming TMR lower electrode 128 of Ti, Ta, etc. of the characteristics mentioned above, in addition to the insulated effect between TMR lower electrodes 128,128 by end portion oxidization region 132 mentioned above, the nonproliferation effect of TMR lower electrode 128 forming material in a manufacturing process is performed.

(Manufacturing Method)

Figure 62A:
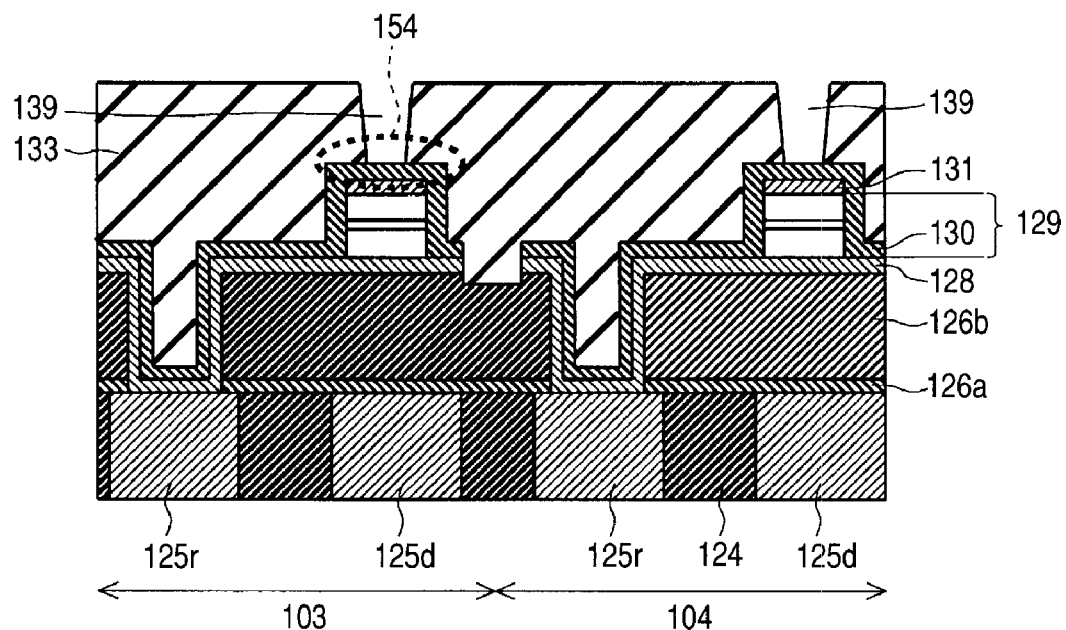
Figure 62B:
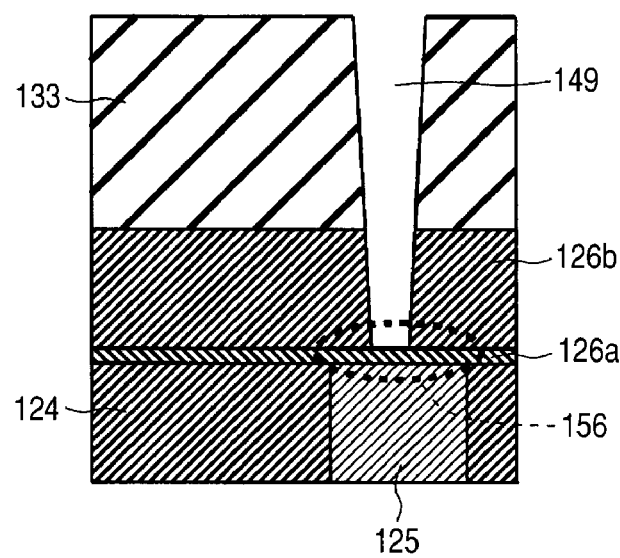
Figure 63A:
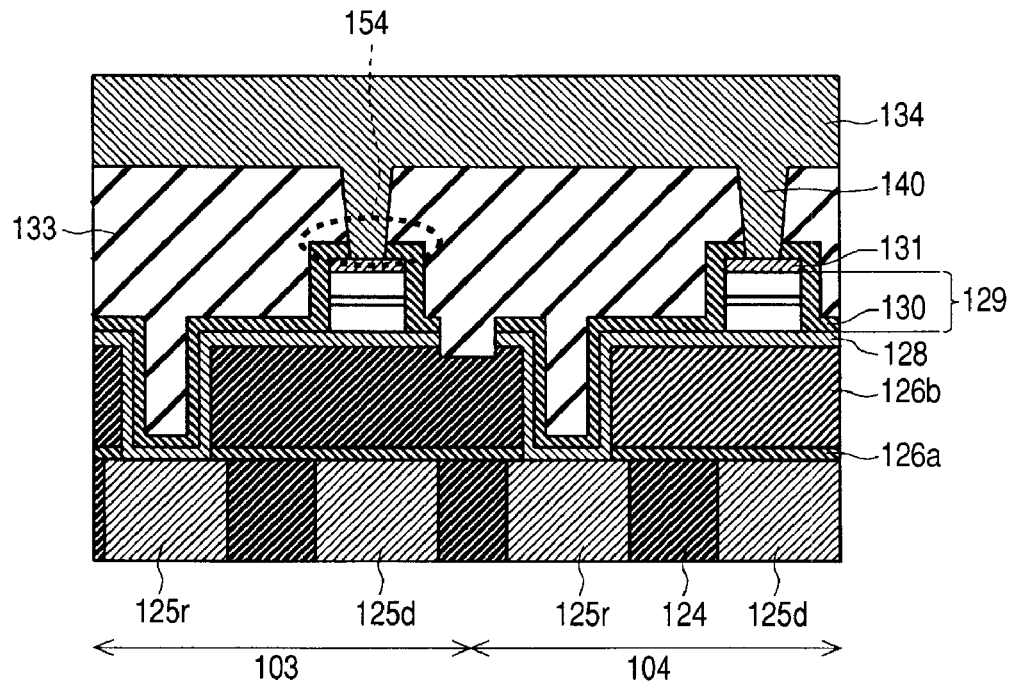
Figure 63B:
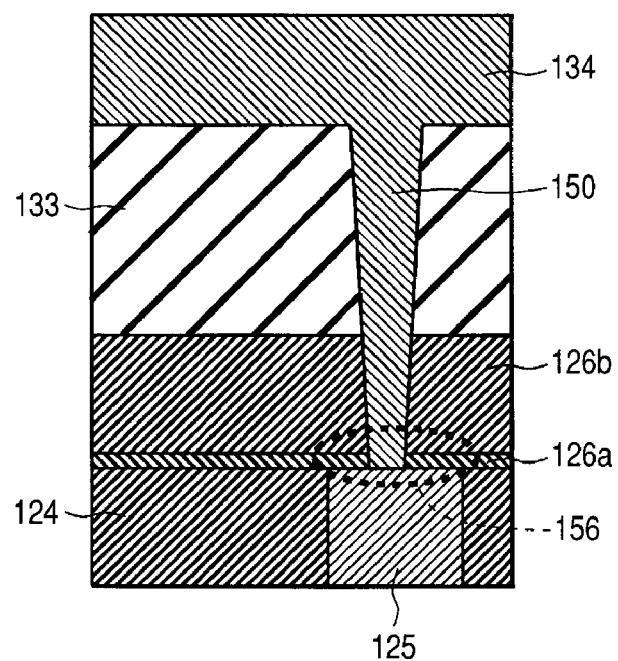

FIG. 57-FIG. 63B are the cross-sectional views showing a part of manufacturing method of MRAM of Embodiment 3. "A" in FIG. 62 and FIG. 63 shows the section of a memory circuit region, and "B" of these drawings shows the section of the peripheral circuit area. Hereafter, the manufacturing method of MRAM of Embodiment 3 is explained with reference to these drawings.

Figure 57:
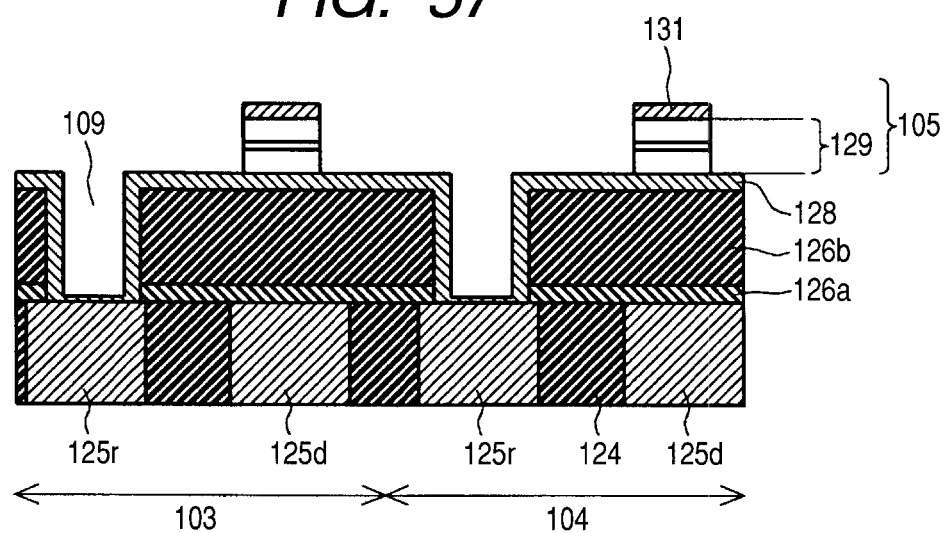
FIGS. 57 to 63B are cross-sectional views showing a part of manufacturing method of MRAM of Embodiment 3.

First, the structure shown by FIG. 57 is acquired by the same method as Embodiment 1. That is, lower Cu wiring 125 (read wire 125r, digit line 125d) which penetrates oxide film 124 formed above the semiconductor substrate which is not illustrated, and is formed selectively is obtained. Then, silicon nitride film 126a, and oxide film 126b which includes $SiO_2$ are formed in the whole surface one by one, the portion on the region of read wire 125r in a memory circuit region is penetrated, and via hole 109 is formed selectively.

And the layer which should constitute TMR lower electrode 128, TMR film 129, and TMR upper electrode 131 is laminated on the whole surface. On this occasion, TMR lower electrode 128 is electrically connected with read wire 125r by forming TMR lower electrode 128 in the bottom and the side surface of via hole 109. Then, TMR upper electrode 131 and TMR film 129 are patterned, and TMR element 105 is completed.

Figure 58:
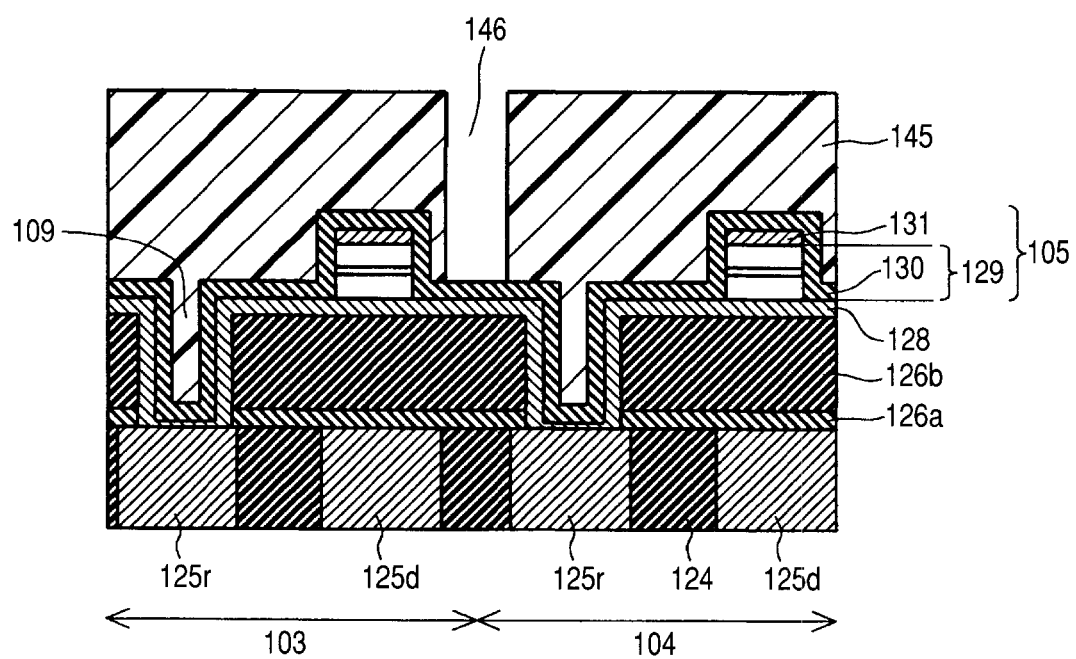

And as shown in FIG. 58, after forming in the whole surface insulating film 130 which includes LT-SiN by the low temperature condition less than 300° C., patterned resist 145 which has opening 146 in a TMR formation area 103,104 boundary neighboring region is formed. On this occasion, the thickness of insulating film 130 is formed by thickness comparable as the thickness of silicon nitride film 126a at about 60 nm.

Thus, in the manufacturing method of MRAM of Embodiment 3, since insulating film 130 is formed at the low temperature less than 300° C., it does not have a bad influence on the characteristics (refer to FIG. 52 and FIG. 53) of TMR element 105 at the time of insulating film 130 formation.

The effect mentioned above can be demonstrated also in the manufacturing method (references, such as FIGS. 16A to 16D) of Embodiment 1 which forms in the whole surface interlayer insulation film 30 which includes LT-SiN by the low temperature condition less than 300° C.

Figure 59:
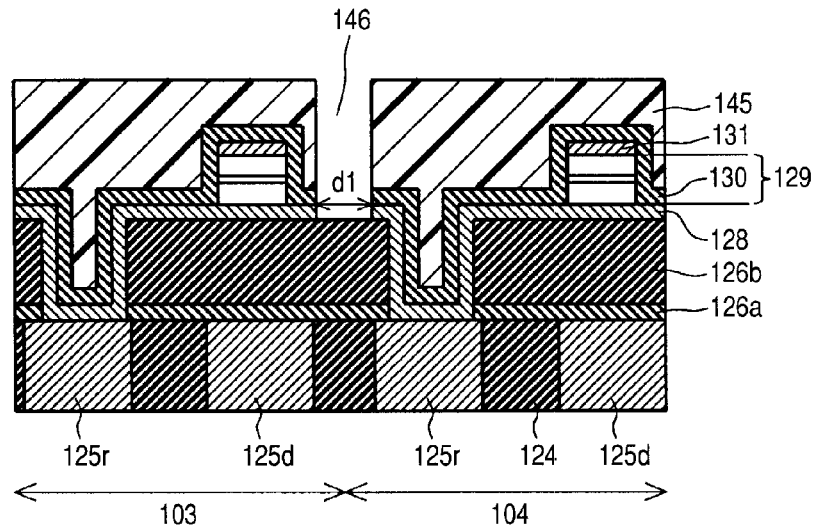

And as shown in FIG. 59, by performing reactive ion etching (Reactive Ion Etching; RIE) to insulating film 130 and TMR lower electrode 128 using patterned resist 145 as a mask, insulating film 130 and TMR lower electrode 128 are patterned continuously. Thus, since insulating film 130 and TMR lower electrode 128 are continuously etched by resist 145, in immediately after etching, the side surface of insulating film 130 and TMR lower electrode 128 in opening 147 is almost matched.

As a result, TMR lower electrode 128, TMR element 105, and insulating film 130 (the first lower electrode, the first TMR element, the first insulating film) in TMR formation area 103 (first TMR formation area) and TMR lower electrode 128, TMR element 105, and insulating film 130 (second lower electrode, second TMR element, second insulating film) in TMR formation area 104 (second TMR formation area) will be formed independently each other.

And the above first and second insulating films have side surfaces which separate each other by distance d1 (prescribed interval) and face. The above first and second lower electrode have side surfaces which separate distance d1 mutually and face. That is, as for the above first insulating film and the above first lower electrode (TMR lower electrode 128 and insulating film 130 in TMR formation area 103), in the uniform direction (first direction) which goes to TMR formation area 104 from TMR formation area 103, the side surface formation position corresponds. As for the above second insulating film, and the above second lower electrode (TMR lower electrode 128 and insulating film 130 in TMR formation area 104), in the uniform direction (second direction) which goes to TMR formation area 103 from TMR formation area 104. the side surface formation position corresponds. In this embodiment, the side surface formed when it etches continuously using the same mask pattern is meant as a side surface matching. That is, the distance (Distance between the side surfaces in the identical direction (first direction) which goes to TMR formation area 104 from TMR formation area 103 when a level difference occurs on the side surface of TMR lower electrode 128 and insulating film 130 in TMR formation area 103) in the first direction of the first above-mentioned insulation film and the side surface of the first above-mentioned lower electrode is smaller than the distance between the side surfaces of the side surface at the side of opening 147 of TMR element 129, and TMR lower electrode 128 formed using a mask pattern different, for example.

Figure 60:
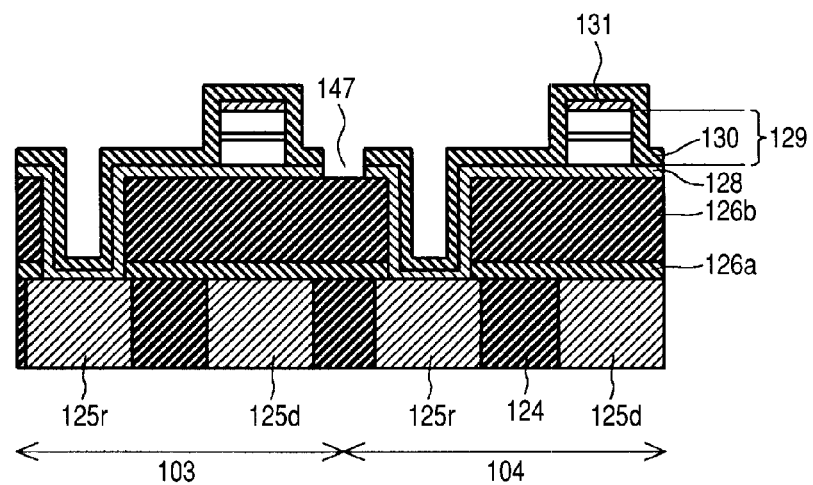

Then, as shown in FIG. 60, ashing treatment removes resist 145. As a result, in TMR formation area 103,104 respectively, the structure whose side surface of TMR lower electrode 128 and insulating film 130 in an identical direction almost matched can be acquired.

Figure 61:
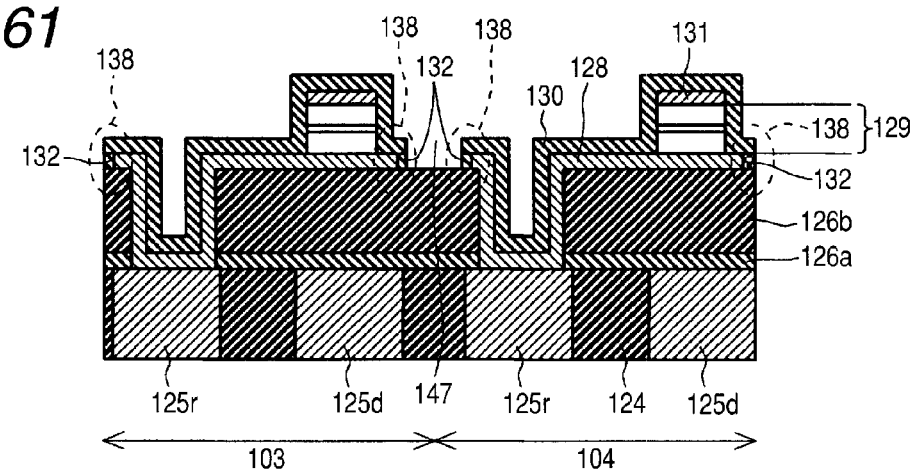

When TMR lower electrode 128 is formed on the other hand with the metallic material with which it is high melting points, such as Ti and Ta, and an oxide has insulation, as shown in FIG. 61, in an ashing treatment stage, TMR lower electrode 128 oxidizes from the exposure side surface in opening 147, and end portion oxidization region 132 is formed.

Namely, by oxidizing in part from the side surface of the above first and second lower electrode by ashing treatment, end portion oxidization region 132 (first and second end portion oxidization region) is formed in TMR formation areas 103 and 104 respectively. With formation of end portion oxidization region 132, the above side surface of the first and second lower electrode is become depressed and formed in the first and second direction to the side surface of the above first and second insulating film.

Thus, since the above first and second end portion oxidization region is formed by oxidizing in part from the side surface of the above first and second lower electrode by the ashing treatment at the time of removal of resist 145, the insulation between the first and second above-mentioned lower electrodes can be increased further.

Resist 145 is surely removable by performing wet screening after ashing treatment. On this occasion, since insulating film 130 is formed on TMR lower electrode 128, trouble does not occur in TMR lower electrode 128 at the time of wet washing (cleaning).

Thus, since ashing treatment and a wet cleaning treatment are performed as removal disposal of resist 145, resist 145 is removable with sufficient accuracy. On this occasion, since insulating film 130 is formed on TMR lower electrode 128, it does not have a bad influence on the execution time of ashing treatment and wet washing at TMR lower electrode 128, and read wire 125r in the via hole 109 bottom.

Since the manufacturing method of the semiconductor device of Embodiment 3 used resist 145 as the mask, TMR lower electrode 128 and insulating film 130 were etched continuously and TMR lower electrode 128 and insulating film 130 are patterned, as mentioned above, as a result from which TMR lower electrode 128 of via hole 109 is protected by insulating film 130 after processing of TMR lower electrode 128, in the removing processing (ashing treatment, wet cleaning treatment) stage of resist 145, the damage to read wire 125r under via hole 109 can be avoided, and improvement in the yield of the completed semiconductor device can be aimed at.

The effect mentioned above can be demonstrated also in the manufacturing method (references, such as FIGS. 18A to 18D and FIGS. 19A to 19D) of Embodiment 1 with which interlayer insulation film 30 is formed on TMR lower electrode 28 at the time of removal of resist 45 after etching simultaneously TMR lower electrode 28 and interlayer insulation film 30 by using resist 45 as a mask.

Next, after forming in the whole surface oxide film 133 which includes $SiO_2$, as shown in FIG. 62A, via hole 139 (partial via hole for TMR) which penetrates oxide film 133 is formed at the upper part of TMR element 105 in a memory circuit region. As shown in FIG. 62B, via hole 149 (partial via hole for the circumferences) which penetrates oxide film 133 and oxide film 126b in the upper layer of a part of lower Cu wiring 125 in a peripheral region is formed. On this occasion, insulating film 130 functions as a stopper of via hole 139 formation, and silicon nitride film 126a functions as a stopper of via hole 149 formation.

Thus, since oxide film 133 is formed with the material which differs from chemical species with insulating film 130 and silicon nitride film 126a which are silicon nitride films and formed with the material ($SiO_2$) whose chemical species are the same as oxide film 126b, by operating as a stopper insulating film 130 and silicon nitride film 126a of material (different material) with which oxide film 133 and oxide film 126b differ from chemical species, even if it forms simultaneously via hole 139 and via hole 149, via holes 139 and 149 can be formed with respectively sufficient accuracy.

At the upper part of TMR element 105, as shown in FIG. 63A, via hole 140 (via hole for TMR) which also penetrates insulating film 130 from via hole 139 in a memory circuit region is formed. In a peripheral region, simultaneously with it, as shown in FIG. 63B, via hole 150 (via hole for the circumferences) which also penetrates silicon nitride film 126a from via hole 149 is formed.

On this occasion, by forming the thickness of insulating film 130 which is a silicon nitride film and the thickness of silicon nitride film 126a which is the same material in chemical species to the same extent, even if it forms via hole 140 and via hole 150 simultaneously, via holes 140 and 150 can be formed with respectively sufficient accuracy.

As a result, since via hole 140 and 150 can be formed simultaneously, reduction of the manufacturing cost accompanying simplification of a manufacturing process can be aimed at.

And a bit line is formed by embedding upper Cu wiring 134 in via hole 140 and 150. As a result, in a memory circuit region, upper Cu wiring 134 is electrically connected with TMR element 105 (TMR upper electrode 131) via via hole 140, and upper Cu wiring 134 is electrically connected with lower Cu wiring 125 in a peripheral circuit area. Thus, MRAM (a peripheral circuit is included) of Embodiment 3 is completed.

What is claimed is:

1. A semiconductor device, comprising:
   a first interlayer insulation film formed above a semiconductor substrate;
   a lower layer wiring formed selectively to penetrate the first interlayer insulation film;
   a second interlayer insulation film formed over the first interlayer insulation film and the lower layer wiring and having a via hole exposing an upper surface of the lower layer wiring;
   a lower electrode formed at a bottom and a side surface of the via hole and over the second interlayer insulation film, the lower electrode being electrically connected with the lower layer wiring via the via hole;
   a TMR element, formed selectively over a portion of the lower electrode and including a laminated structure of a TMR film and an upper electrode;
   insulating film formed over the lower electrode, the TMR element and an inside of the via hole,
   wherein the semiconductor device has a first TMR formation area and a second TMR formation area, and the TMR element, the lower electrode, and the insulating film are formed in each of the first and the second TMR formation areas,
   wherein both the insulating film and the lower electrode have a side surface over the second interlayer insulation film in a uniform direction of an adjacent another lower electrode mutually, and
   wherein a side surface of the lower electrode corresponds in a uniform direction to a side surface of the insulating film, or a side surface of the lower electrode is depressed from the insulating film; and
   a third interlayer insulation film formed over the insulation film in the first and the second TMR formation areas,
   wherein the third interlayer insulation film is in contact with the second interlayer insulation film between the first and the second TMR formation areas to separate the lower electrodes and the insulating films in the first and the second TMR formation areas.

2. A semiconductor device according to claim 1, wherein the insulating film includes a low-temperature insulation film formed at a low temperature less than or equal to 300° C.

3. A semiconductor device according to claim 1, wherein the insulating film is formed over a whole surface over the lower electrode over the second interlayer insulation film.

4. A semiconductor device according to claim 1, wherein a side surface of the lower electrode is formed to correspond to a side surface of the insulating film in the uniform direction.

5. A semiconductor device according to claim 1, wherein chemical species of the second and third interlayer insulation films are formed with the same material.

6. A semiconductor device according to claim 5, wherein the second and third interlayer insulation films are formed by the manufacturing process of the same contents.

7. A semiconductor device according to claim 6, wherein the second and third interlayer insulation films are, respectively, formed in an interface and its neighborhood by a low-temperature insulation film formed at a low temperature less than 300° C. at least.

8. A semiconductor device according to claim 1, wherein the lower electrode has an end portion oxidization region adjoining a side surface of the lower electrode.

9. A semiconductor device according to claim 8, wherein the lower electrode includes a metallic material which has a high melting point, and an oxide having insulation.

* * * * *